(12) United States Patent
Hikasa

(10) Patent No.: US 12,080,793 B2
(45) Date of Patent: Sep. 3, 2024

(54) SEMICONDUCTOR DEVICE

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 188 days.

(21) Appl. No.: 17/670,947

(22) Filed: Feb. 14, 2022

(65) Prior Publication Data

US 2022/0165878 A1 May 26, 2022

Related U.S. Application Data

(63) Continuation of application No. 16/765,797, filed as application No. PCT/JP2018/043340 on Nov. 26, 2018, now Pat. No. 11,282,952.

(30) Foreign Application Priority Data

Nov. 24, 2017 (JP) .................................. 2017-226109

(51) Int. Cl.
*H01L 29/78* (2006.01)
*H01L 29/10* (2006.01)
(Continued)

(52) U.S. Cl.
CPC ...... *H01L 29/7813* (2013.01); *H01L 29/1095* (2013.01); *H01L 29/12* (2013.01);
(Continued)

(58) Field of Classification Search
CPC ............. H01L 29/0653; H01L 29/0696; H01L 29/1095; H01L 29/401; H01L 29/407;
(Continued)

(56) References Cited

U.S. PATENT DOCUMENTS 11,282,952 B2 * 3/2022 Hikasa .................... H01L 29/12
2010/0090258 A1 4/2010 Takaishi
(Continued)

FOREIGN PATENT DOCUMENTS

JP 2003303967 10/2003
JP 2005116985 4/2005
(Continued)

OTHER PUBLICATIONS

Notice of Reasons for Refusal issued for Japanese Patent Application No. 2019-555390, Dispatch date: Jul. 21, 2022, 9 pages including English translation.
(Continued)

*Primary Examiner* — Fazli Erdem
(74) *Attorney, Agent, or Firm* — XSENSUS LLP

(57) ABSTRACT

A semiconductor device includes a semiconductor layer having a main surface in which a trench is formed, a first-conductivity-type body region formed along a sidewall of the trench in a surface layer portion of the main surface of the semiconductor layer, a second-conductivity-type impurity region formed along the sidewall of the trench in a surface layer portion of the body region, a gate insulating layer formed on an inner wall of the trench, a gate electrode that is embedded in the trench and that faces the body region and the impurity region with the gate insulating layer placed between the gate electrode and the body region and between the gate electrode and the impurity region, a contact electrode that passes through the sidewall of the trench from inside the trench and is drawn out to the surface layer portion of the main surface of the semiconductor layer and is electrically connected to the body region and to the impurity region, and an embedded insulating layer that is interposed between the gate electrode and the contact electrode in the trench and that insulates the gate electrode and the contact electrode.

14 Claims, 48 Drawing Sheets

(51) Int. Cl.
  *H01L 29/12* (2006.01)
  *H01L 29/417* (2006.01)
  *H01L 29/423* (2006.01)
  *H01L 29/49* (2006.01)
  *H01L 29/66* (2006.01)
  *H01L 29/739* (2006.01)

(52) U.S. Cl.
  CPC .......... *H01L 29/417* (2013.01); *H01L 29/423* (2013.01); *H01L 29/49* (2013.01); *H01L 29/66734* (2013.01); *H01L 29/739* (2013.01)

(58) Field of Classification Search
  CPC ............. H01L 29/41766; H01L 29/417; H01L 29/66734; H01L 29/66348; H01L 29/7397; H01L 29/7804; H01L 29/7813
  USPC ........................................................ 257/330
  See application file for complete search history.

(56) References Cited

U.S. PATENT DOCUMENTS

| | | |
|---|---|---|
| 2015/0295071 A1 | 10/2015 | Hikasa |
| 2016/0359026 A1 | 12/2016 | Matsuura |
| 2016/0372585 A1 | 12/2016 | Furukawa et al. |
| 2017/0263740 A1 | 9/2017 | Onozawa et al. |
| 2018/0366462 A1 | 12/2018 | Hikasa |

FOREIGN PATENT DOCUMENTS

| | | |
|---|---|---|
| JP | 2008282859 | 11/2008 |
| JP | 2011199061 | 10/2011 |
| JP | 2016225566 | 12/2016 |
| JP | 2017168829 | 9/2017 |
| WO | 2015162811 | 10/2015 |

OTHER PUBLICATIONS

International Search Report and Written Opinion issued for International Patent Application No. PCT/JP2018/043340, Date of mailing: Feb. 19, 2019, 10 pages including English translation of Search Report.

International Preliminary Report on Patentability issued for International Patent Application No. PCT/JP2018/043340, Date of mailing: Jun. 4, 2020, 17 pages including English translation.

Decision of Refusal issued for Japanese Patent Application No. 2019-555390, Dispatch Date: Jan. 12, 2023, 5 pages including English machine translation.

Japanese Notice of Reasons for Refusal issued Apr. 18, 2024 in corresponding Japanese Patent Application No. 2023-058715, 3 pages.

* cited by examiner

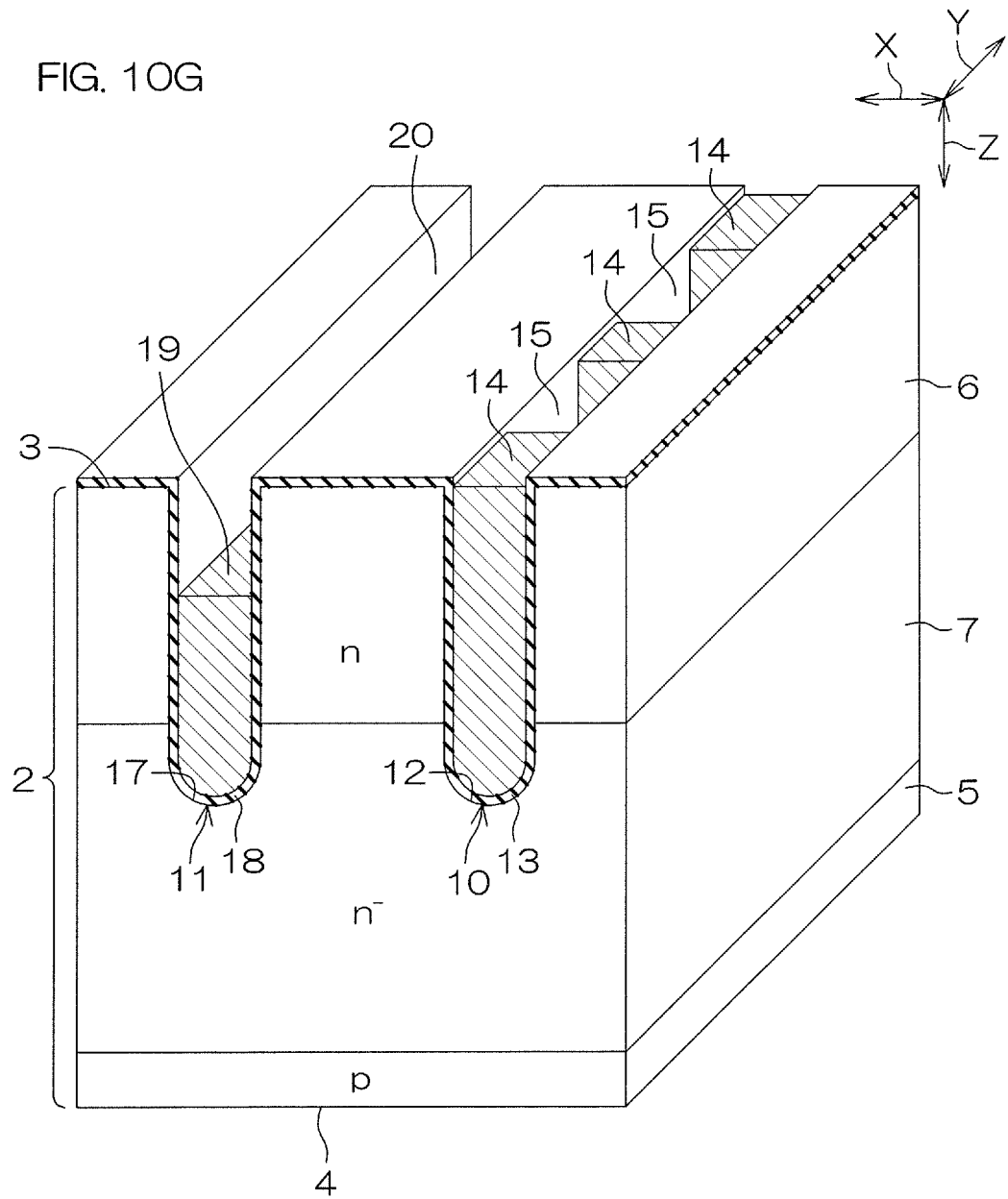

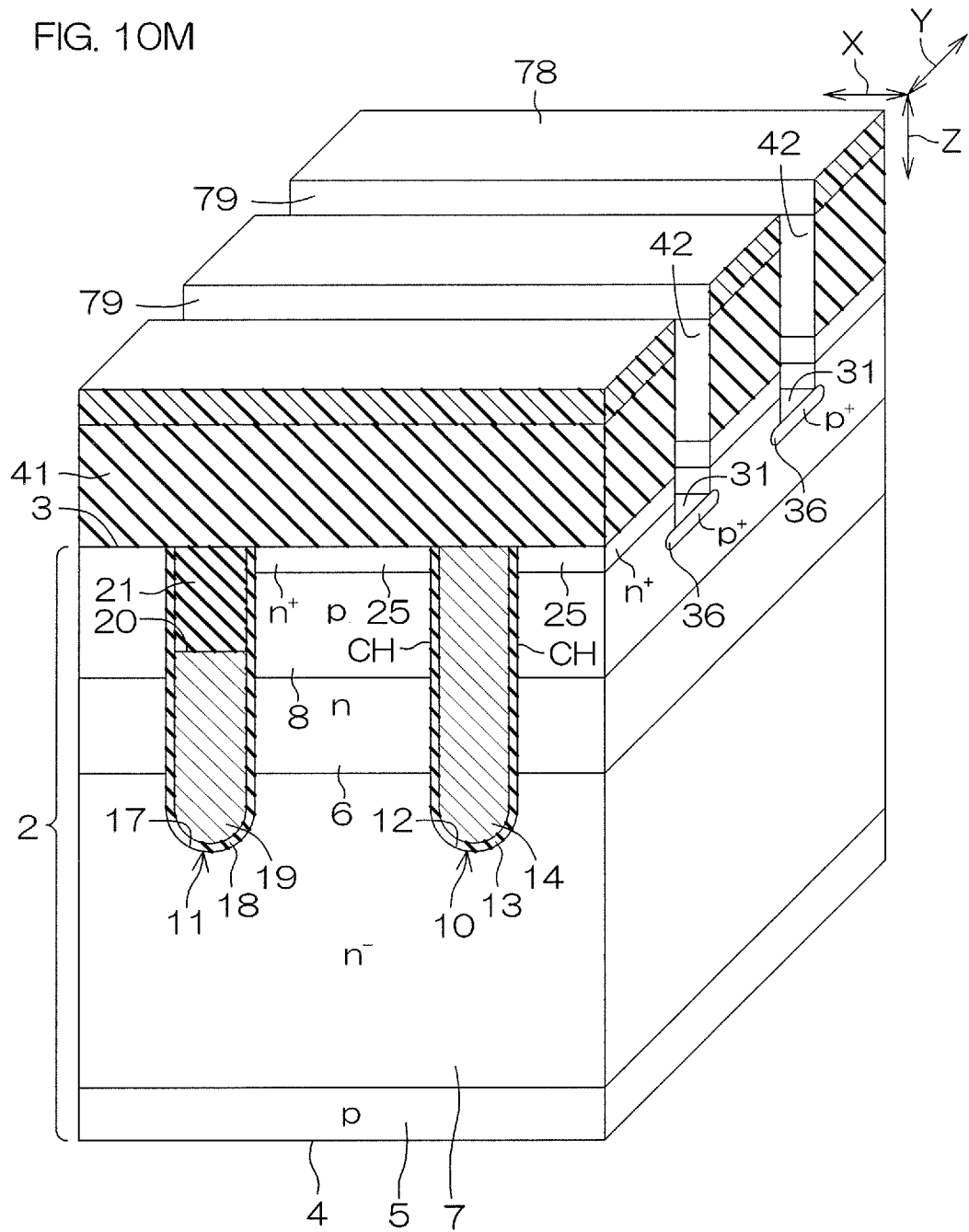

FIG. 32

SEMICONDUCTOR DEVICE

TECHNICAL FIELD

The present invention relates to a semiconductor device.

BACKGROUND ART

A semiconductor device having an IGBT (Insulated Gate Bipolar Transistor) is disclosed in Patent Literature 1. This semiconductor device includes a semiconductor substrate (semiconductor layer) that has a main surface. A trench is formed in the main surface of the semiconductor substrate. A p-type body region is formed in a surface layer portion of the main surface of the semiconductor substrate along a sidewall of the trench. An n-type emitter region (impurity region) is formed in a surface layer portion of the body region along the sidewall of the trench.

A gate insulating layer is formed on an inner wall of the trench. A gate electrode layer is embedded in the trench with the gate insulating layer. A contact groove exposing the emitter region is formed at the main surface of the semiconductor substrate away from the trench. An emitter electrode (contact electrode) is embedded in the contact groove.

CITATION LIST

Patent Literature

Patent Literature 1: Japanese Patent Application Publication No. 2016-225566

SUMMARY OF INVENTION

Technical Problem

In a structure in which the gate electrode and the contact electrode are embedded in the surface layer portion of the semiconductor layer, the contact electrode is formed away from the gate electrode such as not to come into contact with the gate electrode. A distance between the gate electrode and the contact electrode is set in consideration of the dimensional tolerance of the contact electrode. Therefore, it is impossible to make the distance between the gate electrode and the contact electrode narrower than a predetermined value set in accordance with the dimensional tolerance of the contact electrode. The miniaturization of the semiconductor device is hindered by this type of problem.

A preferred embodiment of the present invention provides a semiconductor device that is capable of reducing limitations caused by the dimensional tolerance of the contact electrode and that is capable of contributing to the miniaturization.

Solution to Problem

A preferred embodiment of the present invention provides a semiconductor device that includes a semiconductor layer that has a main surface in which a trench is formed, a first-conductivity-type body region formed along a sidewall of the trench in a surface layer portion of the main surface of the semiconductor layer, a second-conductivity-type impurity region formed along the sidewall of the trench in a surface layer portion of the body region, a gate insulating layer formed on an inner wall of the trench, a gate electrode that is embedded in the trench and that faces the body region and the impurity region with the gate insulating layer placed between the gate electrode and the body region and between the gate electrode and the impurity region, a contact electrode that passes through the sidewall of the trench from inside the trench and is drawn out to the surface layer portion of the main surface of the semiconductor layer and is electrically connected to the body region and to the impurity region, and an embedded insulating layer that is interposed between the gate electrode and the contact electrode in the trench and that insulates the gate electrode and the contact electrode.

According to this semiconductor device, the contact electrode is not required to be formed away from the gate electrode, and thereby it is possible to reduce limitations caused by the dimensional tolerance of the contact electrode. Therefore, it is possible to provide a semiconductor device that is capable of contributing to the miniaturization.

The aforementioned or still other objects, features, and effects of the present invention will be clarified by the following description of preferred embodiments given below with reference to the accompanying drawings.

BRIEF DESCRIPTION OF DRAWINGS

FIG. 32 is a cross-sectional view of the region corresponding to FIG. 29, showing a region of a part of a semiconductor device according to an eighteenth preferred embodiment of the present invention.

DESCRIPTION OF EMBODIMENTS

Figure 1:
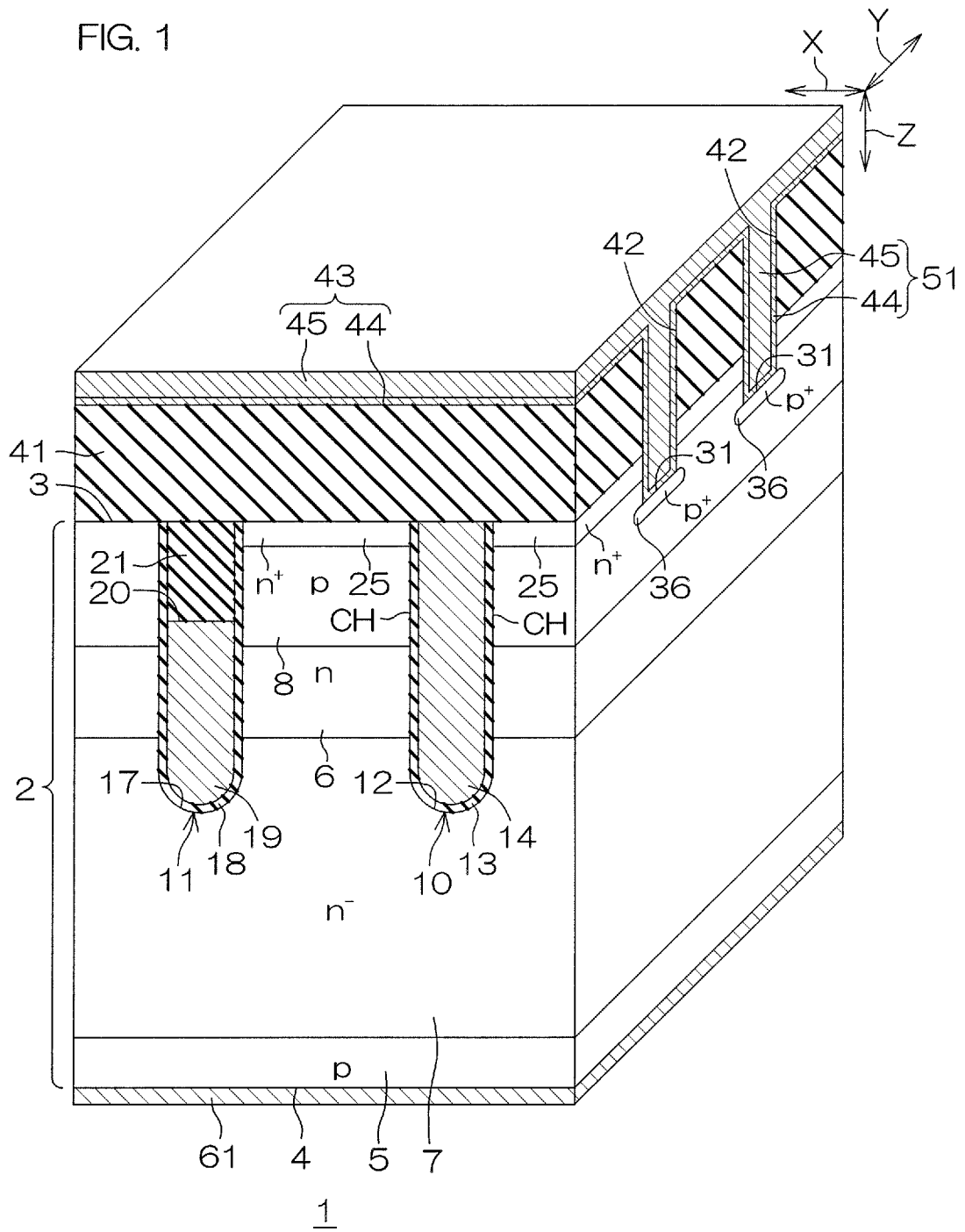
FIG. 1 is a cross-sectional perspective view showing a region of a part of a semiconductor device according to a first preferred embodiment of the present invention.
Figure 2:
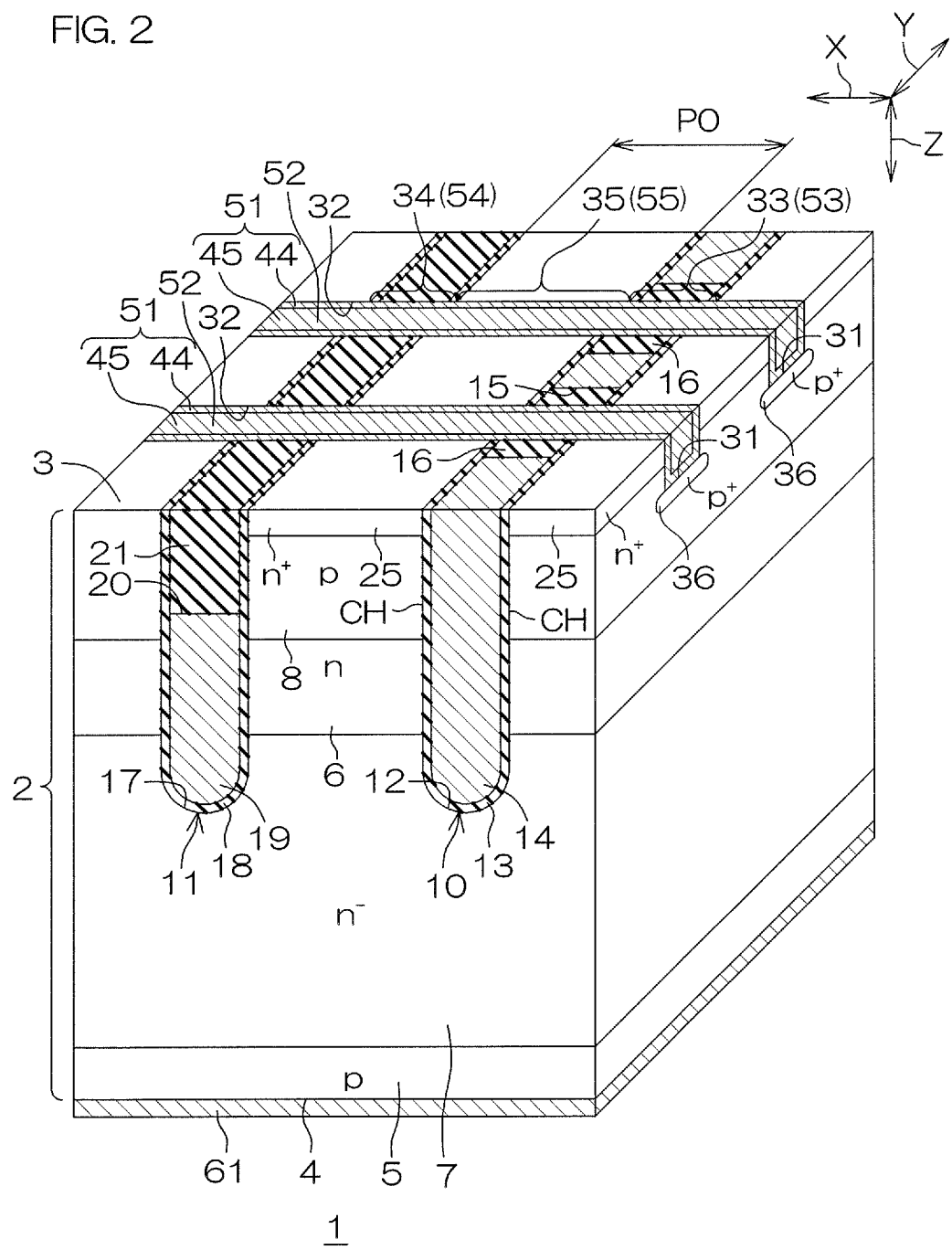
FIG. 2 is a cross-sectional perspective view in which a structure on a main surface of a semiconductor layer has been removed from FIG. 1.
Figure 3:
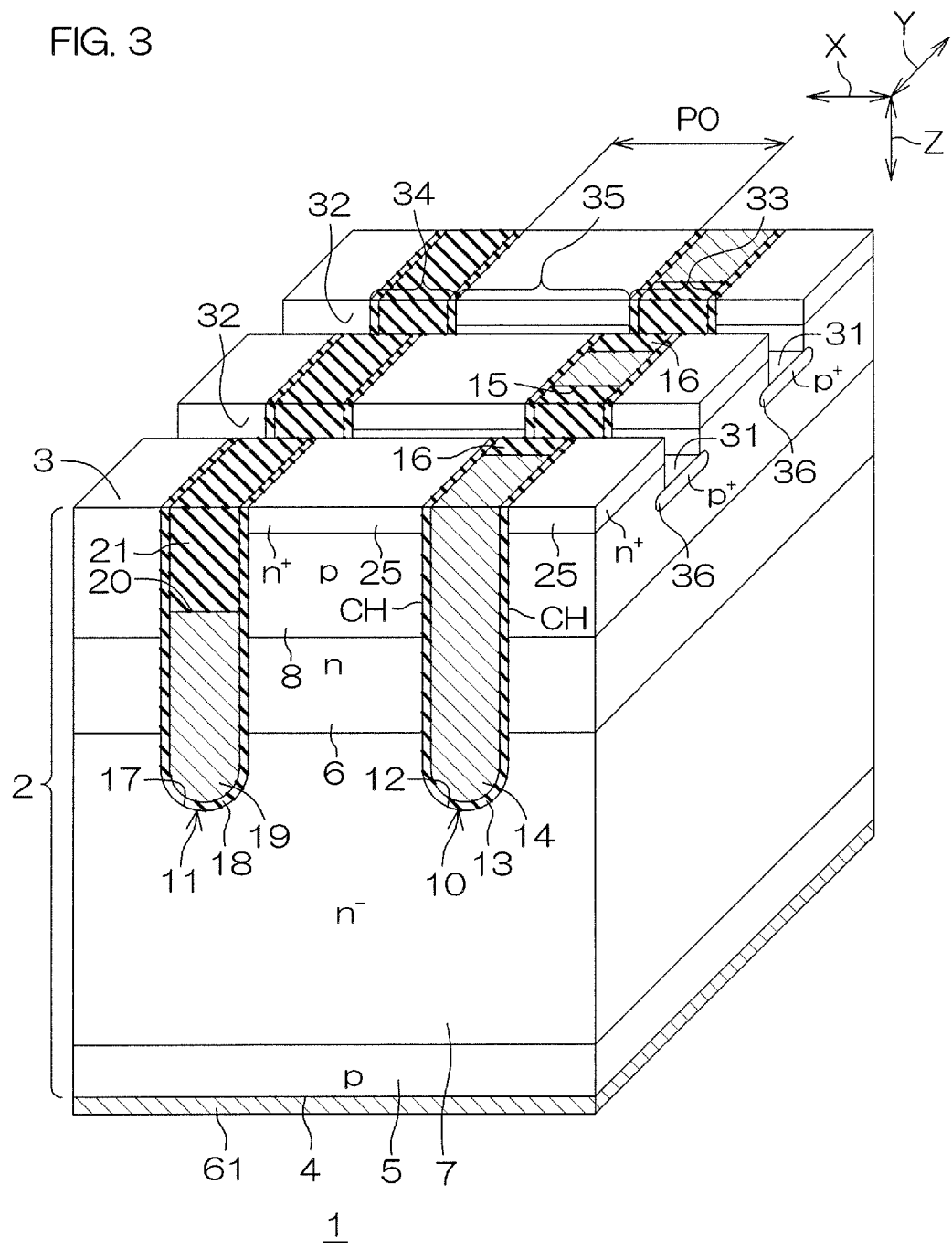
FIG. 3 is a cross-sectional perspective view in which an emitter contact electrode layer has been removed from FIG. 2.

FIG. 1 is a cross-sectional perspective view showing a region of a part of a semiconductor device 1 according to a first preferred embodiment of the present invention. FIG. 2 is a cross-sectional perspective view in which a structure on a main surface 3 of a semiconductor layer 2 has been removed from FIG. 1. FIG. 3 is a cross-sectional perspective view in which an emitter contact electrode layer 51 has been removed from FIG. 2.

Figure 4:
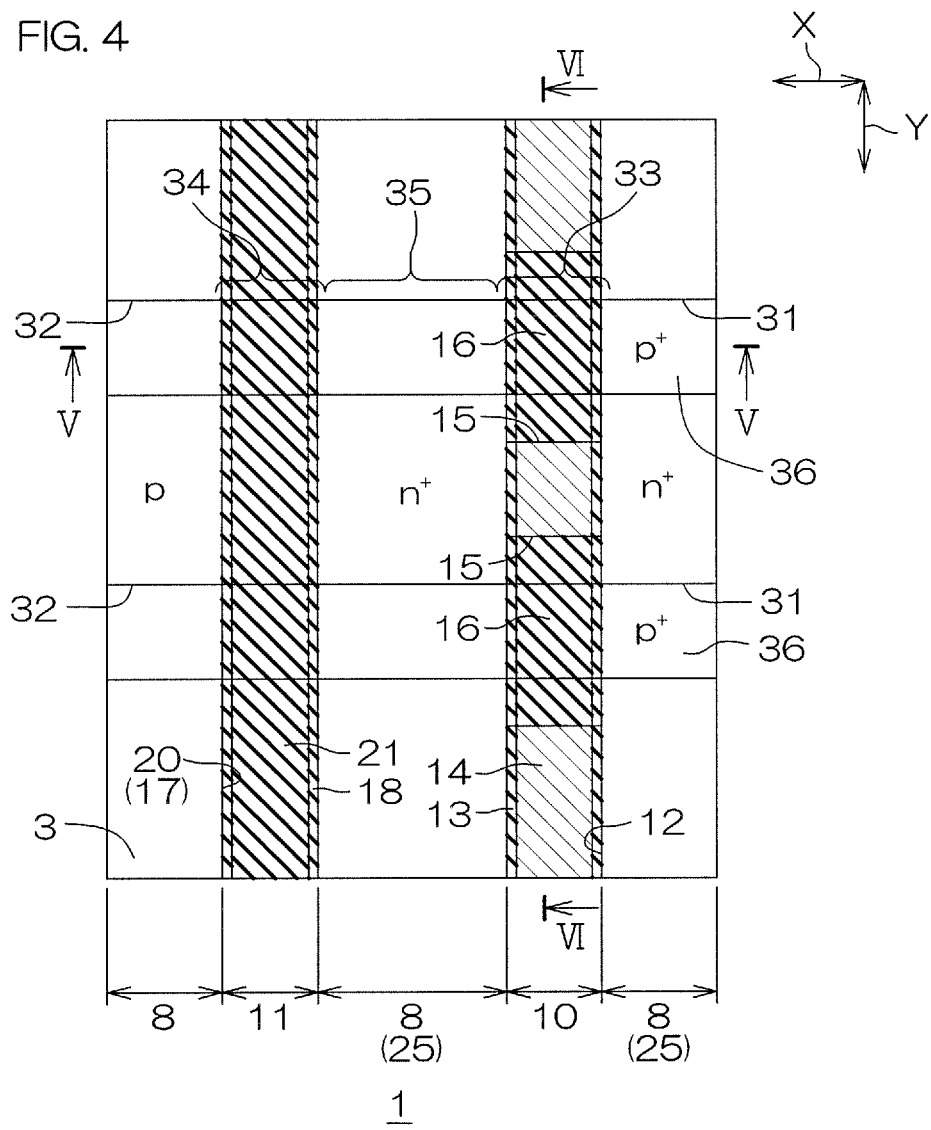
FIG. 4 is a plan view in which the semiconductor device of FIG. 3 is seen from the main surface of the semiconductor layer.
Figure 5:
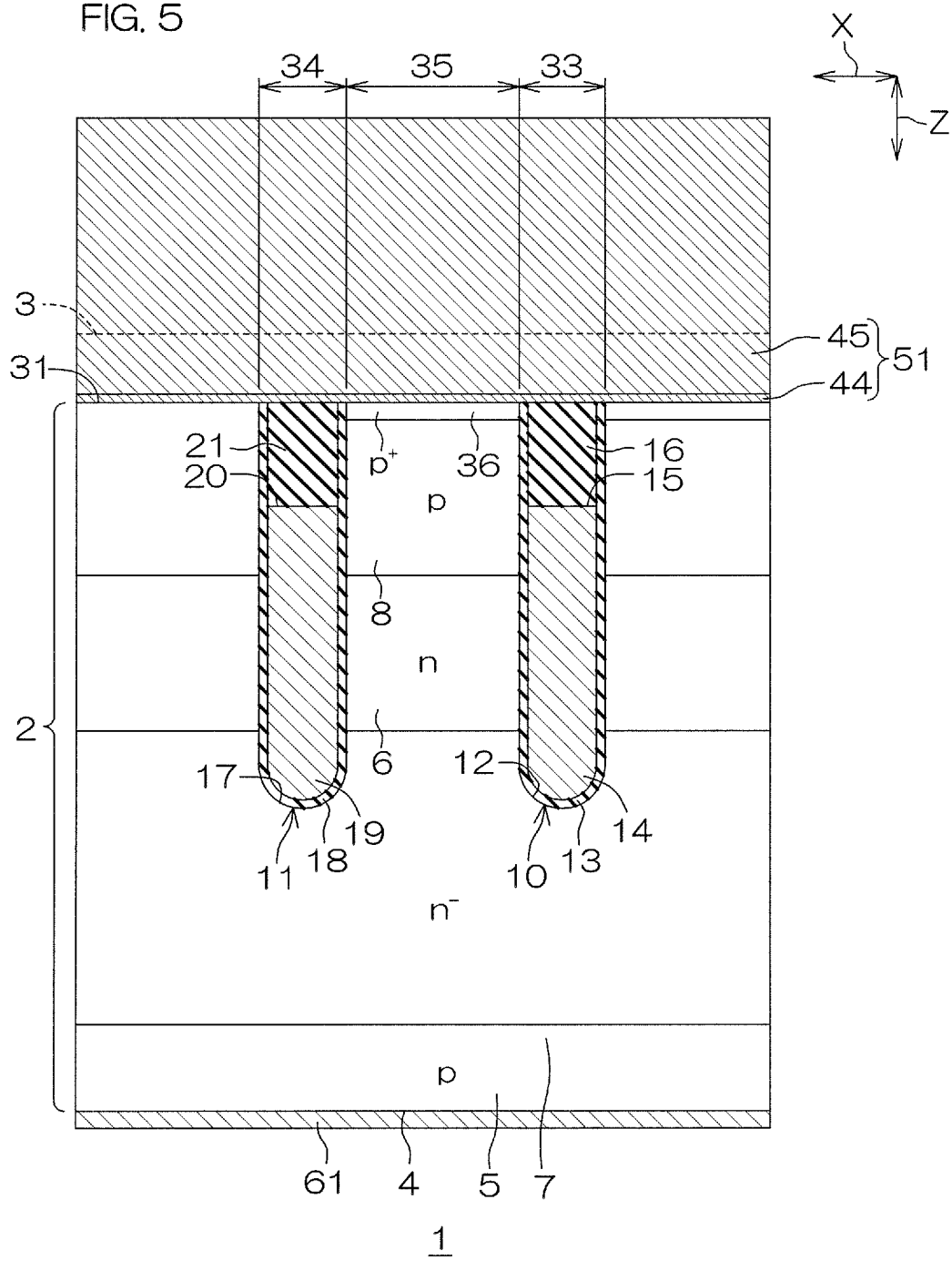
FIG. 5 is a cross-sectional view taken along line V-V in FIG. 4.
Figure 6:
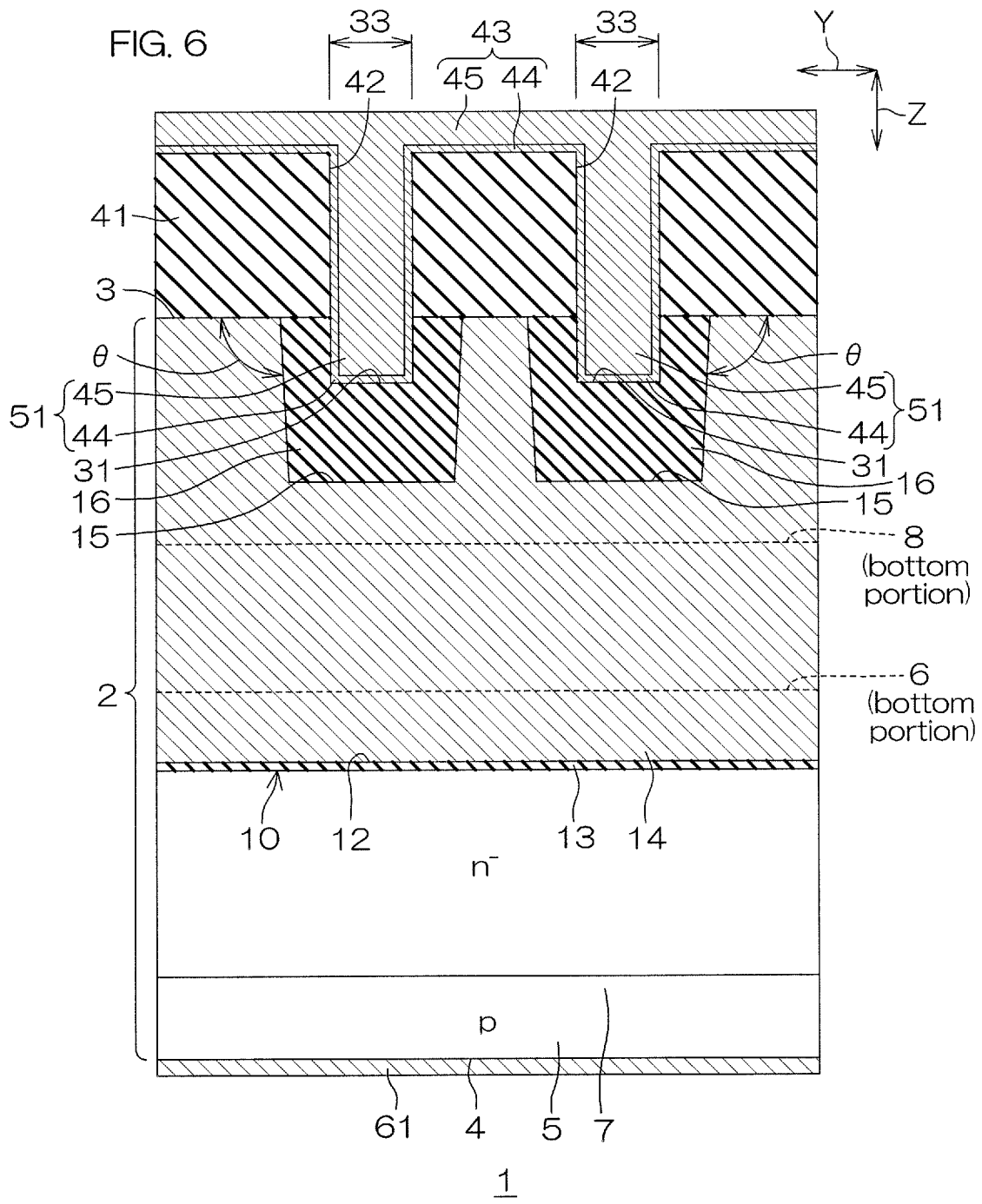
FIG. 6 is a cross-sectional view taken along line VI-VI in FIG. 4.

FIG. 4 is a plan view in which the semiconductor device of FIG. 3 is seen from the main surface 3 of the semiconductor layer 2. FIG. 5 is a cross-sectional view taken along line V-V in FIG. 4. FIG. 6 is a cross-sectional view taken along line VI-VI in FIG. 4. The structure on the first main surface 3 of the semiconductor layer 2 is also shown in FIG. 5 and FIG. 6.

The semiconductor device 1 has a basic form including a trench-gate type IGBT (Insulated Gate Bipolar Transistor) in the present preferred embodiment. Referring to FIG. 1 to FIG. 6, the semiconductor device 1 includes the n⁻-type semiconductor layer 2. The semiconductor layer 2 is made of an n⁻-type silicon single crystal substrate in the present preferred embodiment. The silicon single crystal substrate is formed by use of a semiconductor wafer of an n⁻-type silicon single crystal manufactured through an FZ (Floating Zone) method.

The semiconductor layer 2 has a first main surface 3 on one side and a second main surface 4 on the other side. The thickness of the semiconductor layer 2 may be not less than 50 μm and not more than 300 μm. The thickness of the semiconductor layer 2 may be not less than 50 μm and not more than 100 μm, not less than 100 μm and not more than 150 μm, not less than 150 μm and not more than 200 μm, not less than 200 μm and not more than 250 μm, or not less than 250 μm and not more than 300 μm.

A p-type collector region 5 is formed in a surface layer portion of the second main surface 4. An n-type charge storage region 6 is formed in a surface layer portion of the first main surface 3. The charge storage region 6 is formed with an interval on the first-principal-surface-3 side with respect to the collector region 5.

In the semiconductor layer 2, an n⁻-type drift region 7 is formed in a region between the collector region 5 and the charge storage region 6. The drift region 7 is defined by a region positioned between the collector region 5 and the charge storage region 6 in the semiconductor layer 2. A p-type body region 8 is formed in a surface layer portion of the charge storage region 6. A plurality of trench gate electrode structures 10 and a plurality of trench emitter electrode structures 11 are formed in the surface layer portion of the first main surface 3 with intervals between the electrode structures.

Only the single trench gate electrode structure 10 and the single trench emitter electrode structure 11 that adjoin each other are shown in FIG. 1 to FIG. 6. A structure of the semiconductor device 1 will be hereinafter described while paying attention to a structure of the single trench gate electrode structure 10 and that of the single trench emitter electrode structure 11.

The trench gate electrode structure 10 and the trench emitter electrode structure 11 are formed with an interval therebetween along an arbitrary first direction X. The trench gate electrode structure 10 and the trench emitter electrode structure 11 extend in a band shape along a second direction Y that intersects the first direction X in a plan view.

More specifically, the term "plan view" denotes a plan view seen from a normal direction Z to the first main surface 3 (hereinafter, referred to simply as "normal direction Z"). More specifically, the second direction Y is a direction perpendicular to the first direction X. The first direction X and the second direction Y are each also a tangential direction to the first main surface 3.

The trench pitch P0 between the trench gate electrode structure 10 and the trench emitter electrode structure 11 may be not less than 0.1 μm and less than 0.6 μm. The trench pitch P0 may be not less than 0.1 μm and not more than 0.2 μm, not less than 0.2 μm and not more than 0.3 μm, not less than 0.3 μm and not more than 0.4 μm, not less than 0.4 μm and not more than 0.5 μm, or not less than 0.5 μm and less than 0.6 μm. Preferably, the trench pitch P0 is not less than 0.2 μm and not more than 0.4 μm (for example, about 0.25 μm).

The trench gate electrode structure 10 includes a gate trench 12 (trench), a gate insulating layer 13, a gate electrode layer 14 (gate electrode), a plurality of gate embedding holes 15, and a plurality of gate embedded insulating layers 16 (embedded insulating layers). The gate trench 12 passes through the body region 8 and the charge storage region 6 from the first main surface 3, and reaches the drift region 7.

The depth of the gate trench 12 may be not less than 2.0 μm and not more than 4.0 μm. The depth of the gate trench 12 may be not less than 2.0 μm and not more than 2.5 μm, not less than 2.5 μm and not more than 3.0 μm, not less than 3.0 μm and not more than 3.5 μm, or not less than 3.5 μm and not more than 4.0 μm. Preferably, the depth of the gate trench 12 is not less than 2.5 μm and not more than 3.5 μm (for example, about 3.0 μm).

A first-direction width of the gate trench 12 may be not less than 0.5 μm and not more than 1.5 μm. The first-direction width of the gate trench 12 may be not less than 0.5 μm and not more than 0.75 μm, not less than 0.75 μm and not more than 1.0 μm, not less than 1.0 μm and not more than 1.25 μm, or not less than 1.25 μm and not more than 1.5 μm. Preferably, the first-direction width of the gate trench 12 is not less than 0.5 μm and not more than 1.0 μm (for example, about 0.75 μm).

The gate insulating layer 13 may include silicon oxide. The gate insulating layer 13 is formed in a film shape along an inner wall surface of the gate trench 12. The gate insulating layer 13 defines a recessed space in the gate trench 12.

The gate electrode layer 14 may include electroconductive polysilicon. The gate electrode layer 14 is controlled by a gate voltage. The gate electrode layer 14 is embedded in the gate trench 12 with the gate insulating layer 13 between the gate electrode layer 14 and the gate trench 12. More specifically, the gate electrode layer 14 is embedded in the recessed space defined by the gate insulating layer 13 in the gate trench 12. An upper end portion of the gate electrode layer 14 is positioned at the first-principal-surface-3 side with respect to a bottom portion of the body region 8.

In the present preferred embodiment, the gate embedding holes 15 are formed in a main surface of the gate electrode layer 14 with intervals between the gate embedding holes 15 along the second direction Y. Hence, the upper end portion of the gate electrode layer 14 has an uneven structure including the gate embedding holes 15.

The interval between the gate embedding holes 15 that adjoin each other may be more than 0 μm and not more than 10 μm. The interval between the gate embedding holes 15 that adjoin each other is also the width in the second direction Y of a part positioned between two mutually adjoining gate embedding holes 15 in the gate electrode layer 14. The interval between the mutually adjoining gate embedding holes 15 may be more than 0 μm and not more than 2 μm, not less than 2 μm and not more than 4 μm, not less than 4 μm and not more than 6 μm, not less than 6 μm and not more than 8 μm, or not less than 8 μm and not more than 10 μm.

In the present preferred embodiment, a sidewall of each of the gate embedding holes 15 is defined by the gate insulating layer 13 and by the gate electrode layer 14. A bottom wall of each of the gate embedding holes 15 is defined by the gate electrode layer 14. The bottom wall of each of the gate embedding holes 15 is positioned in a region between the first main surface 3 and the bottom portion of the body region 8 regarding the normal direction Z.

Referring to FIG. 6, each of the gate embedding holes 15 is formed such as to have a tapered shape in which the bottom area is smaller than the opening area. The angle θ between the main surface of the gate electrode layer 14 and the sidewall of the gate embedding hole 15 in the gate electrode layer 14 may be more than 90° and not more than 105° (for example, about 102°).

The gate embedded insulating layers 16 are each embedded in a surface layer portion of the gate electrode layer 14 in the gate trench 12. More specifically, the gate embedded insulating layers 16 are embedded in the gate embedding holes 15, respectively. Each of the gate embedded insulating layers 16 is exposed from an opening of the gate trench 12.

The trench emitter electrode structure 11 includes an emitter trench 17 (second trench), an emitter insulating layer 18 (inner-wall insulating layer), an emitter electrode layer 19 (embedded electrode), an emitter embedding hole 20, and an emitter embedded insulating layer 21 (second embedded insulating layer). The emitter trench 17 passes through the body region 8 and the charge storage region 6 from the first main surface 3, and reaches the drift region 7.

The depth of the emitter trench 17 may be not less than 2.0 μm and not more than 4.0 μm. The depth of the emitter trench 17 may be not less than 2.0 μm and not more than 2.5 μm, not less than 2.5 μm and not more than 3.0 μm, not less than 3.0 μm and not more than 3.5 μm, or not less than 3.5 μm and not more than 4.0 μm. Preferably, the depth of the emitter trench 17 is not less than 2.5 μm and not more than 3.5 μm (for example, about 3.0 μm). Preferably, the depth of the emitter trench 17 is substantially equal to the depth of the gate trench 12.

The first-direction width of the emitter trench 17 may be not less than 0.5 μm and not more than 1.5 μm. The first-direction width of the emitter trench 17 may be not less than 0.5 μm and not more than 0.75 μm, not less than 0.75 μm and not more than 1.0 μm, not less than 1.0 μm and not more than 1.25 μm, or not less than 1.25 μm and not more than 1.5 μm. Preferably, the first-direction width of the emitter trench 17 is not less than 0.5 μm and not more than 1.0 μm (for example, about 0.75 μm). Preferably, the first-direction width of the emitter trench 17 is substantially equal to the first-direction width of the gate trench 12.

The emitter insulating layer 18 may include silicon oxide. The emitter insulating layer 18 is formed in a film shape along an inner wall surface of the emitter trench 17. The emitter insulating layer 18 defines a recessed space in the emitter trench 17.

The emitter electrode layer 19 may include electroconductive polysilicon. The emitter electrode layer 19 is controlled by an emitter voltage. The emitter voltage has a voltage value less than a gate voltage. The emitter voltage may be a reference voltage (for example, ground voltage).

The emitter electrode layer 19 is embedded in the emitter trench 17 with the emitter insulating layer 18 between the emitter electrode layer 19 and the emitter trench 17. More specifically, the emitter electrode layer 19 is embedded in the recessed space defined by the emitter insulating layer 18 in the emitter trench 17.

In the present preferred embodiment, the emitter embedding hole 20 is formed such as to dig down substantially the entirety of a main surface of the emitter electrode layer 19. In other words, the emitter electrode layer 19 is embedded to an intermediate portion in the depth direction of the recessed space defined by the emitter insulating layer 18.

In the present preferred embodiment, a sidewall of the emitter embedding hole 20 is defined by the emitter insulating layer 18. A bottom wall of the emitter embedding hole 20 is defined by the emitter electrode layer 19. The bottom wall of the emitter embedding hole 20 is positioned in the region between the first main surface 3 and the bottom portion of the body region 8 regarding the normal direction Z. In other words, an upper end portion of the emitter electrode layer 19 is positioned on the first-principal-surface-3 side with respect to the bottom portion of the body region 8. Regarding the normal direction Z, the depth of the emitter embedding hole 20 may be substantially equal to the depth of the gate embedding hole 15.

The emitter embedded insulating layer 21 is embedded in a surface layer portion of the emitter electrode layer 19 in the emitter trench 17. More specifically, the emitter embedded insulating layer 21 is embedded in the emitter embedding hole 20. Hence, the emitter embedded insulating layer 21 seals the emitter electrode layer 19. The emitter embedded insulating layer 21 is exposed from an opening of the emitter trench 17.

An $n^+$-type emitter region 25 (impurity region) is formed in a region along a sidewall of the gate trench 12 in a surface layer portion of the body region 8. More specifically, the emitter regions 25 are formed along a one-side sidewall and along an other-side sidewall of the gate trench 12 regarding the first direction X. The emitter regions 25 are each formed in a band shape extending in the second direction Y. The emitter region 25 is contiguous to the sidewall of the gate trench 12. The emitter region 25 is also contiguous to a sidewall of the emitter trench 17.

The emitter region 25, the body region 8, the charge storage region 6, and the drift region 7 are formed in this order from the first main surface 3 toward the second-principal-surface-4 side in the region along the sidewall of the gate trench 12 in the surface layer portion of the first main surface 3. A channel CH of the IGBT is formed in a region facing the gate electrode layer 14 with the gate insulating layer 13 between the channel CH and the gate electrode layer 14 in the body region 8.

Referring to FIG. 3 and FIG. 4, a plurality of first contact holes 31 are formed in the surface layer portion of the first main surface 3. The first contact holes 31 are formed with intervals between the first contact holes 31 along the second direction Y. The first contact holes 31 are each formed in a band shape extending along the first direction X. A second-direction width of each of the first contact holes 31 is smaller than the second-direction width of the gate trench 12. The first-direction width of each of the first contact holes 31 is larger than the first-direction width of the gate trench 12.

More specifically, each of the first contact holes 31 passes through the sidewall of the gate trench 12 from an inward region of a corresponding gate embedded insulating layer 16, and is drawn out to the surface layer portion of the first main surface 3. In the present preferred embodiment, each of the first contact holes 31 passes through the one-side sidewall and the other-side sidewall of the gate trench 12 from the inward region of the gate embedded insulating layer 16 regarding the first direction X. The second-direction width of each of the first contact holes 31 is smaller than the second-direction width of the corresponding gate embedded insulating layer 16.

Each of the first contact holes 31 further has a drawn portion 32 drawn out from the one-side sidewall of the gate trench 12 toward the emitter trench 17. Each of the drawn portions 32 passes through the sidewall of the emitter trench 17 from the surface layer portion of the first main surface 3, and reaches the inside of the emitter trench 17. In the present preferred embodiment, each of the drawn portions 32 passes through a one-side sidewall and an other-side sidewall of the emitter trench 17 regarding the first direction X.

Each of the first contact holes 31 has a first intersection region 33 intersecting the gate electrode layer 14 in a plan view. In the first intersection region 33, a sidewall and a bottom wall of each of the first contact holes 31 are defined by the gate embedded insulating layer 16.

Each of the first contact holes 31 has a second intersection region 34 intersecting the emitter electrode layer 19 in a plan view. In the second intersection region 34, the sidewall and the bottom wall of each of the first contact holes 31 are defined by the emitter embedded insulating layer 21.

Each of the first contact holes 31 has a connection region 35 by which the first intersection region 33 and the second intersection region 34 are connected together in a region between the gate trench 12 and the emitter trench 17 in a plan view. In the connection region 35, the sidewall and bottom wall of each of the first contact holes 31 are defined by the semiconductor layer 2.

The sidewall of each of the first contact holes 31 is formed such as to be flush in the first intersection region 33, the second intersection region 34, and the connection region 35. The bottom wall of each of the first contact holes 31 is formed such as to be flush in the first intersection region 33, the second intersection region 34, and the connection region 35.

The bottom wall of each of the first contact holes 31 is formed in the region between the first main surface 3 and the bottom portion of the body region 8. More specifically, the bottom wall of each of the first contact holes 31 is formed in a region between the bottom portion of the body region 8 and a bottom portion of the emitter region 25.

The first contact holes 31 are arbitrarily arranged. The first contact holes 31 may be formed at equal intervals therebetween along the second direction Y. The first contact holes 31 may be formed at unequal intervals therebetween along the second direction Y.

In the body region 8, a $p^+$-type contact region 36 is formed in a region along the bottom wall of each of the first contact holes 31. The contact region 36 may be formed in a region along the bottom wall and the sidewall of each of the first contact holes 31 in the body region 8. The contact region 36 is formed in a region that is deeper than the emitter region 25 in the body region 8 regarding the normal direction Z.

The contact region 36 has an exposure surface that is exposed from the bottom wall of the first contact hole 31. The exposure surface of the contact region 36 is formed at the region between the first main surface 3 and the bottom portion of the body region 8. More specifically, the exposure surface of the contact region 36 is formed in the region between the bottom portion of the body region 8 and the bottom portion of the emitter region 25. Even more specifically, the exposure surface of the contact region 36 is formed in a region between an upper surface of the emitter electrode layer 19 and the bottom portion of the emitter region 25.

An example in which the contact region 36 is shallowly formed at a bottom surface of the first contact hole 31 by performing ion implantation one time is shown in FIG. 1 to FIG. 3. However, the contact region 36 may be formed more deeply by adjusting the number of times of ion implantation or by adjusting the energy of ion implantation.

Referring again to FIG. 1, an interlayer insulating layer 41 (insulating layer) is formed on the first main surface 3. The interlayer insulating layer 41 covers the trench gate electrode structure 10 and the trench emitter electrode structure 11. The interlayer insulating layer 41 covers the gate embedded insulating layer 16 exposed from the gate trench 12 and the emitter embedded insulating layer 21 exposed from the emitter trench 17.

The interlayer insulating layer 41 may include an oxide film ($SiO_2$ film) or a nitride film (SiN film). The interlayer insulating layer 41 may have a layered structure including an oxide film ($SiO_2$ film) and a nitride film (SiN film). The oxide film ($SiO_2$ film) may include a BPSG (Boron Phosphorus Silicon Glass) film that contains boron and phosphorus and/or a PSG (Phosphorus Silicon Glass) film that contains phosphorus.

The interlayer insulating layer 41 may have a layered structure that includes a BPSG film and a PSG film that are stacked together in this order from the first main surface 3. The thickness of the BPSG film may be not less than 2000 Å and not more than 8000 Å (for example, about 5000 Å). The thickness of the PSG film may be not less than 2000 Å and not more than 6000 Å (for example, about 4000 Å).

A plurality of second contact holes 42 are formed in the interlayer insulating layer 41. Each of the second contact holes 42 is in communication with a corresponding first contact hole 31. In other words, the second contact holes 42 are formed with intervals therebetween along the second direction Y, and are each formed in a band shape extending along the first direction X.

The second contact holes 42 pass through the interlayer insulating layer 41, and each of the second contact holes 42 communicates with to a corresponding first contact hole 31. Hence, each of the second contact holes 42 forms one emitter contact hole 31, 42 by a combination of the second contact hole 42 and the corresponding first contact hole 31.

The second-direction width of each of the second contact holes 42 may be equal to or more than the second-direction width of each of the first contact holes 31. In other words, the second-direction width of each of the second contact holes 42 may be equal to the second-direction width of each of the first contact holes 31, or may exceed the second-direction width of each of the first contact holes 31. If the second-direction width of each of the second contact holes 42 exceeds the second-direction width of each of the first contact holes 31, an inner wall surface of each of the second contact holes 42 may surround an inner wall surface of the corresponding first contact hole 31.

The second contact holes 42 are arbitrarily arranged, and are adjusted in accordance with how the first contact holes 31 are arranged. The second contact holes 42 may be formed at equal intervals therebetween along the second direction Y. The second contact holes 42 may be formed at unequal intervals therebetween along the second direction Y.

An emitter principal-surface electrode layer 43 that serves as a first principal-surface electrode layer is formed on the interlayer insulating layer 41. The emitter principal-surface electrode layer 43 enters the second contact hole 42 and the first contact hole 31 (i.e., the emitter contact hole 31, 42) from above the interlayer insulating layer 41.

The emitter principal-surface electrode layer 43 may have a layered structure including a first electrode layer 44 and a second electrode layer 45 that are stacked together in this order from the interlayer-insulating-layer-41 side. The first electrode layer 44 serves as a ground layer of the second electrode layer 45. The first electrode layer 44 is formed such as to be used as a barrier electrode layer that suppresses the diffusion of the second electrode layer 45.

The first electrode layer 44 is formed in a film shape along a main surface of the interlayer insulating layer 41. The first electrode layer 44 enters the inside of the emitter contact hole 31, 42. The first electrode layer 44 is formed in a film shape in the emitter contact hole 31, 42. The first electrode layer 44 defines a recessed space in the emitter contact hole 31, 42. The first electrode layer 44 is connected to the body region 8, to the emitter region 25, and to the contact region 36 in the emitter contact hole 31, 42.

The first electrode layer 44 may have a layered structure including a titanium layer and a titanium nitride layer that are stacked together in this order from the first-principalsurface-3 side. The first electrode layer 44 may have a single-layer structure including a titanium layer or a titanium nitride layer.

The second electrode layer 45 is formed in a film shape on the first electrode layer 44. The second electrode layer 45 enters the recessed space defined by the first electrode layer 44 in the emitter contact hole 31, 42. The second electrode layer 45 is electrically connected to the body region 8, to the emitter region 25, and to the contact region 36 through the first electrode layer 44. The second electrode layer 45 may include a tungsten layer.

A part with which the main surface of the interlayer insulating layer 41 is covered in the emitter principal-surface electrode layer 43 may be formed by a third electrode layer including a conductive material that differs from that of the second electrode layer 45. In this case, the third electrode layer is formed on the interlayer insulating layer 41 such as to cover the second electrode layer 45.

The third electrode layer may include at least one kind among nickel, palladium, aluminum, copper, an aluminum alloy, and a copper alloy. The third electrode layer may include at least one kind among an Al—Si—Cu (aluminum-silicon-copper) alloy, an Al—Si (aluminum-silicon) alloy, and an Al—Cu (aluminum-copper) alloy each of which is an example of the aluminum alloy. Preferably, the third electrode layer is made of a conductive material that includes aluminum as its main element.

In the present preferred embodiment, a plurality of emitter contact electrode layers 51 (contact electrodes) are formed by parts positioned in the first contact holes 31 in the emitter principal-surface electrode layer 43. Hence, referring to FIG. 1 to FIG. 6, a structure in which the emitter contact electrode layers 51 are embedded in the surface layer portion of the semiconductor layer 2 is formed.

The emitter contact electrode layers 51 have an arrangement and each have a shape that correspond to an arrangement and each shape of the first contact holes 31, respectively. In other words, the emitter contact electrode layers 51 are formed with intervals therebetween along the second direction Y, and are each formed in a band shape extending along the first direction X.

The second-direction width of each of the emitter contact electrode layers 51 is smaller than the second-direction width of the gate trench 12. The first-direction width of each of the emitter contact electrode layers 51 is larger than the first-direction width of the gate trench 12.

Each of the emitter contact electrode layers 51 passes through the sidewall of the gate trench 12 from the inward region of a corresponding gate embedded insulating layer 16, and is drawn out to the surface layer portion of the first main surface 3. In the present preferred embodiment, each of the emitter contact electrode layers 51 passes through the one-side sidewall and the other-side sidewall of the gate trench 12 from the inward region of the gate embedded insulating layer 16 regarding the first direction X. The second-direction width of each of the emitter contact electrode layers 51 is smaller than the second-direction width of the corresponding gate embedded insulating layer 16.

Each of the emitter contact electrode layers 51 also has a drawn portion 52 that is drawn out from the one-side sidewall of the gate trench 12 toward the emitter trench 17. Each of the drawn portions 52 passes through the sidewall of the emitter trench 17 from the surface layer portion of the first main surface 3, and reaches the inside of the emitter trench 17. In the present preferred embodiment, each of the drawn portions 52 passes through the one-side sidewall and the other-side sidewall of the emitter trench 17 regarding the first direction X.

Each of the emitter contact electrode layers 51 has a first intersection region 53 intersecting the gate electrode layer 14 in a plan view. In the first intersection region 53, each of the emitter contact electrode layers 51 faces the gate electrode layer 14 with the gate embedded insulating layer 16 between the emitter contact electrode layer 51 and the gate electrode layer 14 regarding the normal direction Z and the second direction Y. Each of the emitter contact electrode layers 51 is insulated from the gate electrode layer 14 by means of the gate embedded insulating layer 16.

Each of the emitter contact electrode layers 51 has a second intersection region 54 intersecting the emitter electrode layer 19 in a plan view. In the second intersection region 54, each of the emitter contact electrode layers 51 faces the emitter electrode layer 19 with the emitter embedded insulating layer 21 between the emitter contact electrode layer 51 and the emitter electrode layer 19 regarding the normal direction Z. Each of the emitter contact electrode layers 51 is insulated from the emitter electrode layer 19 by means of the emitter embedded insulating layer 21.

Each of the emitter contact electrode layers 51 has a connection region 55 by which the first intersection region 53 and the second intersection region 54 are connected together in the region between the gate trench 12 and the emitter trench 17 in a plan view. In the connection region 55, each of the emitter contact electrode layers 51 is connected to the body region 8, to the emitter region 25, and to the contact region 36.

Referring to FIG. 5, the thickness of the gate embedded insulating layer 16 interposed between each of the emitter contact electrode layers 51 and the gate electrode layer 14 may be substantially equal to the thickness of the emitter embedded insulating layer 21 interposed between each of the emitter contact electrode layers 51 and the emitter electrode layer 19.

A collector electrode layer 61 serving as a second principal-surface electrode layer is formed on the second main surface 4 of the semiconductor layer 2. The collector electrode layer 61 is connected to the collector region 5. A gate principal-surface electrode layer (not shown) that has the same structure as the emitter principal-surface electrode layer 43 may be formed on the interlayer insulating layer 41. The gate principal-surface electrode layer may be electrically connected to the gate electrode layer 14 through a gate contact hole formed in the interlayer insulating layer 41.

Figure 7:
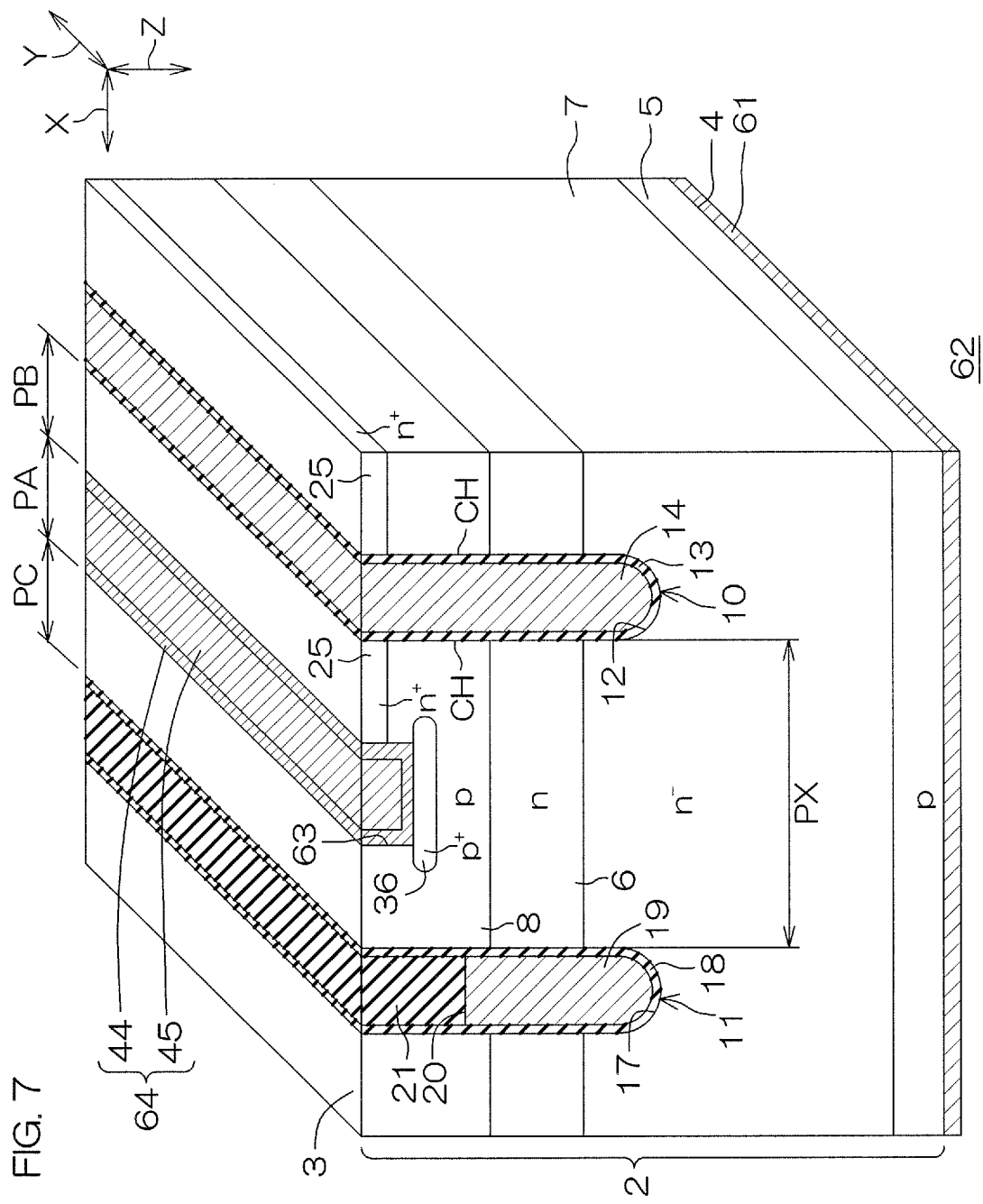
FIG. 7 is a cross-sectional perspective view showing a region of a part of a semiconductor device according to a reference example, in which a structure on a main surface of a semiconductor layer has been removed.

FIG. 7 is a cross-sectional perspective view showing a region of a part of a semiconductor device 62 according to a reference example, in which a structure on the main surface 3 has been removed. In the semiconductor device 62 according to the reference example, the same reference sign is given to a constituent that is equivalent to each constituent of the semiconductor device 1, and a description of this constituent is omitted.

The semiconductor device 62 according to the reference example includes a contact hole 63 and an emitter contact electrode layer 64 instead of the first contact hole 31 and the emitter contact electrode layer 51. The contact hole 63 is formed in the region between the gate trench 12 and the emitter trench 17 in the surface layer portion of the first main surface 3.

The contact hole 63 is formed away from the gate trench 12 and from the emitter trench 17. The contact hole 63 is formed in a band shape extending along the second direction Y in a plan view. The emitter contact electrode layer 64 is embedded in the contact hole 63.

The first-direction width PA of the contact hole 63 exceeds 0.2 µm. The pitch PB between the contact hole 63 and the gate trench 12 exceeds 0.2 µm. The pitch PC between the contact hole 63 and the emitter trench 17 exceeds 0.2 µm. In other words, the trench pitch PX between the gate trench 12 and the emitter trench 17 exceeds 0.6 µm.

The pitch PB and the pitch PC are generally set in consideration of a dimensional tolerance of the emitter contact electrode layer 64. In the semiconductor device 62 according to the reference example, the trench pitch PX is set at a predetermined value that exceeds 0.6 µm in accordance with the dimensional tolerance of the emitter contact electrode layer 64. Therefore, it is hard to set the trench pitch PX such as to be less than 0.6 µm in the semiconductor device 62 according to the reference example.

In other words, narrowing the trench pitch PX is hindered by the dimensional tolerance mentioned above. Therefore, it is hard to raise a hole storage effect between the gate trench 12 and the emitter trench 17. As a result, limitations are imposed on electric characteristics, such as switching speed or withstand voltage.

On the other hand, the semiconductor device 1 has a structure in which the emitter contact electrode layer 51 intersects the gate electrode layer 14 with the gate embedded insulating layer 16 between the emitter contact electrode layer 51 and the gate electrode layer 14 in the surface layer portion of the first main surface 3. Hence, the emitter contact electrode layer 51 is not required to be formed away from the gate electrode layer 14, and therefore it is possible to reduce limitations caused by the dimensional tolerance of the emitter contact electrode layer 51. As a result, it is possible to narrow the trench pitch P0 between the gate trench 12 and the emitter trench 17.

According to the semiconductor device 1, it is possible to realize a trench pitch P0 of not less than 0.2 µm and not more than 0.4 µm (for example, about 0.25 µm). This makes it possible to narrow the pitch of the gate trench 12 and the pitch of the emitter trench 17, hence making it possible to provide the semiconductor device 1 that is capable of contributing to the miniaturization.

Also, it is possible to narrow the pitch of the gate trench 12 and the pitch of the emitter trench 17, hence making it possible to raise the hole storage effect between the gate trench 12 and the emitter trench 17. This makes it possible to obtain electric characteristics shown in FIG. 8 and FIG. 9.

Figure 8:
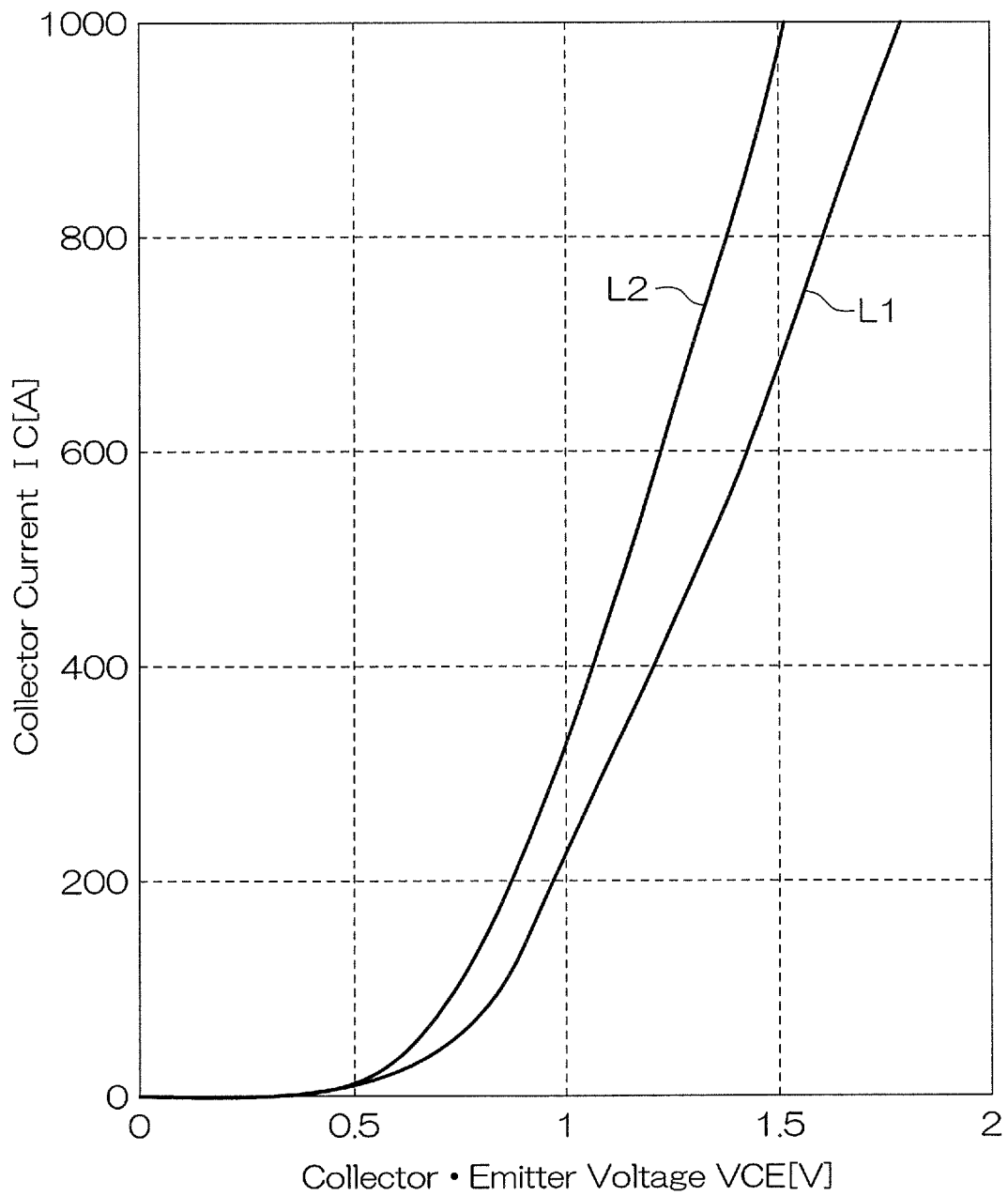
FIG. 8 is a graph of current-voltage characteristics obtained by simulations.

FIG. 8 is a graph of current-voltage characteristics obtained by simulations. In FIG. 8, the ordinate axis represents a collector current IC [A], and the abscissa axis represents a collector-emitter voltage VCE [V].

A first characteristic L1 and a second characteristic L2 are shown in FIG. 8. The first characteristic L1 represents characteristics of the semiconductor device 62 according to the reference example. The second characteristic L2 represents characteristics of the semiconductor device 1. The first characteristic L1 and the second characteristic L2 both represent current-voltage characteristics when the collector-emitter voltage VCE is changed from 0 V to 2 V.

Referring to the first characteristic L1, in the semiconductor device 62 according to the reference example, the collector-emitter voltage VCE was 0.96 V, 1.22 V, 1.42 V, and 1.61 V when the collector current IC was 200 A, 400 A, 600 A, and 800 A, respectively.

Referring to the second characteristic L2, in the semiconductor device 1, the collector-emitter voltage VCE was 0.86 V, 1.06 V, 1.22 V, and 1.37 V when the collector current IC was 200 A, 400 A, 600 A, and 800 A, respectively.

As described above, according to the semiconductor device 1, it is possible to make a collector-emitter voltage VCE necessary for a rising operation smaller than that of the semiconductor device 62 according to reference example, and therefore it has been understood that the switching speed can be raised.

Figure 9:
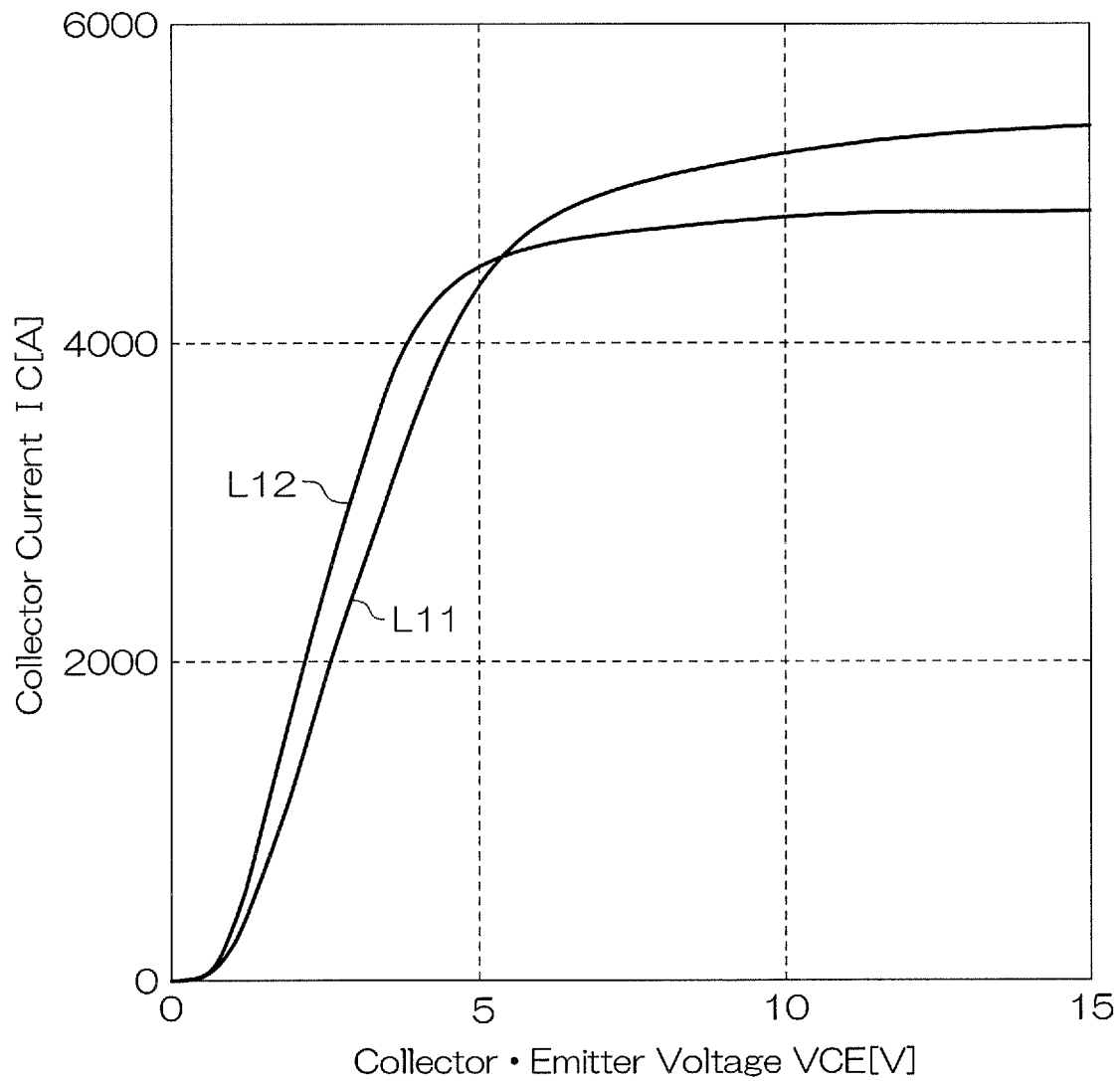
FIG. 9 is a graph of a collector peak current obtained by simulations.

FIG. 9 is a graph of a collector peak current ICP obtained by simulations. In FIG. 9, the ordinate axis represents a collector current IC [A], and the abscissa axis represents a collector-emitter voltage VCE [V].

A first characteristic L11 and a second characteristic L12 are shown in FIG. 9. The first characteristic L11 represents current-voltage characteristics of the semiconductor device 62 according to the reference example. The second characteristic L12 represents current-voltage characteristics of the semiconductor device 1. The first characteristic L11 and the second characteristic L12 both represent characteristics when the collector-emitter voltage VCE is changed from 0 V to 15 V.

Referring to the first characteristic L11, in the semiconductor device 62 according to the reference example, the collector peak current ICP exceeded 5000 Å when the collector-emitter voltage VCE was not less than 10 V and not more than 15 V.

Referring to the second characteristic L12, in the semiconductor device 1, the collector peak current ICP was less than 5000 Å (not less than 4500 Å and less than 5000 Å) when the collector-emitter voltage VCE was not less than 10V and not more than 15V.

As described above, according to the semiconductor device 1, it is possible to make the collector peak current ICP smaller than that of the semiconductor device 62 according to the reference example, and therefore it has been understood that the short-circuit capacity can be raised.

Figure 10A:
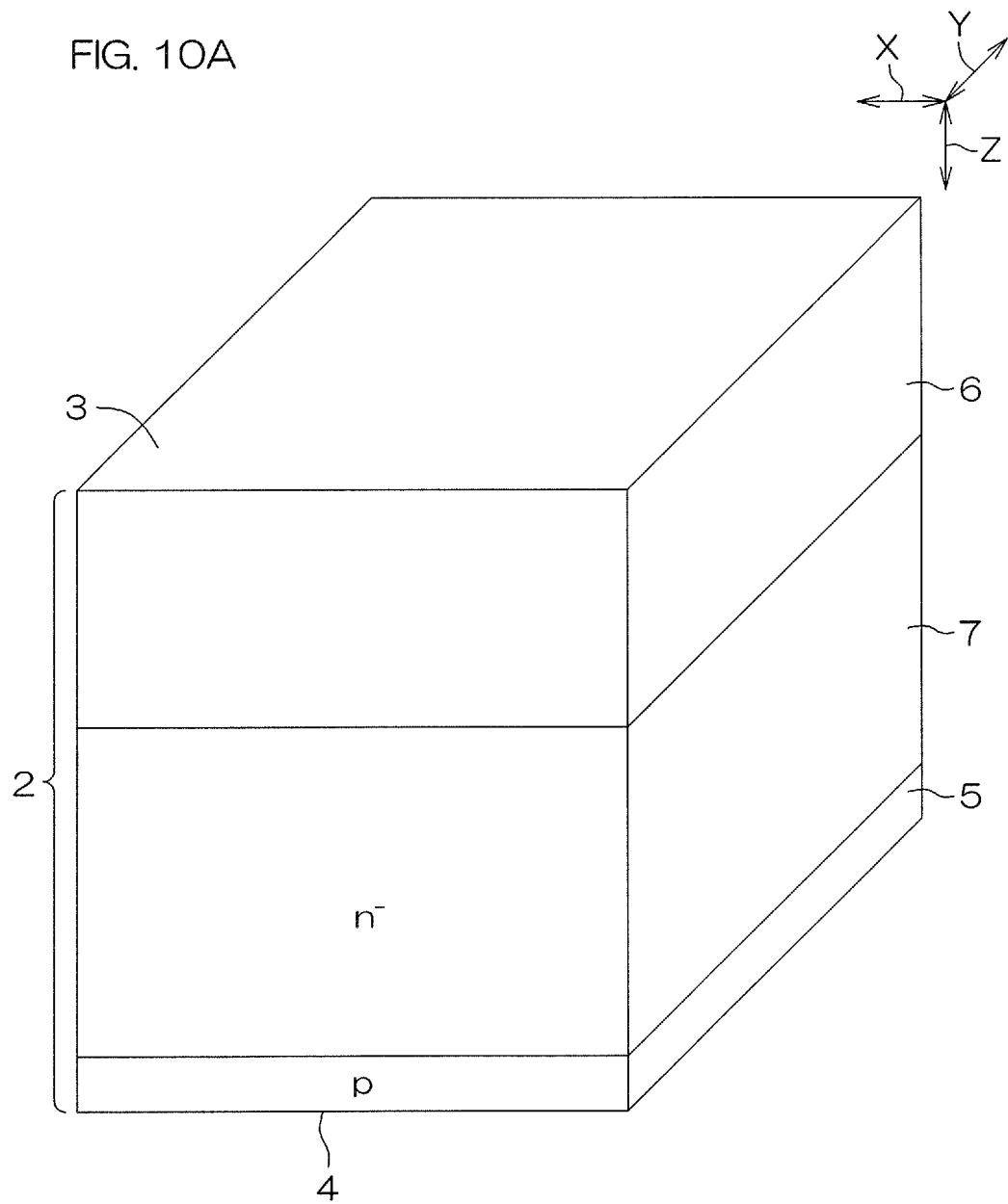
FIG. 10A is a cross-sectional perspective view to describe an example of a method of manufacturing the semiconductor device shown in FIG. 1.
Figure 10B:
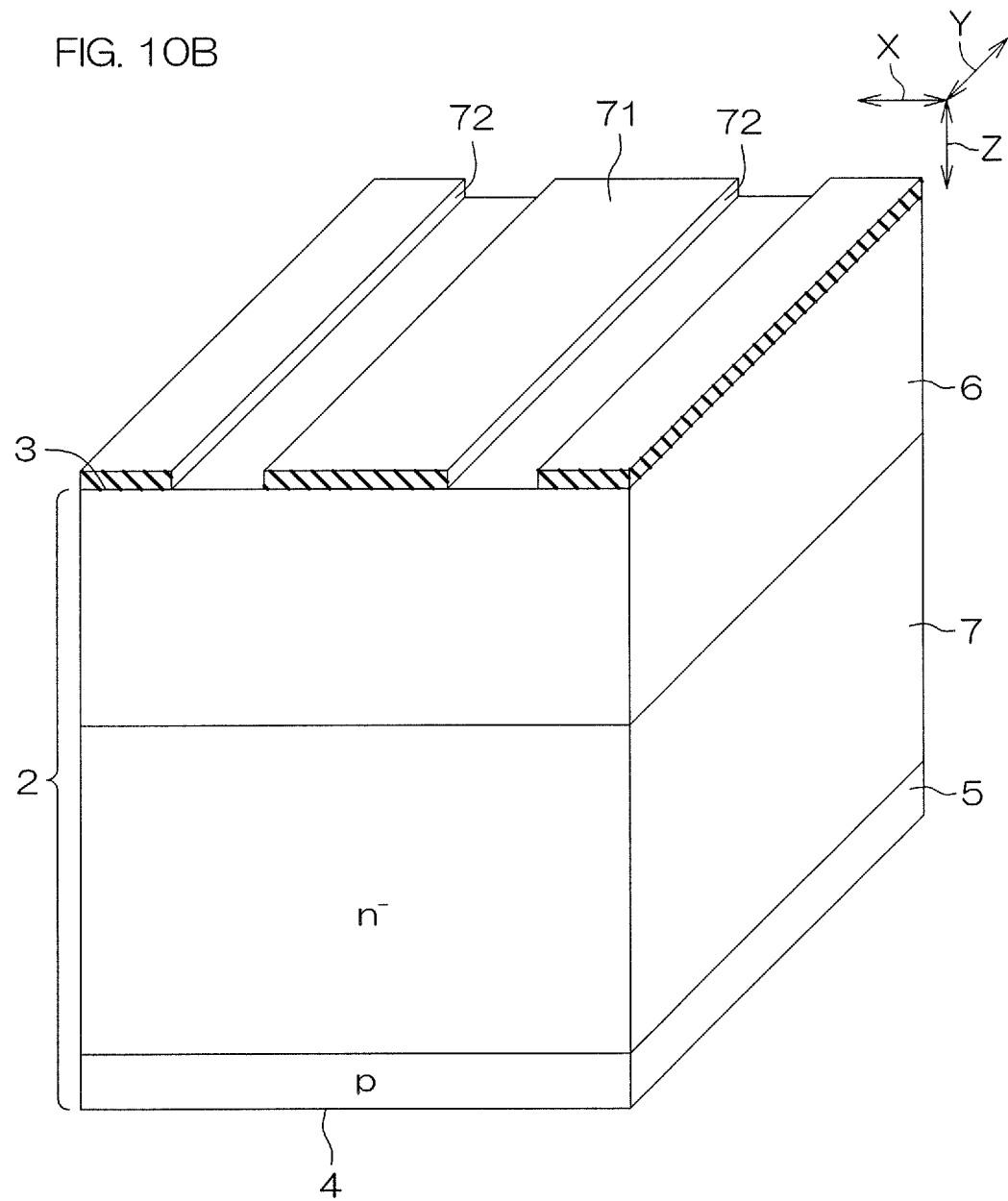
FIG. 10B is a cross-sectional perspective view showing a step subsequent to that of FIG. 10A.
Figure 10C:
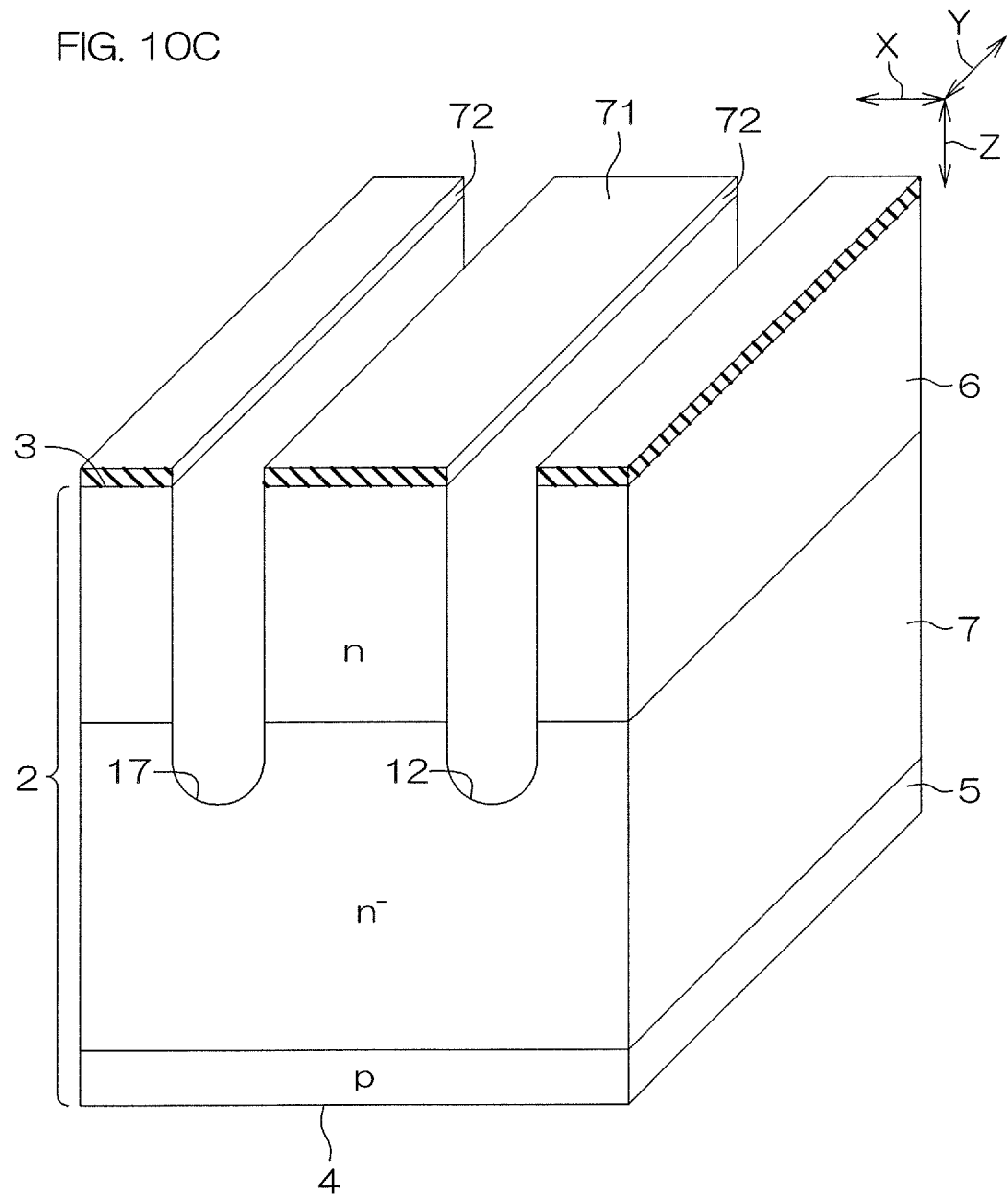
FIG. 10C is a cross-sectional perspective view showing a step subsequent to that of FIG. 10B.
Figure 10D:
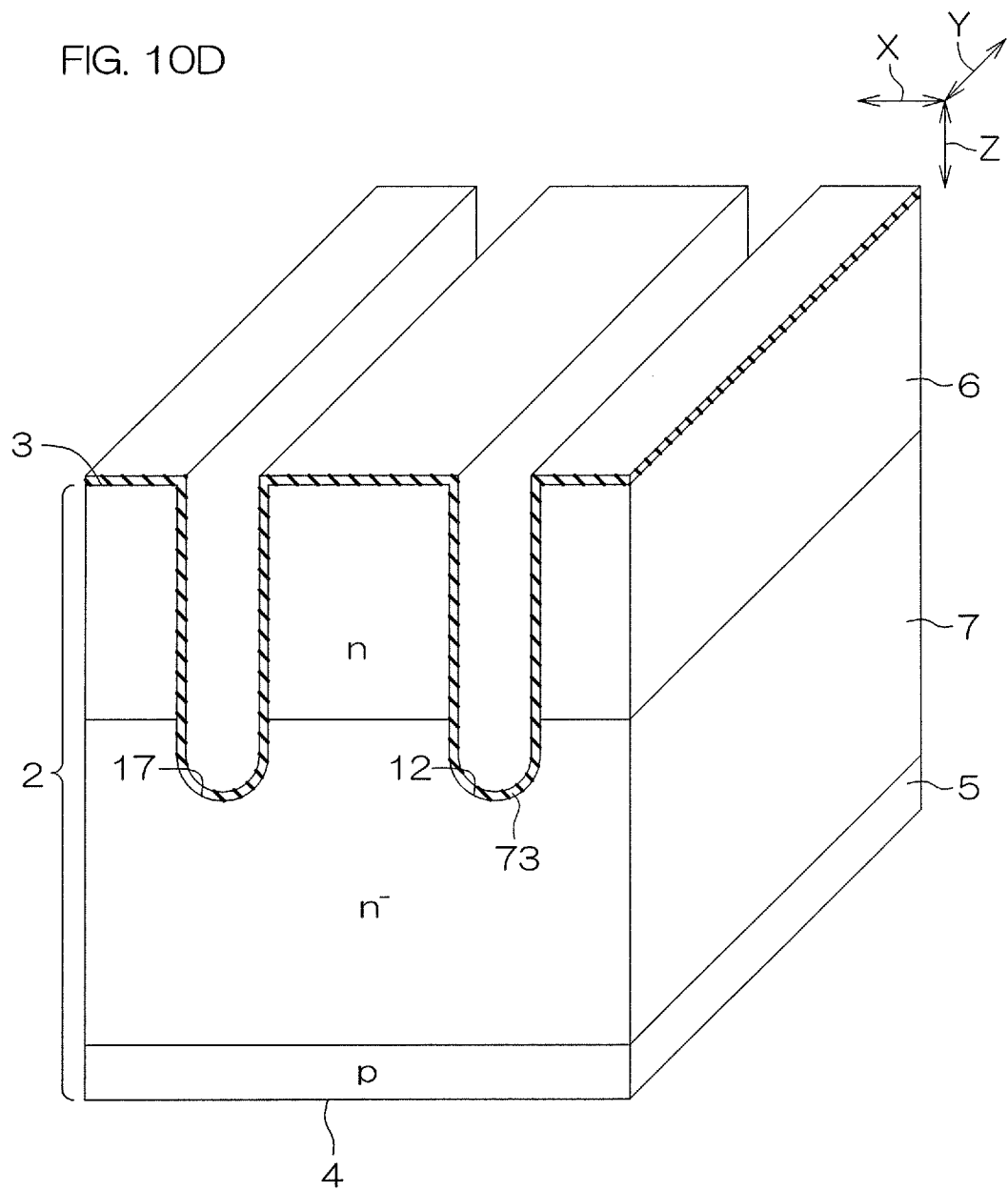
FIG. 10D is a cross-sectional perspective view showing a step subsequent to that of FIG. 10C.
Figure 10E:
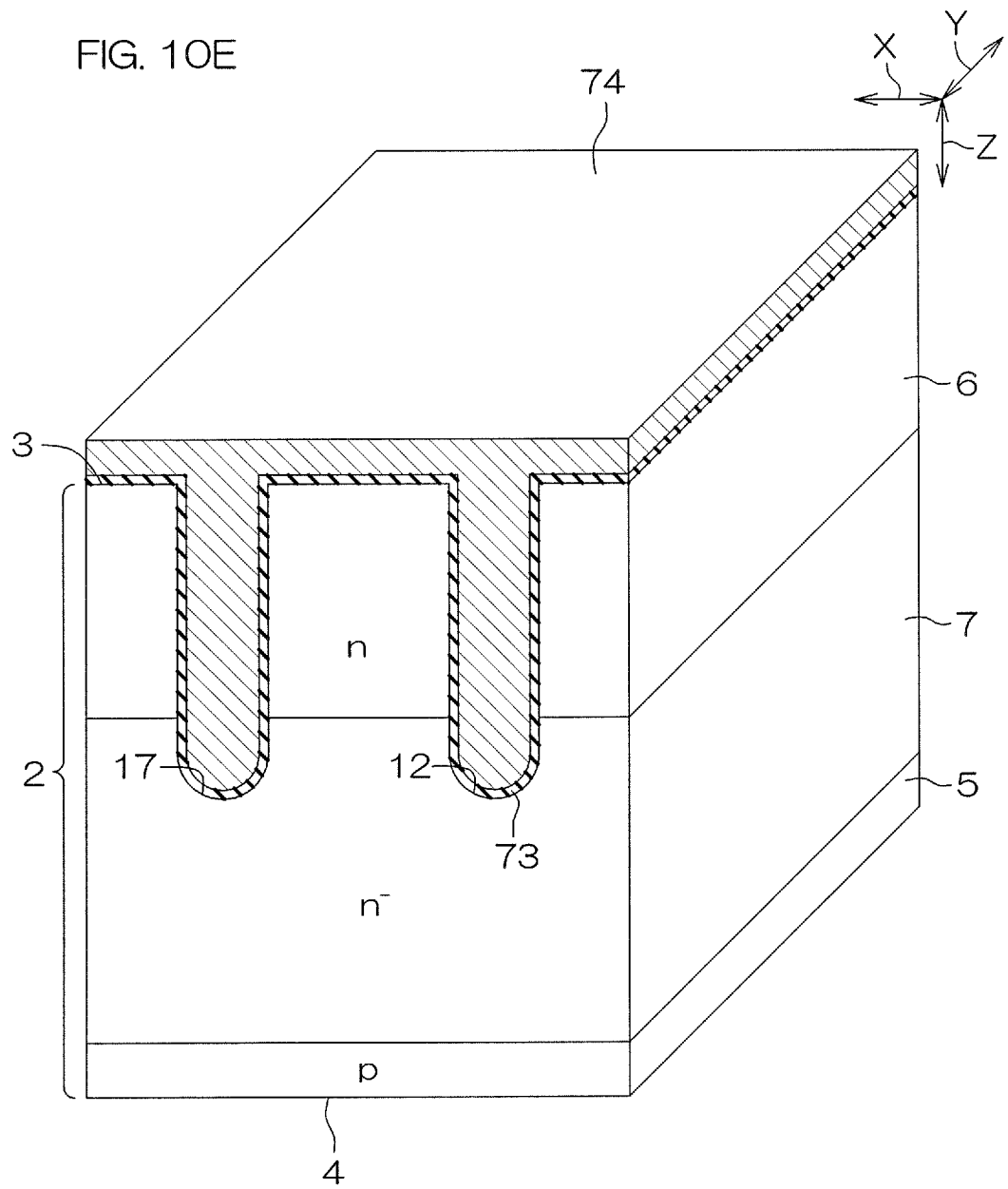
FIG. 10E is a cross-sectional perspective view showing a step subsequent to that of FIG. 10D.
Figure 10F:
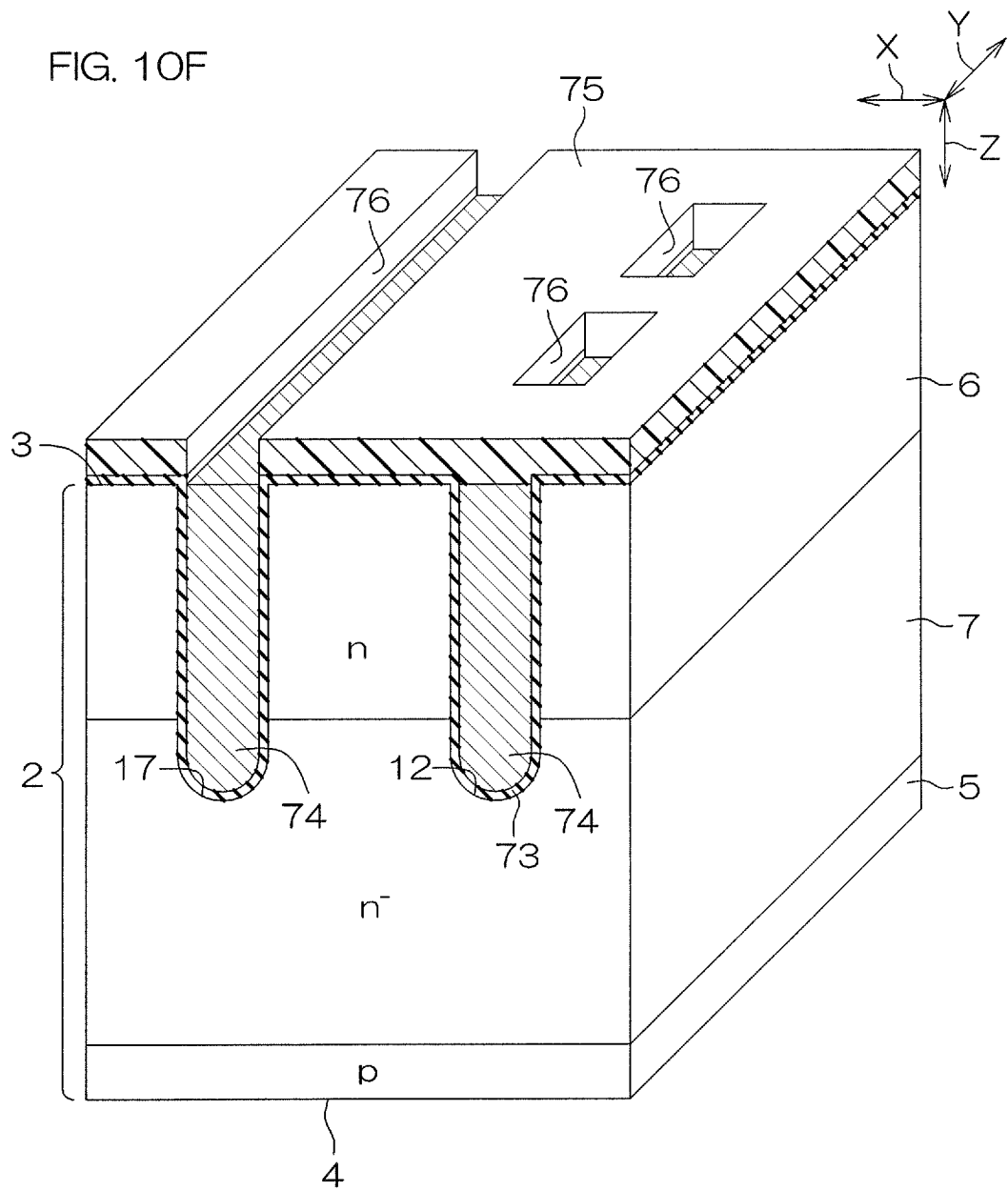
FIG. 10F is a cross-sectional perspective view showing a step subsequent to that of FIG. 10E.
Figure 10H:
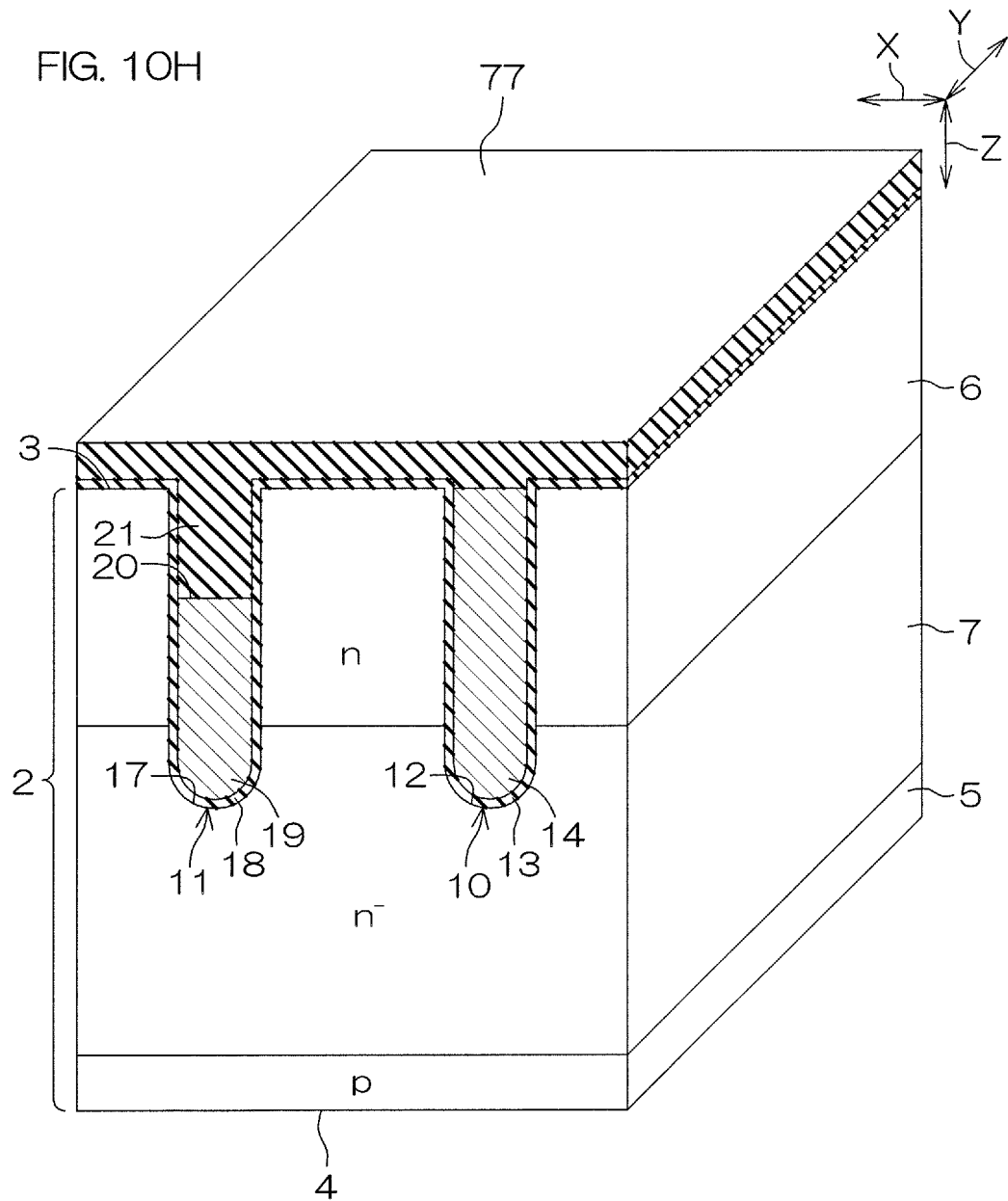
FIG. 10H is a cross-sectional perspective view showing a step subsequent to that of FIG. 10G.
Figure 10:
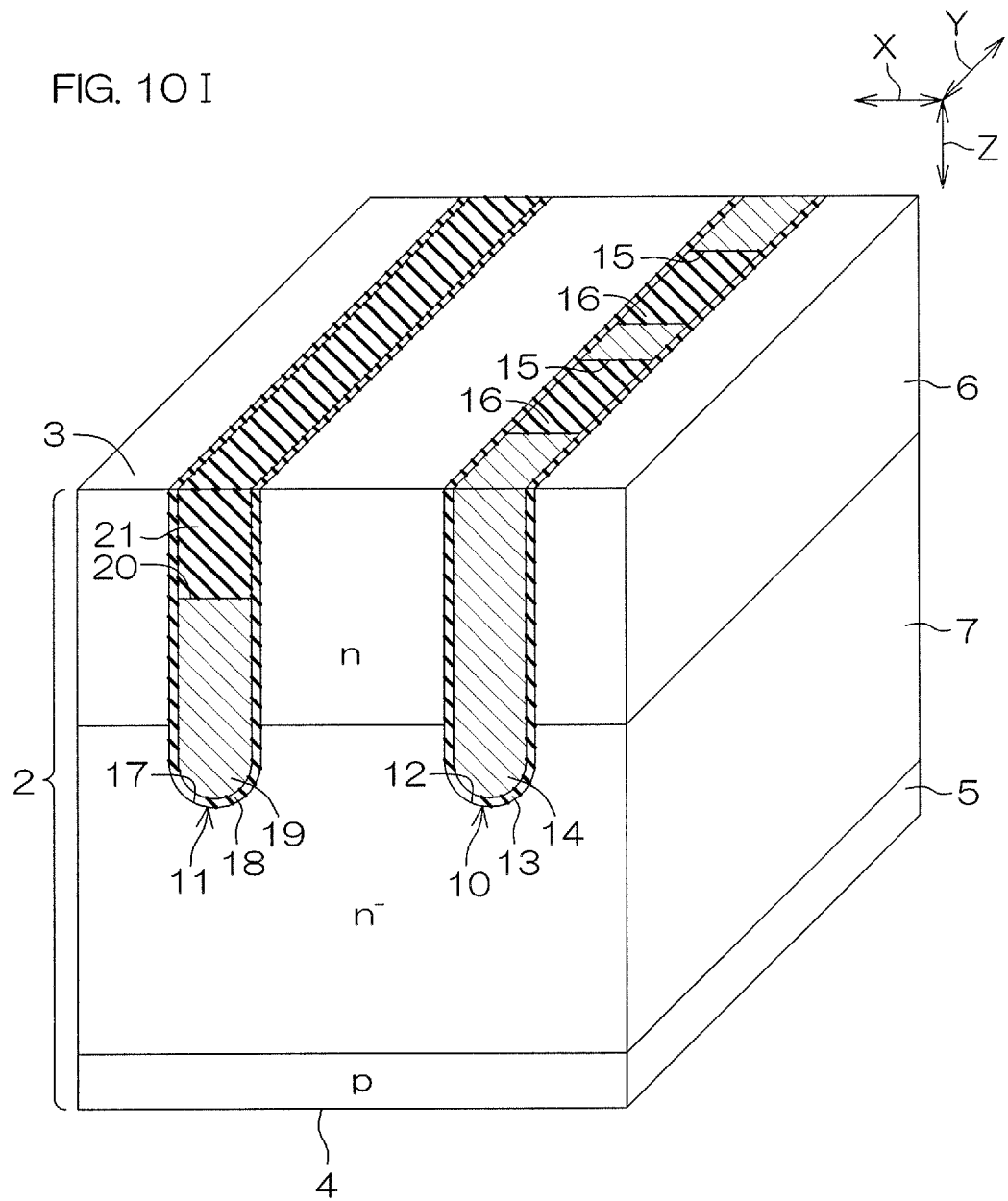
FIG. 10G is a cross-sectional perspective view showing a step subsequent to that of FIG. 10F.
FIG. 10I is a cross-sectional perspective view showing a step subsequent to that of FIG. 10H.
FIG. 10J is a cross-sectional perspective view showing a step subsequent to that of FIG. 10I.
FIG. 10K is a cross-sectional perspective view showing a step subsequent to that of FIG. 10J.
FIG. 10L is a cross-sectional perspective view showing a step subsequent to FIG. 10K.
FIG. 10M is a cross-sectional perspective view showing a step subsequent to that of FIG. 10L.
FIG. 10N is a cross-sectional perspective view showing a step subsequent to that of FIG. 10M.
Figure 10J:
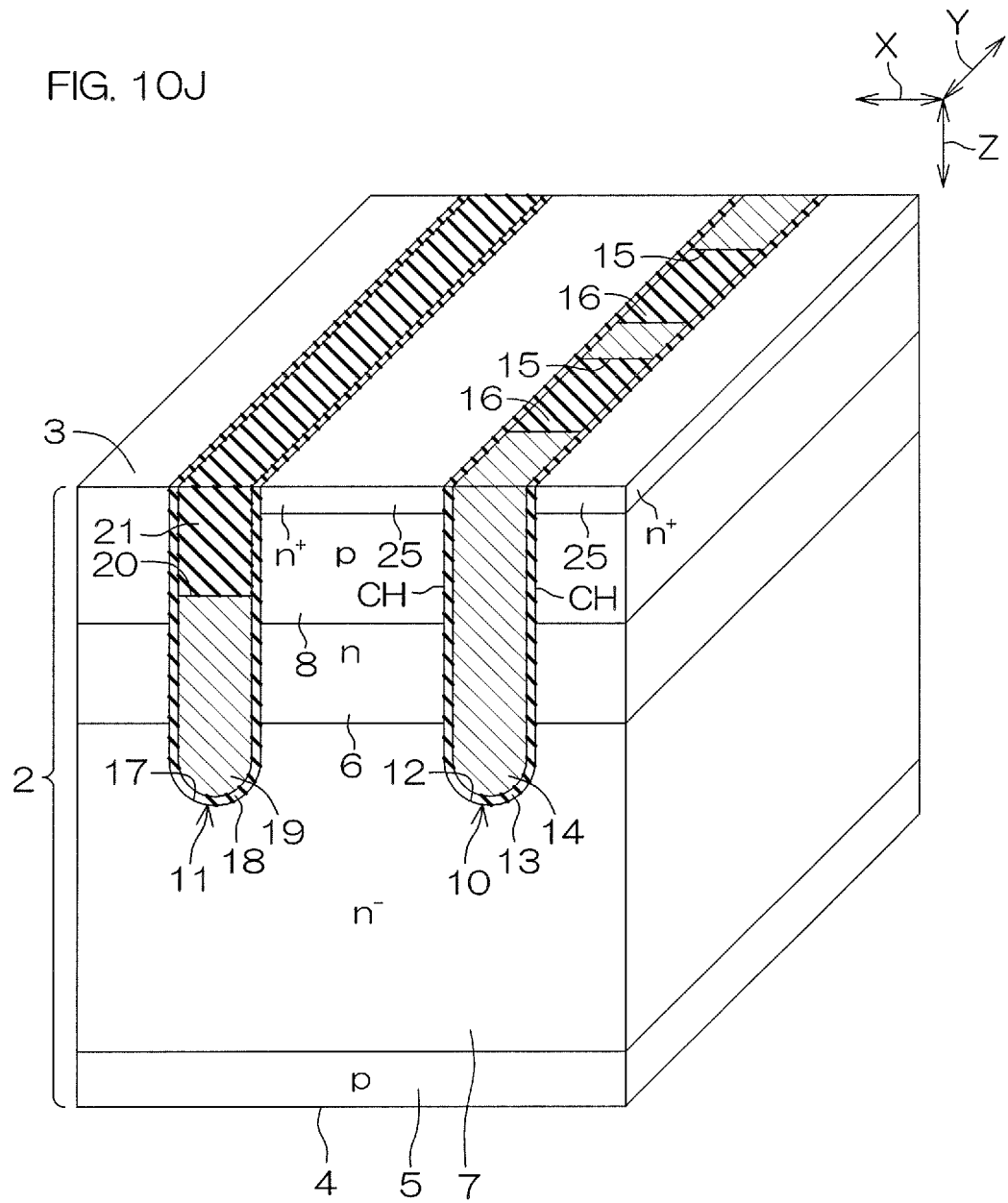
Figure 10K:
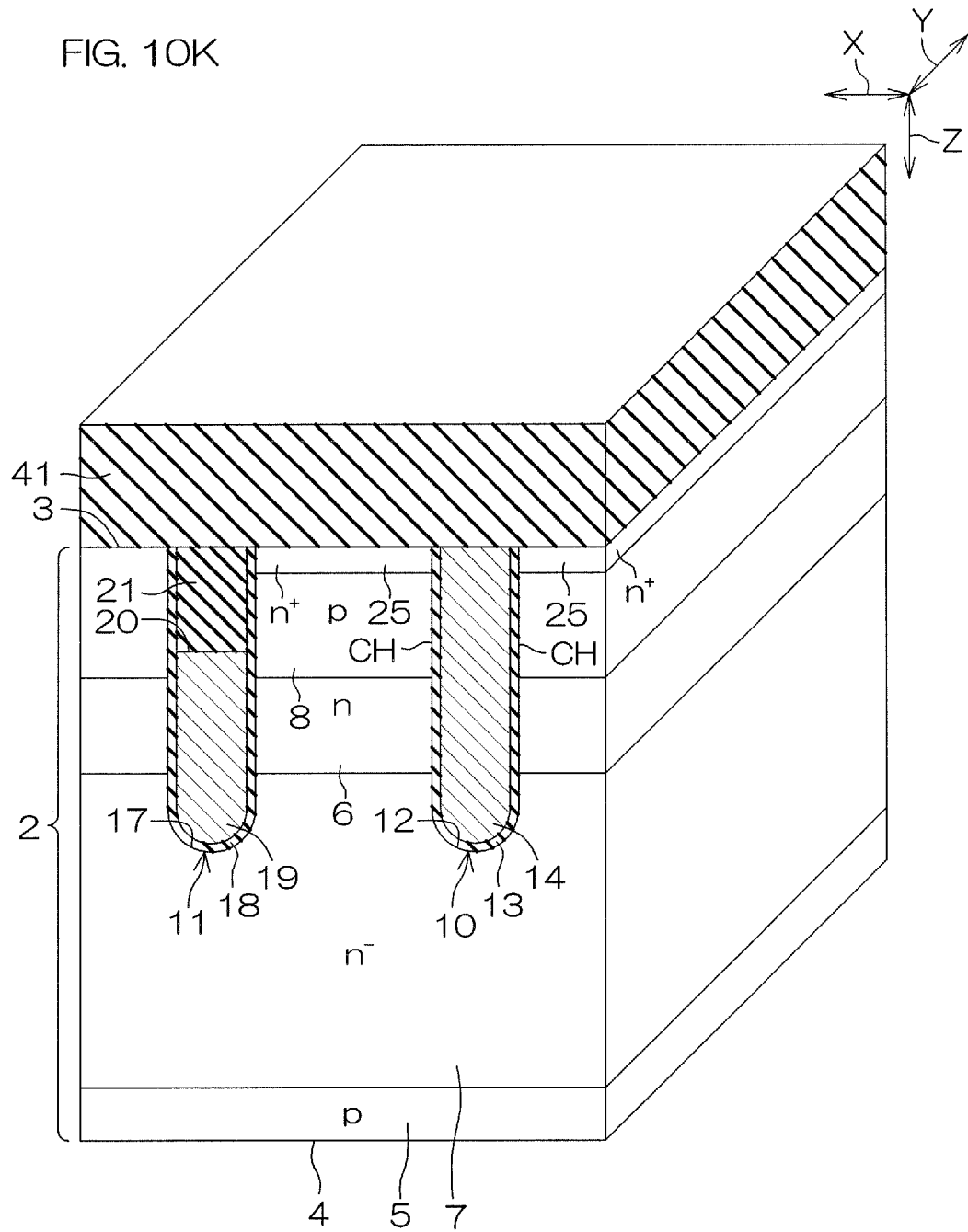
Figure 10L:
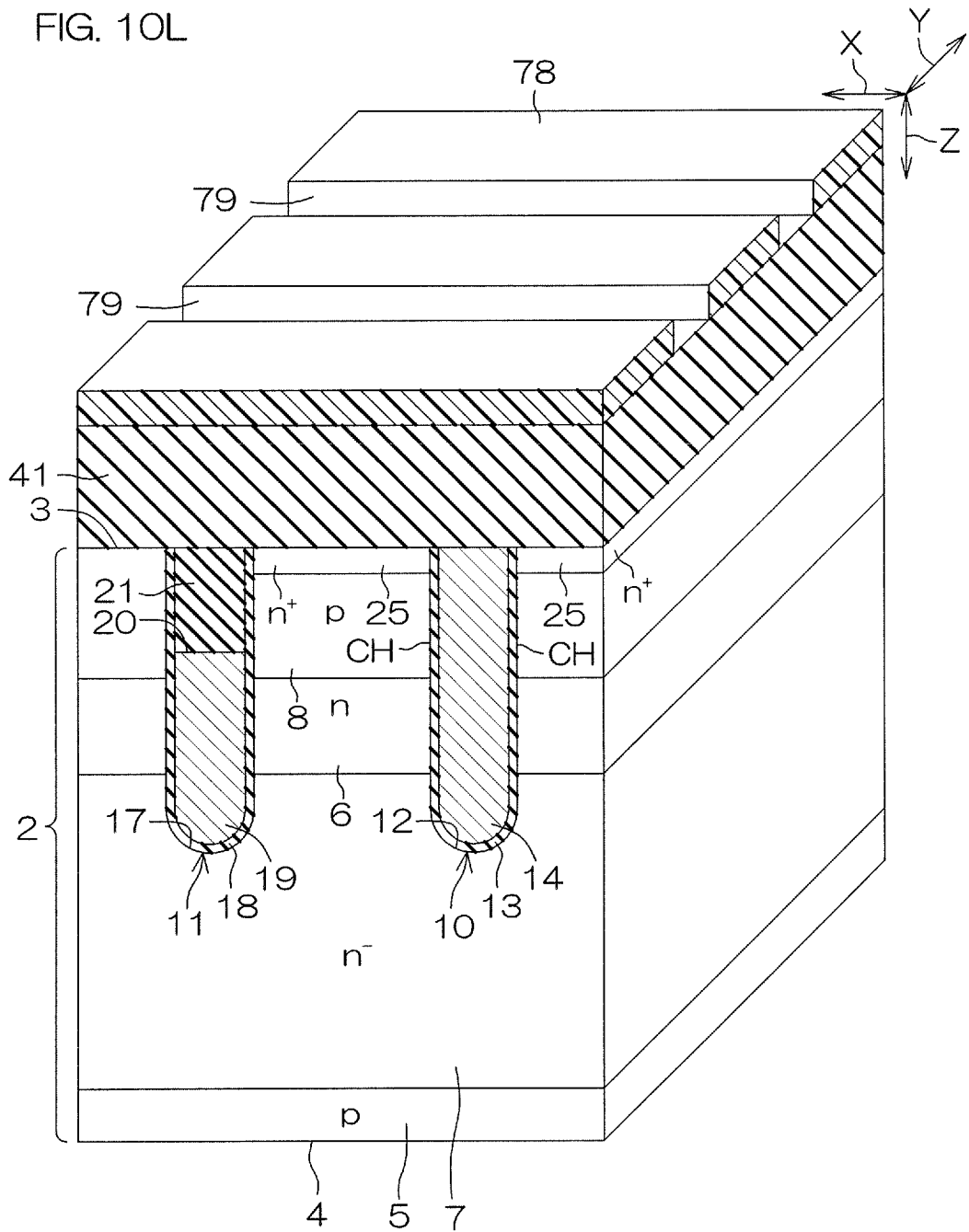
Figure 10N:
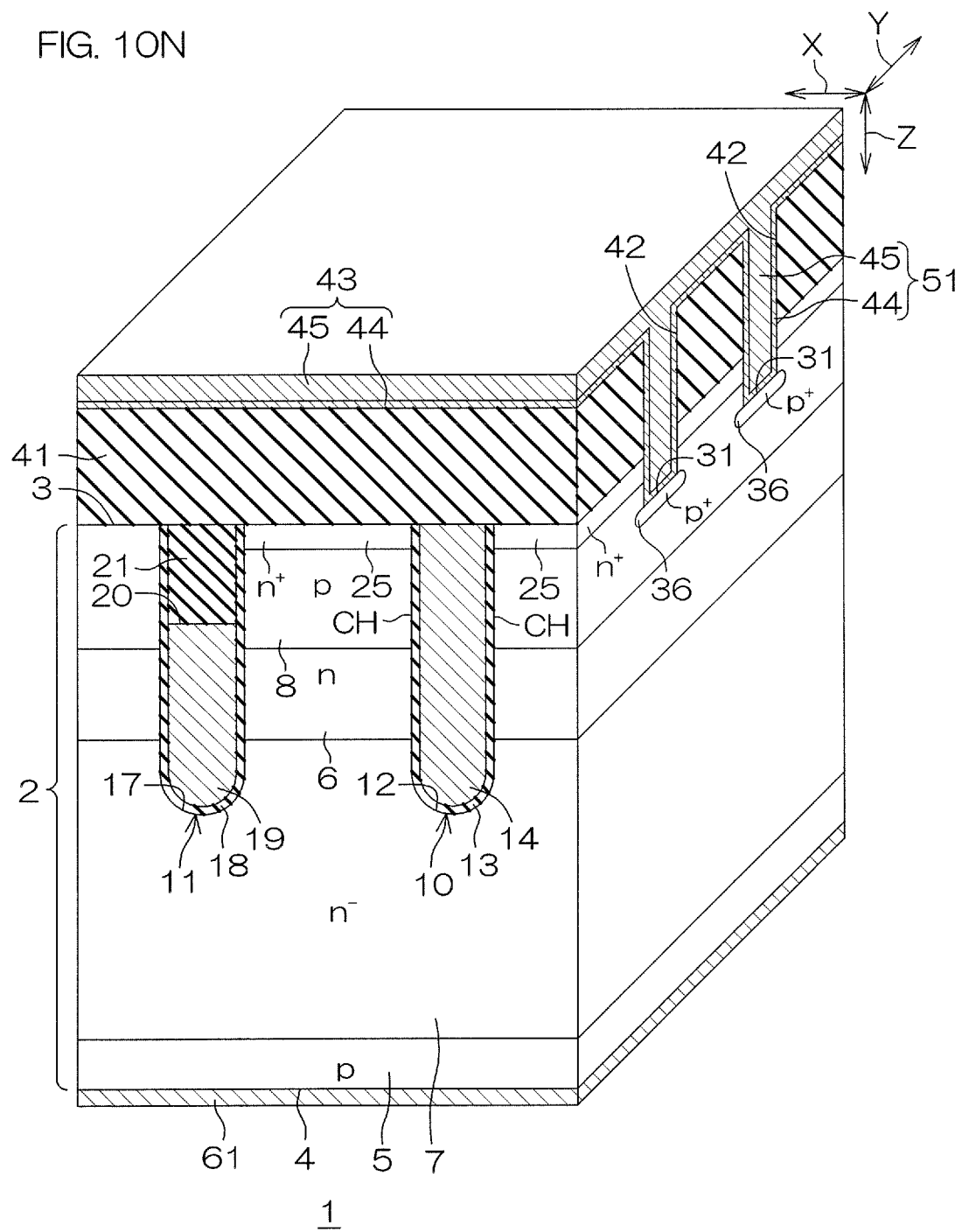

FIG. 10A to FIG. 10N are each a cross-sectional perspective view to describe an example of a method of manufacturing the semiconductor device 1. FIG. 10A to FIG. 10N are each also a cross-sectional perspective view of the part corresponding to FIG. 1.

Referring to FIG. 10A, the n⁻-type semiconductor layer 2 is first prepared. Thereafter, the p-type collector region 5 and the n-type charge storage region 6 are formed in the semiconductor layer 2. The collector region 5 is formed by introducing p-type impurities into the second main surface 4 of the semiconductor layer 2. The collector region 5 may be formed in the surface layer portion of the second main surface 4 of the semiconductor layer 2 by an ion implantation method through an ion implantation mask (not shown).

The charge storage region 6 is formed by introducing n-type impurities into the first main surface 3. The charge storage region 6 may be formed in the surface layer portion of the first main surface 3 by an ion implantation method through an ion implantation mask (not shown).

Thereafter, referring to FIG. 10B, a mask 71 having a predetermined pattern is formed on the first main surface 3. The mask 71 has a plurality of openings 72 by which regions in which the gate trench 12 and the emitter trench 17 are to be formed are exposed.

Thereafter, referring to FIG. 10C, a needless part of the semiconductor layer 2 is removed from the first main surface 3. The needless part of the semiconductor layer 2 may be removed by an etching method (for example, a wet etching method) through the mask 71. Hence, the gate trench 12 and the emitter trench 17 are formed. Thereafter, the mask 71 is removed.

Thereafter, referring to FIG. 10D, a base insulating layer 73 that serves as a base of both the gate insulating layer 13 and the emitter insulating layer 18 is formed such as to cover the first main surface 3. The base insulating layer 73 may be formed by an oxidation treatment method onto the first main surface 3.

The oxidation treatment method may be a thermal oxidation treatment method or a wet oxidation treatment method. The base insulating layer 73 may include silicon oxide. The base insulating layer 73 may be formed by a CVD (chemical vapor deposition) method instead of the oxidation treatment method.

Thereafter, referring to FIG. 10E, a first base conductor layer 74 that serves as a base of both the gate electrode layer 14 and the emitter electrode layer 19 is formed on the first main surface 3. The first base conductor layer 74 may be an electroconductive polysilicon layer. The first base conductor layer 74 may be formed by a CVD method. The CVD method may be an LP-CVD (Low Pressure-CVD) method.

Thereafter, a needless part of the first base conductor layer 74 is removed. The needless part of the first base conductor layer 74 is removed until at least the base insulating layer 73 is exposed. The needless part of the first base conductor layer 74 may be removed by an etching method (for example, a wet etching method).

The needless part of the first base conductor layer 74 may be removed by an etching method (for example, a wet etching method) after a main surface of the first base conductor layer 74 is flattened by a CMP (Chemical Mechanical Polishing) method.

Thereafter, referring to FIG. 10F, a mask 75 having a predetermined pattern is formed on the first main surface 3. The mask 75 has a plurality of openings 76 by which regions in which the gate embedding hole 15 and the emitter embedding hole 20 are to be formed are exposed.

Thereafter, a needless part of the gate electrode layer 14 and a needless part of the emitter electrode layer 19 are removed. The needless part of the gate electrode layer 14 and the needless part of the emitter electrode layer 19 may be removed by an etching method (for example, a wet etching method) through the mask 75. Hence, the gate embedding hole 15 and the emitter embedding hole 20 are formed.

Thereafter, referring to FIG. 10G, the mask 75 is removed. The gate embedding hole 15 and the emitter embedding hole 20 may be individually formed through different masks (not shown). In other words, the gate embedding hole 15 and the emitter embedding hole 20 that have mutually different depths may be formed.

Thereafter, referring to FIG. 10H, a base insulating layer 77 that serves as a base of both the gate embedded insulating layer 16 and the emitter embedded insulating layer 21 is formed on the first main surface 3. The base insulating layer 77 may include silicon oxide. The base insulating layer 77 may be formed by a CVD method. The CVD method may be an LP-CVD method.

Thereafter, referring to FIG. 10I, a needless part of the base insulating layer 77 is removed. The needless part of the base insulating layer 73 may be removed by an etching method (for example, a wet etching method). Hence, the gate embedded insulating layer 16 and the emitter embedded insulating layer 21 are formed.

In this step, the part with which the first main surface 3 is covered in the base insulating layer 73 is also removed. As a result, the gate insulating layer 13 and the emitter insulating layer 18 are formed. Also, as a result, the trench gate electrode structure 10 and the trench emitter electrode structure 11 are formed.

Thereafter, referring to FIG. 10J, the p-type body region 8 and the $n^+$-type emitter region 25 are formed in the semiconductor layer 2. The body region 8 is formed by introducing p-type impurities into the first main surface 3. The body region 8 may be formed in the surface layer portion of the first main surface 3 by an ion implantation method through an ion implantation mask (not shown).

The emitter region 25 is formed by introducing n-type impurities into the first main surface 3. The emitter region 25 may be formed in the surface layer portion of the first main surface 3 by an ion implantation method through an ion implantation mask (not shown).

Thereafter, referring to FIG. 10K, the interlayer insulating layer 41 is formed on the first main surface 3. The interlayer insulating layer 41 is formed on the first main surface 3 such as to cover the trench gate electrode structure 10 and the trench emitter electrode structure 11. This step may include a step of forming a BPSG film (for example, 5000 Å) and a PSG film (for example, 4000 Å) in this order from the top of the first main surface 3 by a CVD method.

Thereafter, referring to FIG. 10L, a mask 78 having a predetermined pattern is formed on the interlayer insulating layer 41. The mask 78 has a plurality of openings 79 by which regions in which the first contact hole 31 and the second contact hole 42 are to be formed are exposed.

Thereafter, referring to FIG. 10M, a needless part of the interlayer insulating layer 41, a needless part of the gate embedded insulating layer 16, and a needless part of the emitter embedded insulating layer 21 are removed. The needless parts of the interlayer insulating layer 41 etc., may be removed by an etching method (for example, a dry etching method) through the mask 78.

Also, in this step, the needless parts of the interlayer insulating layer 41 etc., are removed, and then a needless part of the semiconductor layer 2 is removed. The needless part of the semiconductor layer 2 may be removed by an etching method (for example, a dry etching method) through the mask 78.

Hence, the first contact hole 31 is formed in the first main surface 3. The second contact hole 42 that communicates with the first contact hole 31 is formed in the interlayer insulating layer 41. Thereafter, the mask 78 is removed.

Thereafter, the contact region 36 is formed in the surface layer portion of the first main surface 3. More specifically, the contact region 36 is formed in a region along the bottom wall of the first contact hole 31 in the surface layer portion of the body region 8. The contact region 36 may be formed in a region along the sidewall and the bottom wall of the first contact hole 31.

The contact region 36 is formed by introducing p-type impurities into the first contact hole 31. The contact region 36 may be introduced into the first contact hole 31 by an ion implantation method through an ion implantation mask (not shown). Hence, the contact region 36 along the bottom wall of the first contact hole 31 is formed.

The contact region 36 may be formed by introducing p-type impurities into the first main surface 3 in the step of FIG. 10J. In this case, the contact region 36 may be formed in the surface layer portion of the first main surface 3 by an ion implantation method through an ion implantation mask (not shown). The contact region 36 along the bottom wall of the first contact hole 31 is also formed by this step.

Thereafter, referring to FIG. 10N, the emitter principal-surface electrode layer 43 is formed on the interlayer insulating layer 41. This step includes a step of forming the first electrode layer 44 and the second electrode layer 45 in this order on the interlayer insulating layer 41.

The step of forming the first electrode layer 44 includes a step of forming the titanium layer and the titanium nitride layer in this order on the interlayer insulating layer 41. The titanium layer and the titanium nitride layer may be each formed by a sputtering method or a CVD method. The step of forming the second electrode layer 45 includes a step of forming a tungsten layer on the first electrode layer 44. The tungsten layer may be formed by a CVD method.

Hence, the emitter principal-surface electrode layer 43 is formed on the interlayer insulating layer 41. Thereafter, the emitter contact electrode layer 51 is formed by a part that has entered the first contact hole 31 in the emitter principal-surface electrode layer 43. Also, the collector electrode layer 61 is formed on the second main surface 4 of the semiconductor layer 2. The semiconductor device 1 is formed through these steps mentioned above.

Figure 11:
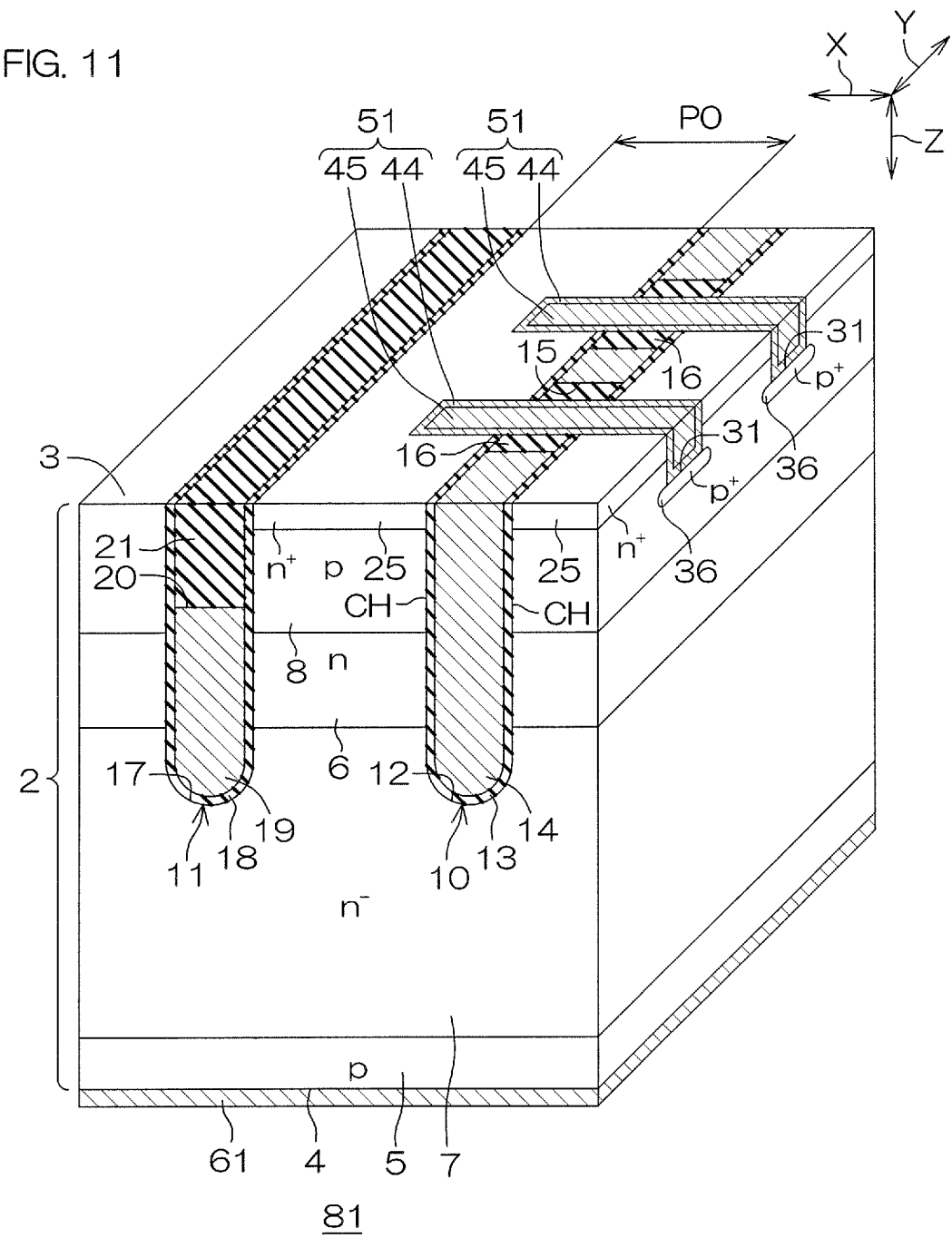
FIG. 11 is a cross-sectional perspective view showing a region of a part of a semiconductor device according to a second preferred embodiment of the present invention, in which a structure on a main surface of a semiconductor layer has been removed.

FIG. 11 is a cross-sectional perspective view showing a region of a part of a semiconductor device 81 according to a second preferred embodiment of the present invention, in which a structure on the first main surface 3 has been removed. Hereinafter, the same reference sign is given to a constituent equivalent to each constituent of the semiconductor device 1 mentioned above, and a description of this constituent is omitted.

Referring to FIG. 11, each of the first contact holes 31 intersects only the gate trench 12 in a plan view in the present preferred embodiment. The drawn portion 32 of each of the first contact holes 31 is formed away from the emitter trench 17. In other words, the drawn portion 32 does not reach the emitter trench 17.

Each of the emitter contact electrode layers 51 intersects only the gate trench 12 in a plan view in the present preferred embodiment. The drawn portion 52 of each of the emitter contact electrode layers 51 is formed away from the emitter trench 17. In other words, the drawn portion 52 does not reach the emitter trench 17.

As described above, the semiconductor device 81 can also fulfill the same effect as the effect mentioned concerning the semiconductor device 1. The semiconductor device 81 can be manufactured only by changing the layout of each mask in the manufacturing method of the semiconductor device 1.

Figure 12:
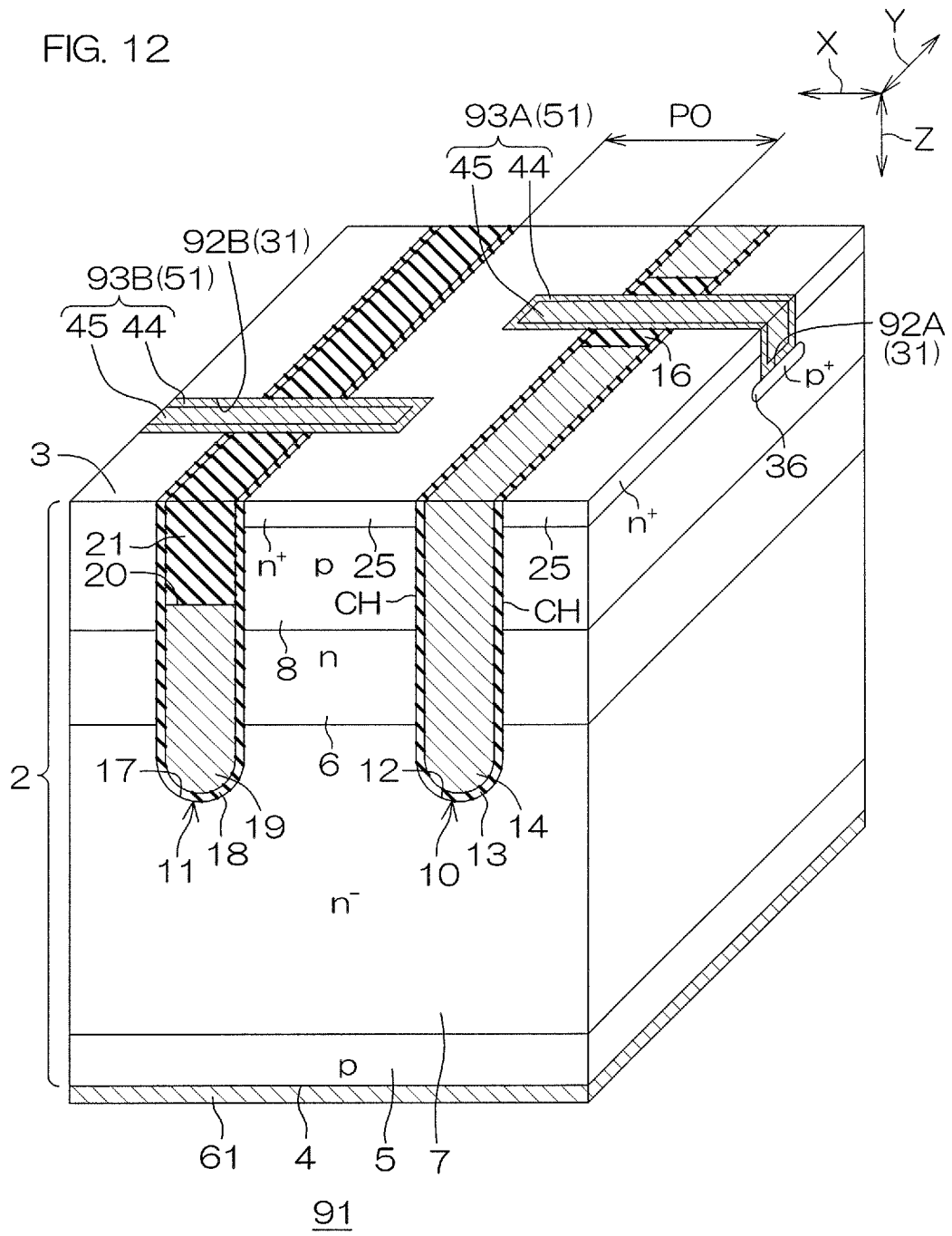
FIG. 12 is a cross-sectional perspective view showing a region of a part of a semiconductor device according to a third preferred embodiment of the present invention, in which a structure on a main surface of a semiconductor layer has been removed.

FIG. 12 is a cross-sectional perspective view showing a region of a part of a semiconductor device 91 according to a third preferred embodiment of the present invention, in which a structure on the first main surface 3 has been removed. Hereinafter, the same reference sign is given to a constituent equivalent to each constituent of the semiconductor device 1 mentioned above, and a description of this constituent is omitted.

Referring to FIG. 12, the first contact holes 31 include a first contact hole 92A and a first contact hole 92B in the present preferred embodiment. The first contact hole 92A intersects only the gate trench 12 in a plan view. The first contact hole 92B intersects only the emitter trench 17 in a plan view.

In the present preferred embodiment, the emitter contact electrode layers 51 include an emitter contact electrode layer 93A and an emitter contact electrode layer 93B. The emitter contact electrode layer 93A is embedded in the first contact hole 92A. The emitter contact electrode layer 93A intersects only the gate trench 12 in a plan view. The emitter contact electrode layer 93B is embedded in the first contact hole 92B. The emitter contact electrode layer 93B intersects only the emitter trench 17 in a plan view.

As described above, the semiconductor device 91 can also fulfill the same effect as the effect mentioned concerning the semiconductor device 1. The semiconductor device 91 can be manufactured only by changing the layout of each mask in the manufacturing method of the semiconductor device 1.

Figure 13:
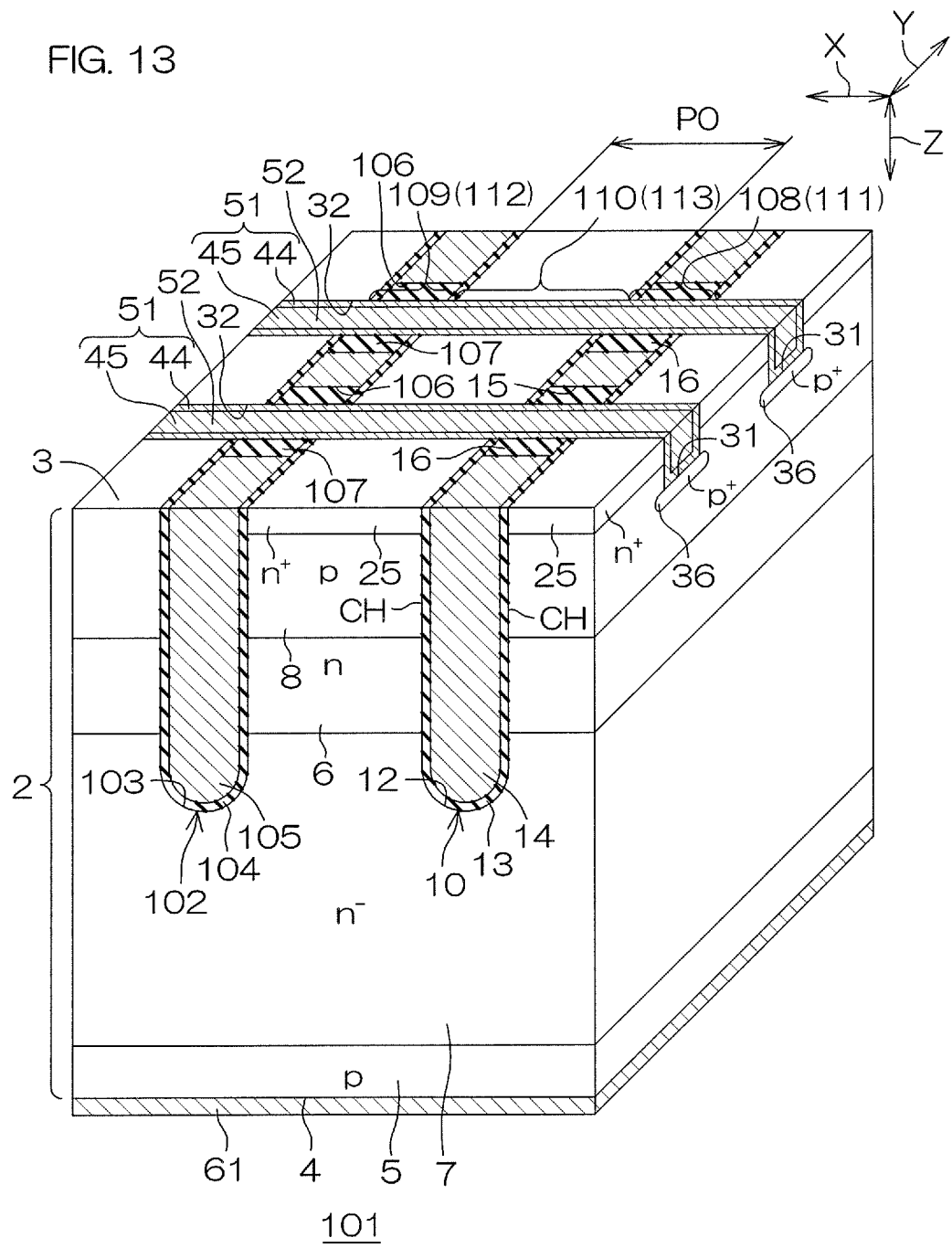
FIG. 13 is a cross-sectional perspective view showing a region of a part of a semiconductor device according to a fourth preferred embodiment of the present invention, in which a structure on a main surface of a semiconductor layer has been removed.

FIG. 13 is a cross-sectional perspective view showing a region of a part of a semiconductor device 101 according to a fourth preferred embodiment of the present invention, in which a structure on the first main surface 3 has been removed. Hereinafter, the same reference sign is given to a constituent equivalent to each constituent of the semiconductor device 1 mentioned above, and a description of this constituent is omitted.

Referring to FIG. 13, the semiconductor device 101 includes a trench emitter electrode structure 102 instead of the trench emitter electrode structure 11 in the present preferred embodiment. The trench emitter electrode structure 102 has the same structure as the trench gate electrode structure 10.

More specifically, the trench emitter electrode structure 102 includes an emitter trench 103, an emitter insulating layer 104, an emitter electrode layer 105, a plurality of emitter embedding holes 106, and a plurality of emitter embedded insulating layers 107.

The emitter trench 103, the emitter insulating layer 104, the emitter electrode layer 105, the emitter embedding hole 106, and the emitter embedded insulating layer 107 have the same structure as the gate trench 12, the gate insulating layer 13, the gate electrode layer 14, the gate embedding hole 15, and the gate embedded insulating layer 16, respectively. A detailed description of the trench emitter electrode structure 102 is omitted.

In the present preferred embodiment, each of the first contact holes 31 has a first intersection region 108 intersecting the gate electrode layer 14 in a plan view. In the first intersection region 108, the sidewall and the bottom wall of each of the first contact holes 31 are defined by the gate embedded insulating layer 16.

Each of the first contact holes 31 has a second intersection region 109 intersecting the emitter electrode layer 105 in a plan view. In the second intersection region 109, the sidewall and the bottom wall of each of the first contact holes 31 are defined by the emitter embedded insulating layer 107.

Each of the first contact holes 31 has a connection region 110 by which the first intersection region 108 and the second intersection region 109 are connected together in the region between the gate trench 12 and the emitter trench 17 in a plan view. In the connection region 110, the sidewall and the bottom wall of each of the first contact holes 31 are defined by the semiconductor layer 2.

The sidewall of each of the first contact holes 31 is formed such as to be flush in the first intersection region 108, the second intersection region 109, and the connection region 110. The bottom wall of each of the first contact holes 31 is formed such as to be flush in the first intersection region 108, the second intersection region 109, and the connection region 110.

In the present preferred embodiment, each of the emitter contact electrode layers 51 has a first intersection region 111 intersecting the gate electrode layer 14 in a plan view. In the first intersection region 111, each of the emitter contact electrode layers 51 faces the gate electrode layer 14 with the gate embedded insulating layer 16 between the emitter contact electrode layer 51 and the gate electrode layer 14 regarding the normal direction Z and the second direction Y. Each of the emitter contact electrode layers 51 is insulated from the gate electrode layer 14 by means of the gate embedded insulating layer 16.

Each of the emitter contact electrode layers 51 has a second intersection region 112 intersecting the emitter electrode layer 105 in a plan view. In the second intersection region 112, each of the emitter contact electrode layers 51 faces the emitter electrode layer 105 with the emitter embedded insulating layer 107 between the emitter contact electrode layer 51 and the emitter electrode layer 105 regarding the normal direction Z and the second direction Y. Each of the emitter contact electrode layers 51 is insulated from the emitter electrode layer 105 by means of the emitter embedded insulating layer 107.

Each of the emitter contact electrode layers 51 has a connection region 113 by which the first intersection region 111 and the second intersection region 112 are connected together in the region between the gate trench 12 and the emitter trench 17 in a plan view. In the connection region 113, each of the emitter contact electrode layers 51 is connected to the body region 8, to the emitter region 25, and to the contact region 36.

As described above, the semiconductor device 101 can also fulfill the same effect as the effect mentioned concerning the semiconductor device 1. The semiconductor device 101 can be manufactured only by changing the layout of each mask in the manufacturing method of the semiconductor device 1.

Figure 14:
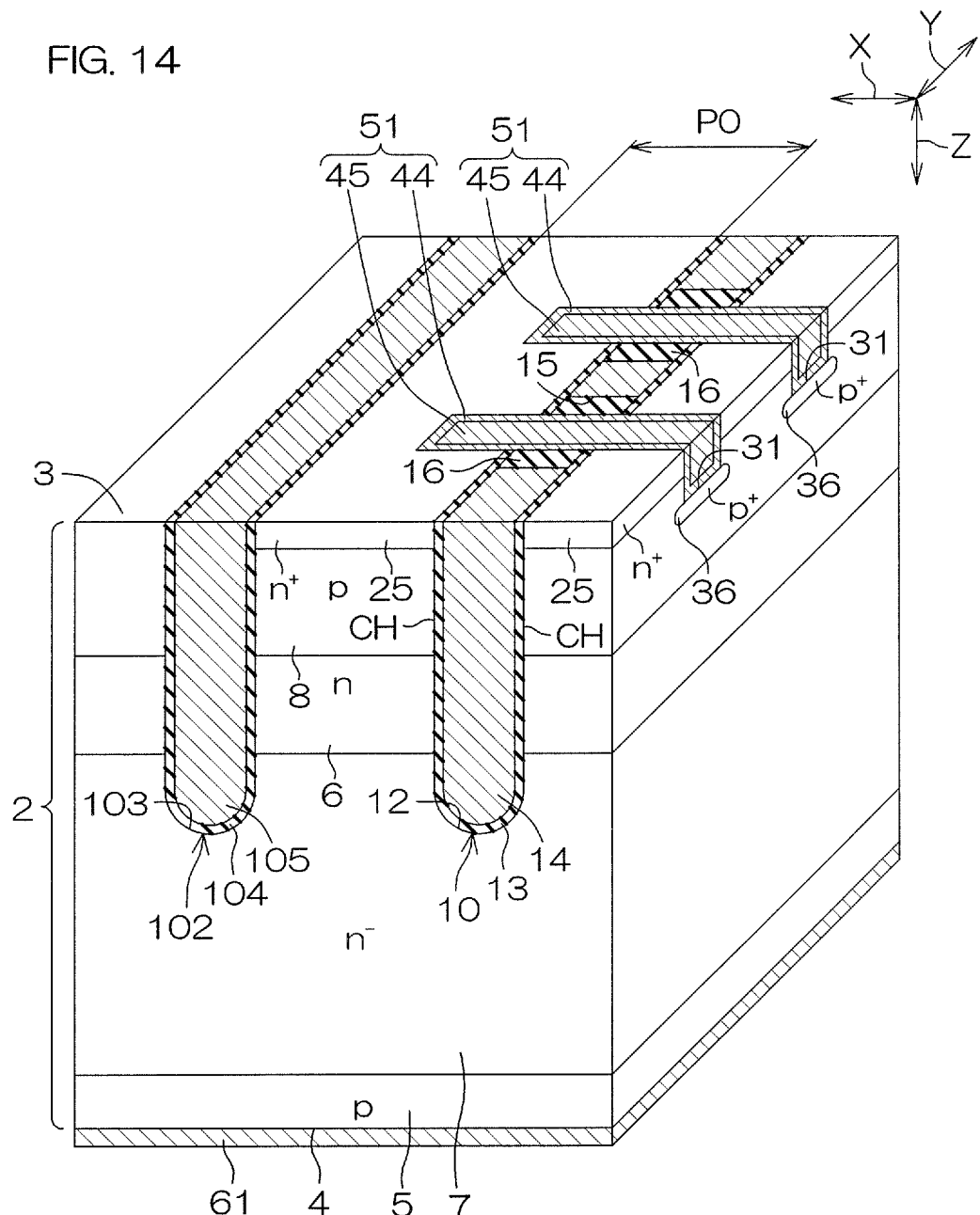
FIG. 14 is a cross-sectional perspective view showing a region of a part of a semiconductor device according to a fifth preferred embodiment of the present invention, in which a structure on a main surface of a semiconductor layer has been removed.

FIG. 14 is a cross-sectional perspective view showing a region of a part of a semiconductor device 121 according to a fifth preferred embodiment of the present invention, in which a structure on the first main surface 3 has been removed. Hereinafter, the same reference sign is given to a constituent equivalent to each constituent of the semiconductor device 101 mentioned above, and a description of this constituent is omitted.

Referring to FIG. 14, each of the first contact holes 31 intersects only the gate trench 12 in a plan view in the present preferred embodiment. The drawn portion 32 of each of the first contact holes 31 is formed away from the emitter trench 17. In other words, the drawn portion 32 does not reach the emitter trench 17.

In the present preferred embodiment, each of the emitter contact electrode layers 51 intersects only the gate trench 12 in a plan view. The drawn portion 52 of each of the emitter contact electrode layers 51 is formed away from the emitter trench 17. In other words, the drawn portion 52 does not reach the emitter trench 17.

In the thus configured embodiment, the trench emitter electrode structure 102 is not necessarily required to include the emitter embedding hole 106 and the emitter embedded insulating layer 107 as shown in FIG. 14.

As described above, the semiconductor device 121 can also fulfill the same effect as the effect mentioned concerning the semiconductor device 1. The semiconductor device 121 can be manufactured only by changing the layout of each mask in the manufacturing method of the semiconductor device 1.

Figure 15:
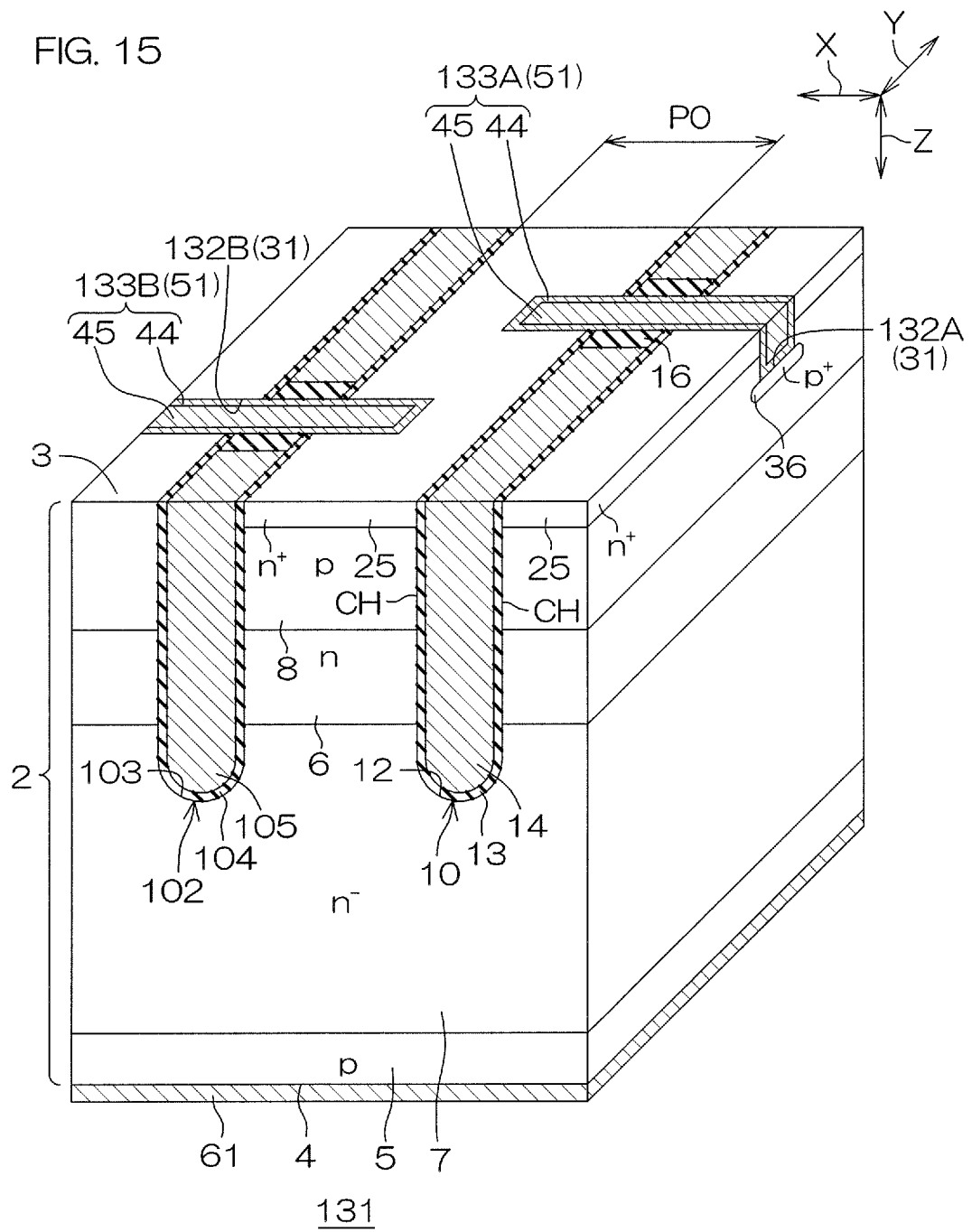
FIG. 15 is a cross-sectional perspective view showing a region of a part of a semiconductor device according to a sixth preferred embodiment of the present invention, in which a structure on a main surface of a semiconductor layer has been removed.

FIG. 15 is a cross-sectional perspective view showing a region of a part of a semiconductor device 131 according to a sixth preferred embodiment of the present invention, in which a structure on the first main surface 3 has been removed. Hereinafter, the same reference sign is given to a constituent equivalent to each constituent of the semiconductor device 101 mentioned above, and a description of this constituent is omitted.

Referring to FIG. 15, the first contact holes 31 include a first contact hole 132A and a first contact hole 132B in the present preferred embodiment. The first contact hole 132A intersects only the gate trench 12 in a plan view. The first contact hole 132B intersects only the emitter trench 17 in a plan view.

In the present preferred embodiment, the emitter contact electrode layers 51 include an emitter contact electrode layer 133A and an emitter contact electrode layer 133B. The emitter contact electrode layer 133A is embedded in the first contact hole 132A. The emitter contact electrode layer 133A intersects only the gate trench 12 in a plan view. The emitter contact electrode layer 133B is embedded in the first contact hole 132B. The emitter contact electrode layer 133B intersects only the emitter trench 17 in a plan view.

As described above, the semiconductor device 131 can also fulfill the same effect as the effect mentioned concerning the semiconductor device 1. The semiconductor device 131 can be manufactured only by changing the layout of each mask in the manufacturing method of the semiconductor device 1.

Figure 16:
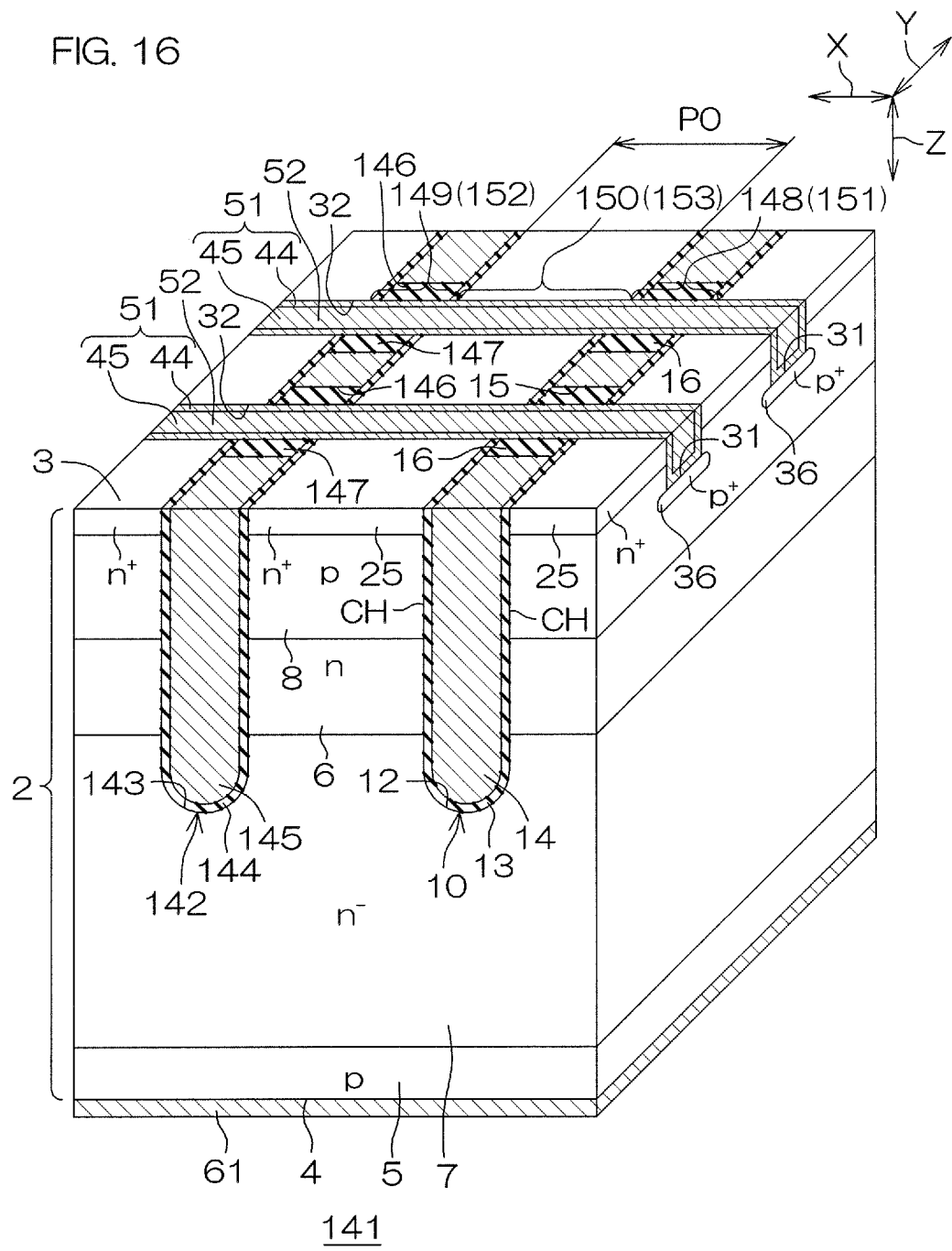
FIG. 16 is a cross-sectional perspective view showing a region of a part of a semiconductor device according to a seventh preferred embodiment of the present invention, in which a structure on a main surface of a semiconductor layer has been removed.

FIG. 16 is a cross-sectional perspective view showing a region of a part of a semiconductor device 141 according to a seventh preferred embodiment of the present invention, in which a structure on the first main surface 3 has been removed. Hereinafter, the same reference sign is given to a constituent equivalent to each constituent of the semiconductor device 1 mentioned above, and a description of this constituent is omitted.

Referring to FIG. 16, the semiconductor device 141 includes a second trench gate electrode structure 142 instead of the trench emitter electrode structure 11 in the present preferred embodiment. The second trench gate electrode structure 142 has the same structure as the trench gate electrode structure 10.

More specifically, the second trench gate electrode structure 142 includes a second gate trench 143, a second gate insulating layer 144, a second gate electrode layer 145, a plurality of second gate embedding holes 146, and a plurality of second gate embedded insulating layers 147. The second gate electrode layer 145 is identical in electric potential with the gate electrode layer 14.

The second gate trench 143, the second gate insulating layer 144, the second gate electrode layer 145, the second gate embedding hole 146, and the second gate embedded insulating layer 147 have the same structure as the gate trench 12, the gate insulating layer 13, the gate electrode layer 14, the gate embedding hole 15, and the gate embedded insulating layer 16, respectively. A detailed description of the second trench gate electrode structure 142 is omitted.

The $n^+$-type emitter region 25 is formed in a region along the sidewall of the second gate trench 143 in the surface layer portion of the body region 8. The emitter regions 25 are formed along the one-side sidewall and the other-side sidewall of the second gate trench 143 regarding the first direction X. The emitter regions 25 are each formed in a band shape extending along the second direction Y.

In the present preferred embodiment, the emitter region 25 formed along the sidewall of the gate trench 12 is formed integrally with the emitter region 25 formed along the sidewall of the second gate trench 143. In other words, the emitter region 25 is shared between the gate trench 12 and the second gate trench 143 in a region between the gate trench 12 and the second gate trench 143.

Each of the first contact holes 31 has a first intersection region 148 intersecting the gate electrode layer 14 in a plan view. In the first intersection region 148, the sidewall and the bottom wall of each of the first contact holes 31 are defined by the gate embedded insulating layer 16.

Each of the first contact holes 31 has a second intersection region 149 intersecting the second gate electrode layer 145 in a plan view. In the second intersection region 149, the sidewall and the bottom wall of each of the first contact holes 31 are defined by the second gate embedded insulating layer 147.

Each of the first contact holes 31 has a connection region 150 by which the first intersection region 148 and the second intersection region 149 are connected together in the region between the gate trench 12 and the second gate trench 143 in a plan view. In the connection region 150, the sidewall and the bottom wall of each of the first contact holes 31 are defined by the semiconductor layer 2.

The sidewall of each of the first contact holes 31 is formed such as to be flush in the first intersection region 148, the second intersection region 149, and the connection region 150. The bottom wall of each of the first contact holes 31 is formed such as to be flush in the first intersection region 148, the second intersection region 149, and the connection region 150.

In the present preferred embodiment, each of the emitter contact electrode layers 51 has a first intersection region 151 intersecting the gate electrode layer 14 in a plan view. In the first intersection region 151, each of the emitter contact electrode layers 51 faces the gate electrode layer 14 with the gate embedded insulating layer 16 between the emitter contact electrode layer 51 and the gate electrode layer 14 regarding the normal direction Z and the second direction Y. Each of the emitter contact electrode layers 51 is insulated from the gate electrode layer 14 by means of the gate embedded insulating layer 16.

Each of the emitter contact electrode layers 51 has a second intersection region 152 intersecting the second gate electrode layer 145 in a plan view. In the second intersection region 152, each of the emitter contact electrode layers 51 faces the second gate electrode layer 145 with the second gate embedded insulating layer 147 between the emitter contact electrode layer 51 and the second gate electrode layer 145 regarding the normal direction Z and the second direction Y. Each of the emitter contact electrode layers 51 is insulated from the second gate electrode layer 145 by means of the second gate embedded insulating layer 147.

Each of the emitter contact electrode layers 51 has a connection region 153 by which the first intersection region 151 and the second intersection region 152 are connected together in the region between the gate trench 12 and the second gate trench 143 in a plan view. In the connection region 153, each of the emitter contact electrode layers 51 is connected to the body region 8, to the emitter region 25, and to the contact region 36.

As described above, the semiconductor device 141 can also fulfill the same effect as the effect mentioned concerning the semiconductor device 1. The semiconductor device 141 can be manufactured only by changing the layout of each mask in the manufacturing method of the semiconductor device 1.

Figure 17:
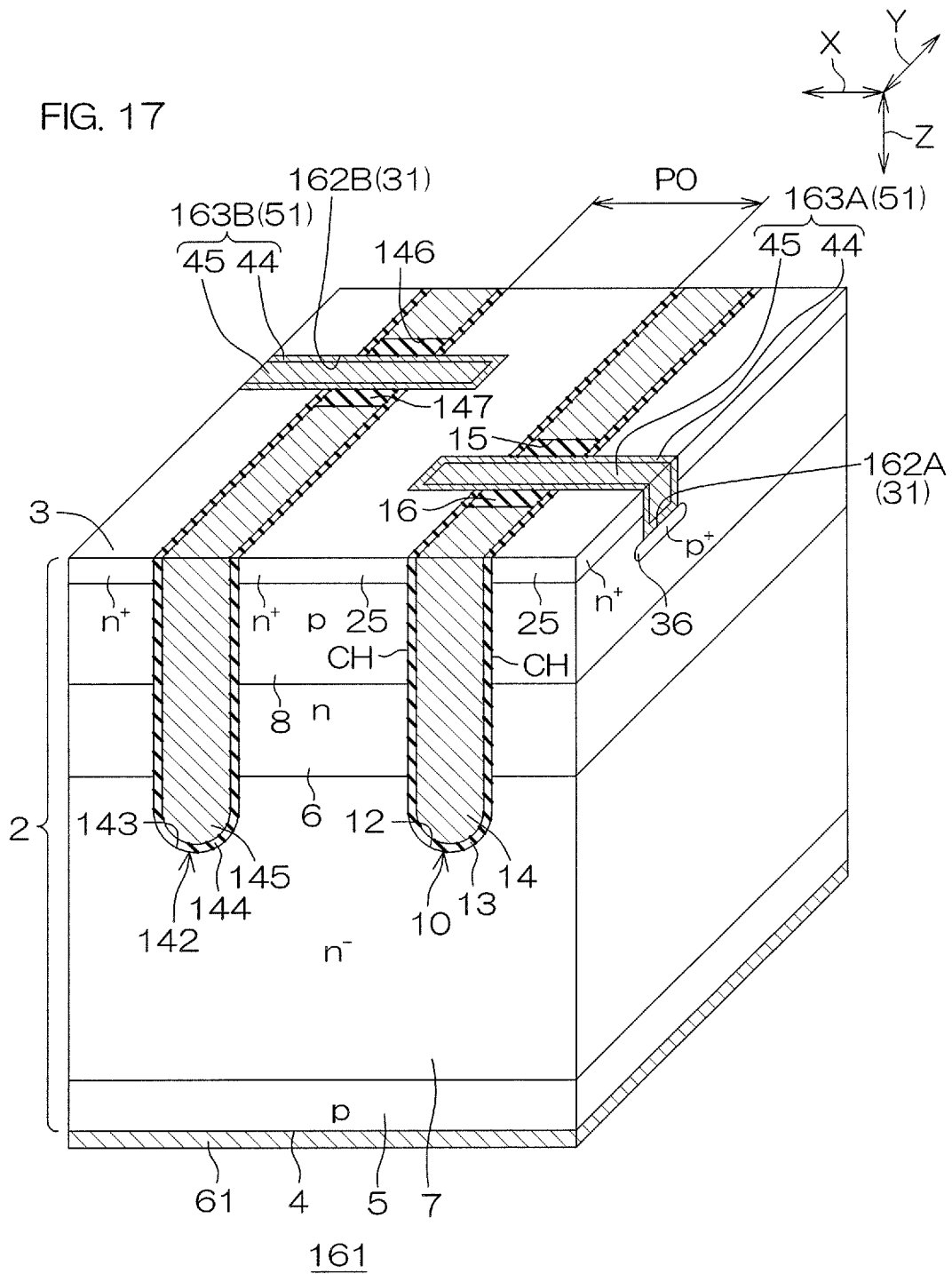
FIG. 17 is a cross-sectional perspective view showing a region of a part of a semiconductor device according to an eighth preferred embodiment of the present invention, in which a structure on a main surface of a semiconductor layer has been removed.

FIG. 17 is a cross-sectional perspective view showing a region of a part of a semiconductor device 161 according to an eighth preferred embodiment of the present invention, in which a structure on the first main surface 3 has been removed. Hereinafter, the same reference sign is given to a constituent equivalent to each constituent of the semiconductor device 141 mentioned above, and a description of this constituent is omitted.

Referring to FIG. 17, the first contact holes 31 include a first contact hole 162A and a first contact hole 162B in the present preferred embodiment. The first contact hole 162A intersects only the gate trench 12 in a plan view. The first contact hole 162B intersects only the second gate trench 143 in a plan view.

In the present preferred embodiment, the emitter contact electrode layers 51 include an emitter contact electrode layer 163A and an emitter contact electrode layer 163B. The emitter contact electrode layer 163A is embedded in the first contact hole 162A. The emitter contact electrode layer 163A intersects only the gate trench 12 in a plan view. The emitter contact electrode layer 163B is embedded in the first contact hole 162B. The emitter contact electrode layer 163B intersects only the second gate trench 143 in a plan view.

As described above, the semiconductor device 161 can also fulfill the same effect as the effect mentioned concerning the semiconductor device 1. The semiconductor device 161 can be manufactured only by changing the layout of each mask in the manufacturing method of the semiconductor device 1.

Figure 18:
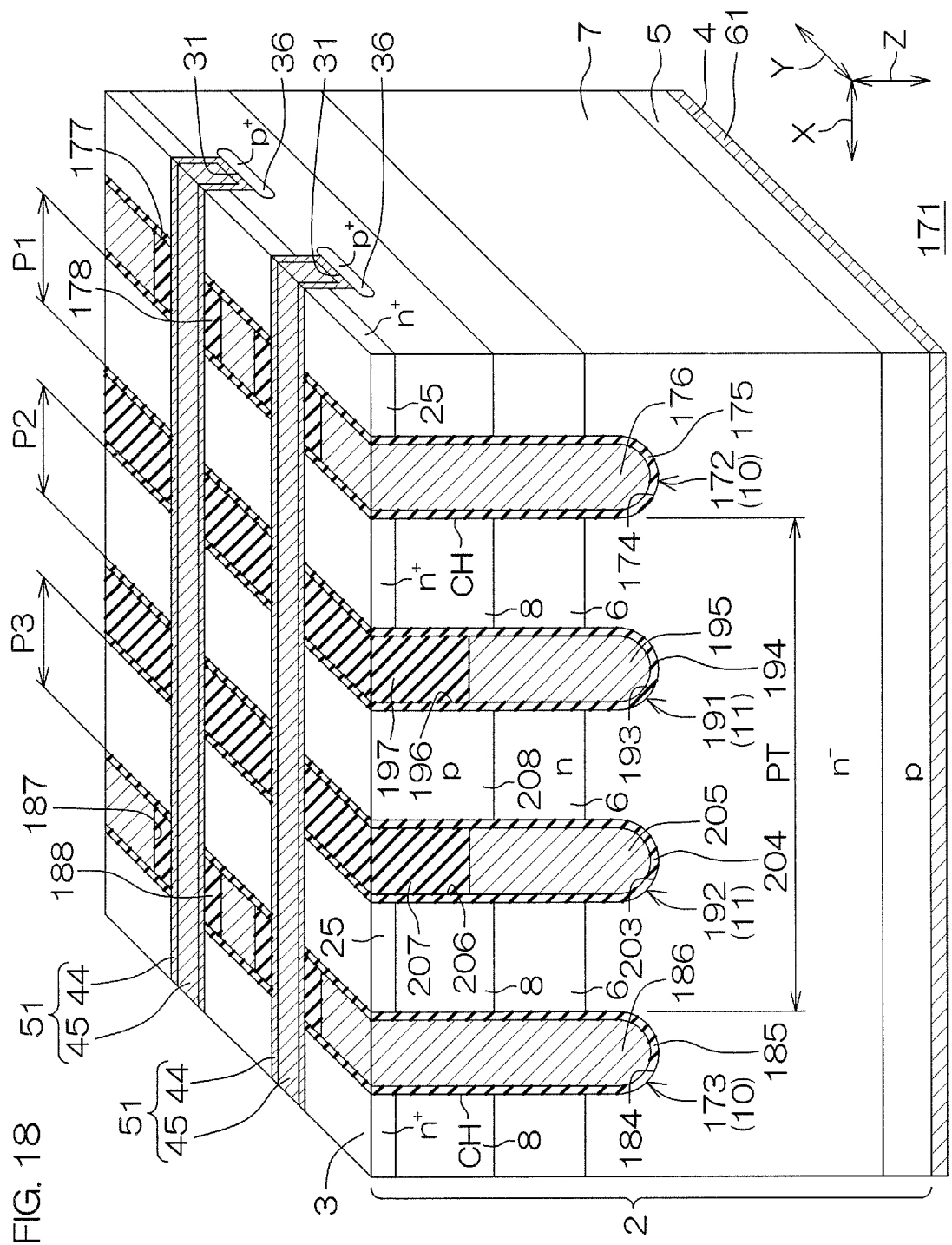
FIG. 18 is a cross-sectional perspective view showing a region of a part of a semiconductor device according to a ninth preferred embodiment of the present invention, in which a structure on a main surface of a semiconductor layer has been removed.

FIG. 18 is a cross-sectional perspective view showing a region of a part of a semiconductor device 171 according to a ninth preferred embodiment of the present invention, in which a structure on the first main surface 3 has been removed. Hereinafter, the same reference sign is given to a constituent equivalent to each constituent of the semiconductor device 1 mentioned above, and a description of this constituent is omitted.

Referring to FIG. 18, the trench gate electrode structures 10 are formed at the surface layer portion of the first main surface 3 in the present preferred embodiment. In the present preferred embodiment, the trench gate electrode structures 10 include a first trench gate electrode structure 172 and a second trench gate electrode structure 173 that are formed with an interval between these electrode structures.

The first trench gate electrode structure 172 and the second trench gate electrode structure 173 are formed with an interval therebetween along the first direction X. The first trench gate electrode structure 172 and the second trench gate electrode structure 173 extend in a band shape along the second direction Y in a plan view.

The trench pitch PT between the first trench gate electrode structure 172 and the second trench gate electrode structure 173 may be not less than 1.6 μm and not more than 4.8 μm. The trench pitch PT may be not less than 1.6 μm and not more than 2.4 μm, not less than 2.4 μm and not more than 3.2 μm, not less than 3.2 μm and not more than 4.0 μm, or not less than 4.0 μm and not more than 4.8 μm. Preferably, the trench pitch PT is not less than 1.5 μm and not more than 3.0 μm (for example, about 2.25 μm).

The first trench gate electrode structure 172 includes a first gate trench 174, a first gate insulating layer 175, a first gate electrode layer 176, a plurality of first gate embedding holes 177, and a plurality of first gate embedded insulating layers 178.

The first gate trench 174, the first gate insulating layer 175, the first gate electrode layer 176, the first gate embedding hole 177, and the first gate embedded insulating layer 178 have the same structure as the gate trench 12, the gate insulating layer 13, the gate electrode layer 14, the gate embedding hole 15, and the gate embedded insulating layer 16 according to the first preferred embodiment, respectively. A detailed description of the first trench gate electrode structure 172 is omitted.

The second trench gate electrode structure 173 includes a second gate trench 184, a second gate insulating layer 185, a second gate electrode layer 186, a plurality of second gate embedding holes 187, and a plurality of second gate embedded insulating layers 188.

The second gate trench 184, the second gate insulating layer 185, the second gate electrode layer 186, the second gate embedding hole 187, and the second gate embedded insulating layer 188 have the same structure as the gate trench 12, the gate insulating layer 13, the gate electrode layer 14, the gate embedding hole 15, and the gate embedded insulating layer 16 according to the first preferred embodiment, respectively. A detailed description of the second trench gate electrode structure 173 is omitted.

A plurality of (two or more) trench emitter electrode structures 11 are formed in a region between the first trench gate electrode structure 172 and the second trench gate electrode structure 173 in the surface layer portion of the first main surface 3. In the present preferred embodiment, the trench emitter electrode structures 11 include a first trench emitter electrode structure 191 and a second trench emitter electrode structure 192 that are formed with an interval therebetween.

Only one trench emitter electrode structure may be formed in the region between the first trench gate electrode structure 172 and the second trench gate electrode structure 173. Also, four or more trench emitter electrode structures 11 may be formed in the region between the first trench gate electrode structure 172 and the second trench gate electrode structure 173.

The first trench emitter electrode structure 191 and the second trench emitter electrode structure 192 are formed with an interval therebetween along the first direction X. The first trench emitter electrode structure 191 and the second trench emitter electrode structure 192 extend in a band shape along the second direction Y in a plan view.

The first trench emitter electrode structure 191 includes a first emitter trench 193, a first emitter insulating layer 194, a first emitter electrode layer 195, a first emitter embedding hole 196, and a first emitter embedded insulating layer 197.

The first emitter trench 193, the first emitter insulating layer 194, the first emitter electrode layer 195, the first emitter embedding hole 196, and the first emitter embedded insulating layer 197 have the same structure as the emitter trench 17, the emitter insulating layer 18, the emitter electrode layer 19, the emitter embedding hole 20, and the emitter embedded insulating layer 21 according to the first preferred embodiment, respectively. A detailed description of the first trench emitter electrode structure 191 is omitted.

The second trench emitter electrode structure 192 includes a second emitter trench 203, a second emitter insulating layer 204, a second emitter electrode layer 205, a second emitter embedding hole 206, and a second emitter embedded insulating layer 207.

The second emitter trench 203, the second emitter insulating layer 204, the second emitter electrode layer 205, the second emitter embedding hole 206, and the second emitter embedded insulating layer 207 have the same structure as the emitter trench 17, the emitter insulating layer 18, the emitter electrode layer 19, the emitter embedding hole 20, and the emitter embedded insulating layer 21 according to the first preferred embodiment, respectively. A detailed description of the second trench emitter electrode structure 192 is omitted.

The first trench pitch P1 between the first trench gate electrode structure 172 and the first trench emitter electrode structure 191 may be not less than 0.1 μm and less than 0.6 μm. The first trench pitch P1 may be not less than 0.1 μm and not more than 0.2 μm, not less than 0.2 μm and not more than 0.3 μm, not less than 0.3 μm and not more than 0.4 μm, not less than 0.4 μm and not more than 0.5 μm, or not less than 0.5 μm and less than 0.6 μm. Preferably, the first trench pitch P1 is not less than 0.2 μm and not more than 0.4 μm (for example, about 0.25 μm).

The second trench pitch P2 between the first trench emitter electrode structure 191 and the second trench emitter electrode structure 192 may be not less than 0.1 μm and less than 0.6 μm. The second trench pitch P2 may be not less than 0.1 μm and not more than 0.2 μm, not less than 0.2 μm and not more than 0.3 μm, not less than 0.3 μm and not more than 0.4 μm, not less than 0.4 μm and not more than 0.5 μm, or not less than 0.5 μm and less than 0.6 μm. Preferably, the second trench pitch P2 is not less than 0.2 μm and not more than 0.4 μm (for example, about 0.25 μm).

The third trench pitch P3 between the second trench gate electrode structure 173 and the second trench emitter electrode structure 192 may be not less than 0.1 μm and less than 0.6 μm. The third trench pitch P3 may be not less than 0.1 μm and not more than 0.2 μm, not less than 0.2 μm and not more than 0.3 μm, not less than 0.3 μm and not more than 0.4 μm, not less than 0.4 μm and not more than 0.5 μm, or not less than 0.5 μm and less than 0.6 μm. Preferably, the third trench pitch P3 is not less than 0.2 μm and not more than 0.4 μm (for example, about 0.25 μm).

The emitter region 25 is not formed in the region between the first trench emitter electrode structure 191 and the second trench emitter electrode structure 192 in the surface layer portion of the first main surface 3. A p-type impurity region 208 is formed in the region between the first trench emitter electrode structure 191 and the second trench emitter electrode structure 192 in the surface layer portion of the first main surface 3.

The impurity region 208 is exposed from the sidewall of the first emitter trench 193 and from the sidewall of the second emitter trench 203. The impurity region 208 is formed in the surface layer portion of the charge storage region 6. The impurity region 208 is exposed from the first main surface 3. The impurity region 208 is formed in a depth equal to that of the body region 8. The impurity region 208 has a p-type impurity concentration equal to the p-type impurity concentration of the body region 8. The impurity region 208 differs in electrical property from the body region 8 in the fact that it is not electrically connected to the emitter region 25.

In the present preferred embodiment, the first contact holes 31 are formed with intervals between the first contact holes 31 along the second direction Y, each extending in a band shape along the first direction X in a plan view. In the present preferred embodiment, each of the first contact holes 31 intersects the first trench gate electrode structure 172, the first trench emitter electrode structure 191, the second trench emitter electrode structure 192, and the second trench gate electrode structure 173.

In the present preferred embodiment, the emitter contact electrode layers 51 are formed with intervals between the emitter contact electrode layers 51 along the second direction Y, each extending in a band shape along the first direction X in a plan view. In the present preferred embodiment, each of the emitter contact electrode layers 51 intersects the first trench gate electrode structure 172, the first trench emitter electrode structure 191, the second trench emitter electrode structure 192, and the second trench gate electrode structure 173. Each of the emitter contact electrode layers 51 is connected to the body region 8, to the emitter region 25, to the contact region 36, and to the impurity region 208 in a part that is contiguous to the semiconductor layer 2.

As described above, the semiconductor device 171 can also fulfill the same effect as the effect mentioned concerning the semiconductor device 1. The semiconductor device 171 can be manufactured only by changing the layout of each mask in the manufacturing method of the semiconductor device 1.

Figure 19:
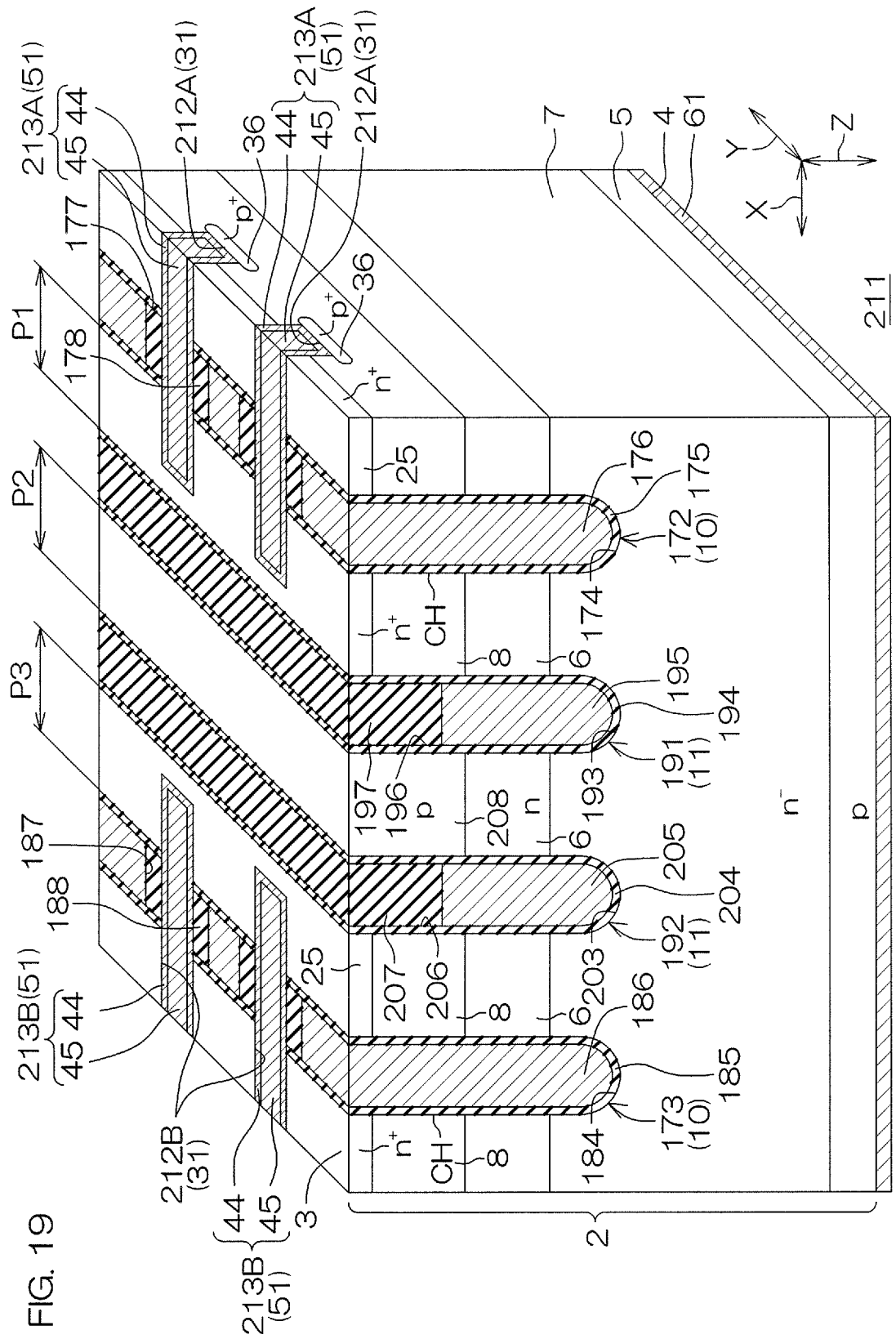
FIG. 19 is a cross-sectional perspective view showing a region of a part of a semiconductor device according to a tenth preferred embodiment of the present invention, in which a structure on a main surface of a semiconductor layer has been removed.

FIG. 19 is a cross-sectional perspective view showing a region of a part of a semiconductor device 211 according to a tenth preferred embodiment of the present invention, in which a structure on the first main surface 3 has been removed. Hereinafter, the same reference sign is given to a constituent equivalent to each constituent of the semiconductor device 171 mentioned above, and a description of this constituent is omitted.

Referring to FIG. 19, the first contact holes 31 include a plurality of first contact holes 212A and a plurality of first contact holes 212B in the present preferred embodiment. The first contact holes 212A are formed with intervals between the first contact holes 212A along the first gate trench 174 (second direction Y) in a plan view. The first contact holes 212A each intersect only the first gate trench 174 in a plan view.

The first contact holes 212B are formed with intervals between the first contact holes 212B along the second gate trench 184 (second direction Y) in a plan view. In the present preferred embodiment, the first contact holes 212B face corresponding first contact holes 212A along the first direction X. The first contact holes 212A each intersect only the second gate trench 184 in a plan view.

In the present preferred embodiment, the emitter contact electrode layers 51 include a plurality of emitter contact electrode layers 213A and a plurality of emitter contact electrode layers 213B. The emitter contact electrode layers 213A are embedded in corresponding first contact holes 212A, respectively. The emitter contact electrode layers 213A are formed with intervals between the emitter contact electrode layers 213A along the first gate trench 174 (second direction Y) in a plan view. The emitter contact electrode layers 213A intersect only the first gate trench 174 in a plan view.

The emitter contact electrode layers 213B are embedded in corresponding first contact holes 212B, respectively. The emitter contact electrode layers 213B are formed with intervals between the emitter contact electrode layers 213B along the second gate trench 184 (second direction Y) in a plan view. The emitter contact electrode layers 213B intersect only the second gate trench 184 in a plan view. In other words, each of the emitter contact electrode layers 51 is not electrically connected to the impurity region 208 in the present preferred embodiment. The impurity region 208 is formed in an electrically floating state.

As described above, the semiconductor device 211 can also fulfill the same effect as the effect mentioned concerning the semiconductor device 1. The semiconductor device 211 can be manufactured only by changing the layout of each mask in the manufacturing method of the semiconductor device 1.

Figure 20:
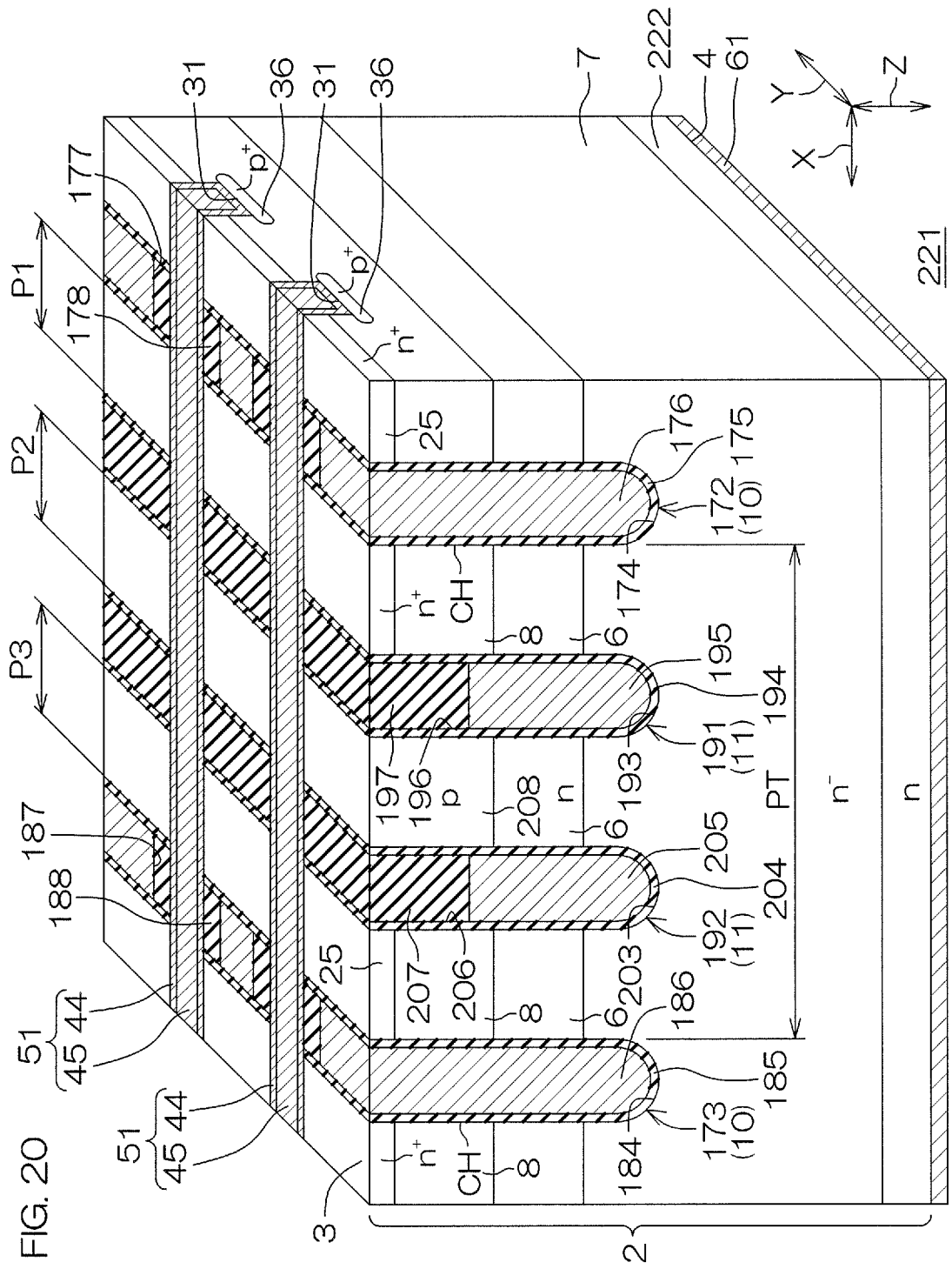
FIG. 20 is a cross-sectional perspective view showing a region of a part of a semiconductor device according to an eleventh preferred embodiment of the present invention, in which a structure on a main surface of a semiconductor layer has been removed.

FIG. 20 is a cross-sectional perspective view showing a region of a part of a semiconductor device 221 according to an eleventh preferred embodiment of the present invention, in which a structure on the first main surface 3 has been removed. Hereinafter, the same reference sign is given to a constituent equivalent to each constituent of the semiconductor device 171 mentioned according to the ninth preferred embodiment, and a description of this constituent is omitted.

An example in which the p-type collector region 5 is formed in the surface layer portion of the second main surface 4 in the semiconductor device 171 has been described. On the other hand, in the semiconductor device 221, an n-type drain region 222, instead of the p-type collector region 5, is formed in the surface layer portion of the second main surface 4.

Hence, the semiconductor device 221 has a basic form including a trench-gate type MISFET (Metal Insulator Semiconductor Field Effect Transistor). A description of the semiconductor device 171 applies correspondingly to a description of the semiconductor device 221 by reading "emitter" as "source" and by reading "collector" as "drain."

As described above, the semiconductor device 221 can also fulfill the same effect as the effect mentioned concerning the semiconductor device 1. The semiconductor device 221 can be manufactured only by forming the n-type drain region 222 instead of the p-type collector region 5 and by changing the layout of each mask in the manufacturing method of the semiconductor device 1.

Of course, a structure in which the drain region 222 is formed can be also applied to preferred embodiments other than the ninth preferred embodiment (semiconductor device 171). In this case, "emitter" is read as "source," and "collector" is read as "drain" in the preferred embodiment in which the drain region 222 is used.

Figure 21:
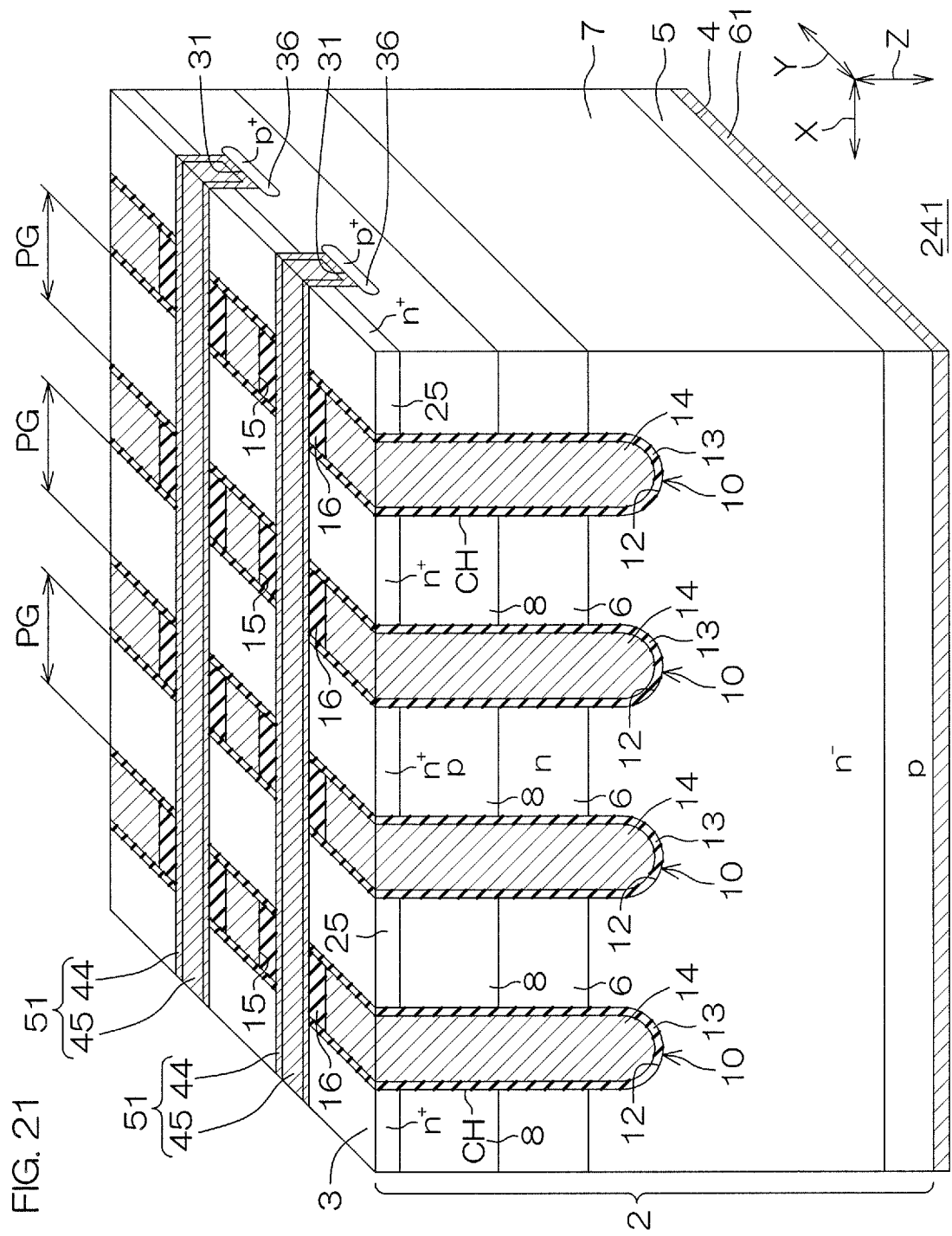
FIG. 21 is a cross-sectional perspective view showing a region of a part of a semiconductor device according to a twelfth preferred embodiment of the present invention, in which a structure on a main surface of a semiconductor layer has been removed.

FIG. 21 is a cross-sectional perspective view showing a region of a part of a semiconductor device 241 according to a twelfth preferred embodiment of the present invention, in which a structure on the first main surface 3 has been removed. Hereinafter, the same reference sign is given to a constituent equivalent to each constituent of the semiconductor device 171 mentioned above, and a description of this constituent is omitted.

The semiconductor device 241 has a structure in which the semiconductor device 141 (see FIG. 16) according to the seventh preferred embodiment has been combined with the semiconductor device 171 (see FIG. 18) according to the ninth preferred embodiment. In other words, the semiconductor device 241 does not include the trench emitter electrode structure 11. The semiconductor device 241 has a plurality of trench gate electrode structures 10.

The trench gate electrode structures 10 are formed with intervals between the trench gate electrode structures 10 along the first direction X. The trench gate electrode structures 10 each extend in a band shape along the second direction Y in a plan view.

The trench pitch PG between the trench gate electrode structures 10 may be not less than 0.1 µm and less than 0.6 µm. Each trench pitch PG may be not less than 0.1 µm and not more than 0.2 µm, not less than 0.2 µm and not more than 0.3 µm, not less than 0.3 µm and not more than 0.4 µm, not less than 0.4 µm and not more than 0.5 µm, or not less than 0.5 µm and less than 0.6 µm. Preferably, each trench pitch PG is not less than 0.2 µm and not more than 0.4 µm (for example, about 0.25 µm). The trench pitches PG may be formed such as to have a value equal to each other, and may be formed such as to have mutually different values.

The trench gate electrode structures 10 each have the gate trench 12, the gate insulating layer 13, the gate electrode layer 14, the gate embedding holes 15, and the gate embedded insulating layers 16. A description of the gate trench 12, the gate insulating layer 13, the gate electrode layer 14, the gate embedding holes 15, and the gate embedded insulating layers 16 is omitted.

In the present preferred embodiment, the first contact holes 31 are formed with intervals between the first contact holes 31 along the second direction Y in a plan view, each extending in a band shape along the first direction X. In the present preferred embodiment, the first contact holes 31 intersect the trench gate electrode structures 10 in a plan view.

In the present preferred embodiment, the emitter contact electrode layers 51 are formed with intervals between the emitter contact electrode layers 51 along the second direction Y in a plan view, each extending in a band shape along the first direction X. In the present preferred embodiment, the emitter contact electrode layers 51 intersect the trench gate electrode structures 10 in a plan view. Each of the emitter contact electrode layers 51 is connected to the body region 8, to the emitter region 25, and to the contact region 36 in a part that is contiguous to the semiconductor layer 2.

As described above, the semiconductor device 241 can also fulfill the same effect as the effect mentioned concerning the semiconductor device 1. The semiconductor device 241 can be manufactured only by changing the layout of each mask in the manufacturing method of the semiconductor device 1.

Figure 22:
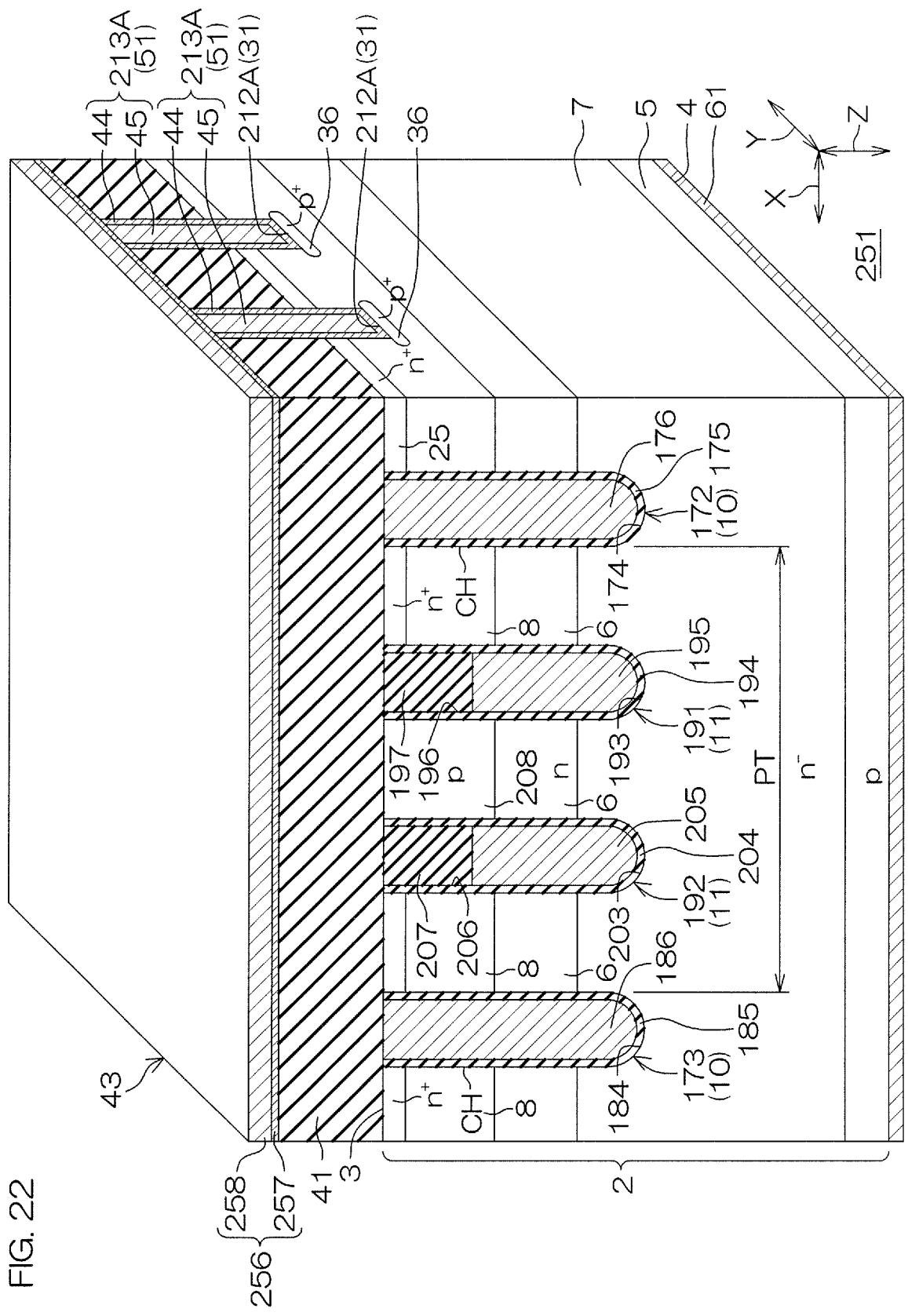
FIG. 22 is a cross-sectional perspective view showing a region of a part of a semiconductor device according to a thirteenth preferred embodiment of the present invention.
Figure 23:
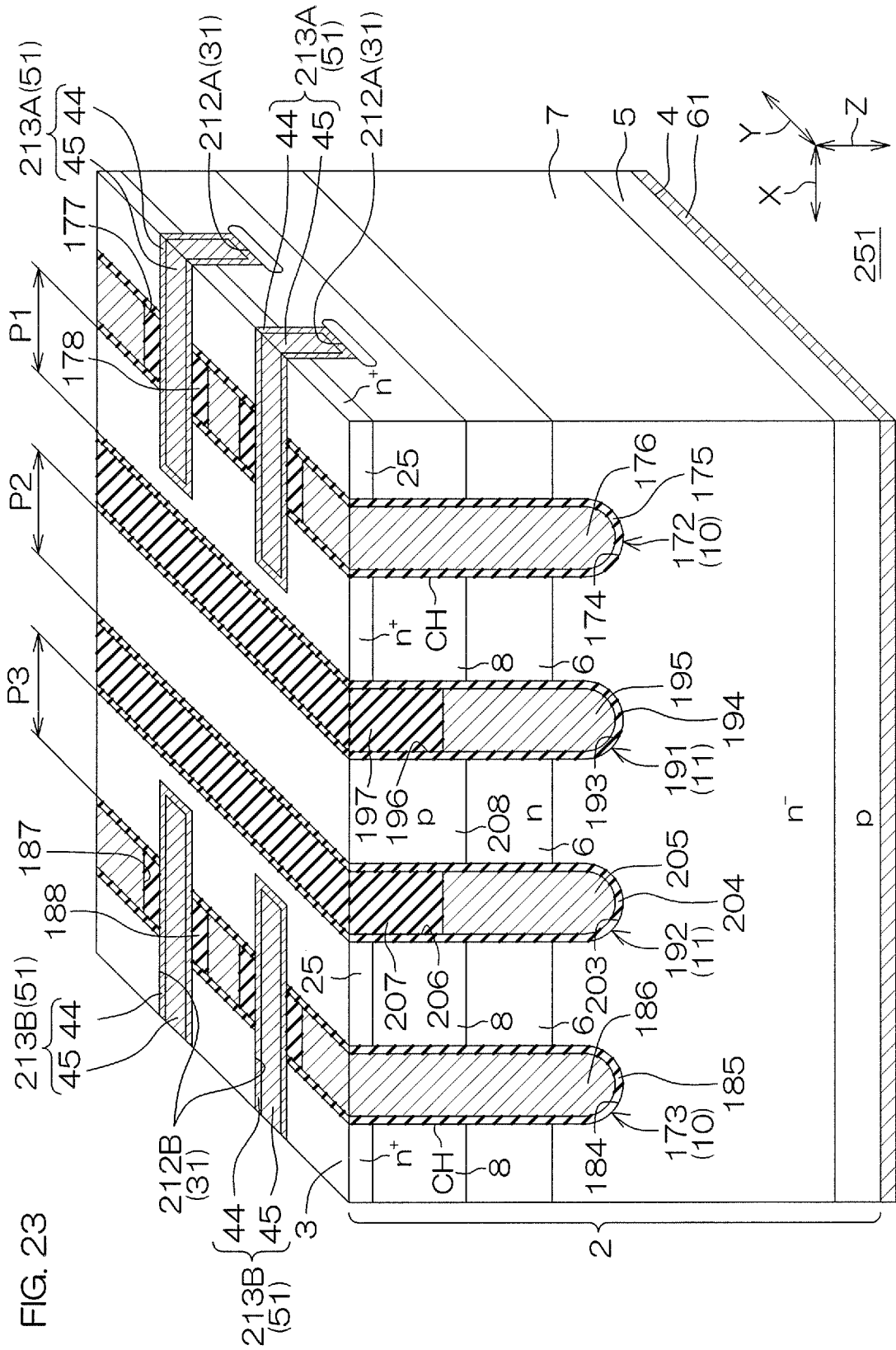
FIG. 23 is a cross-sectional perspective view showing the region of the part of the semiconductor device shown in FIG. 22, in which a structure on a main surface of a semiconductor layer has been removed.
Figure 24:
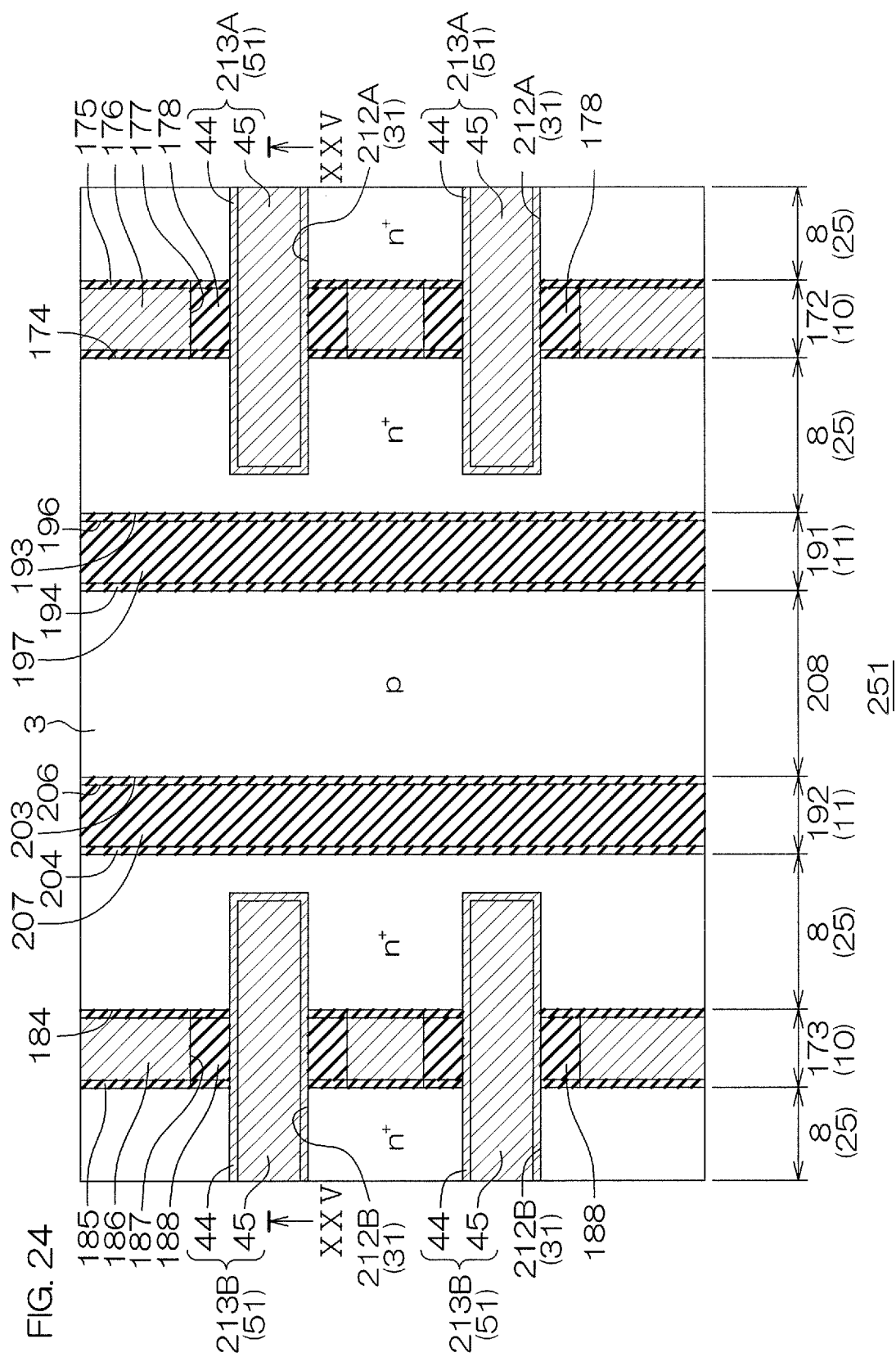
FIG. 24 is a plan view of FIG. 23.
Figure 25:
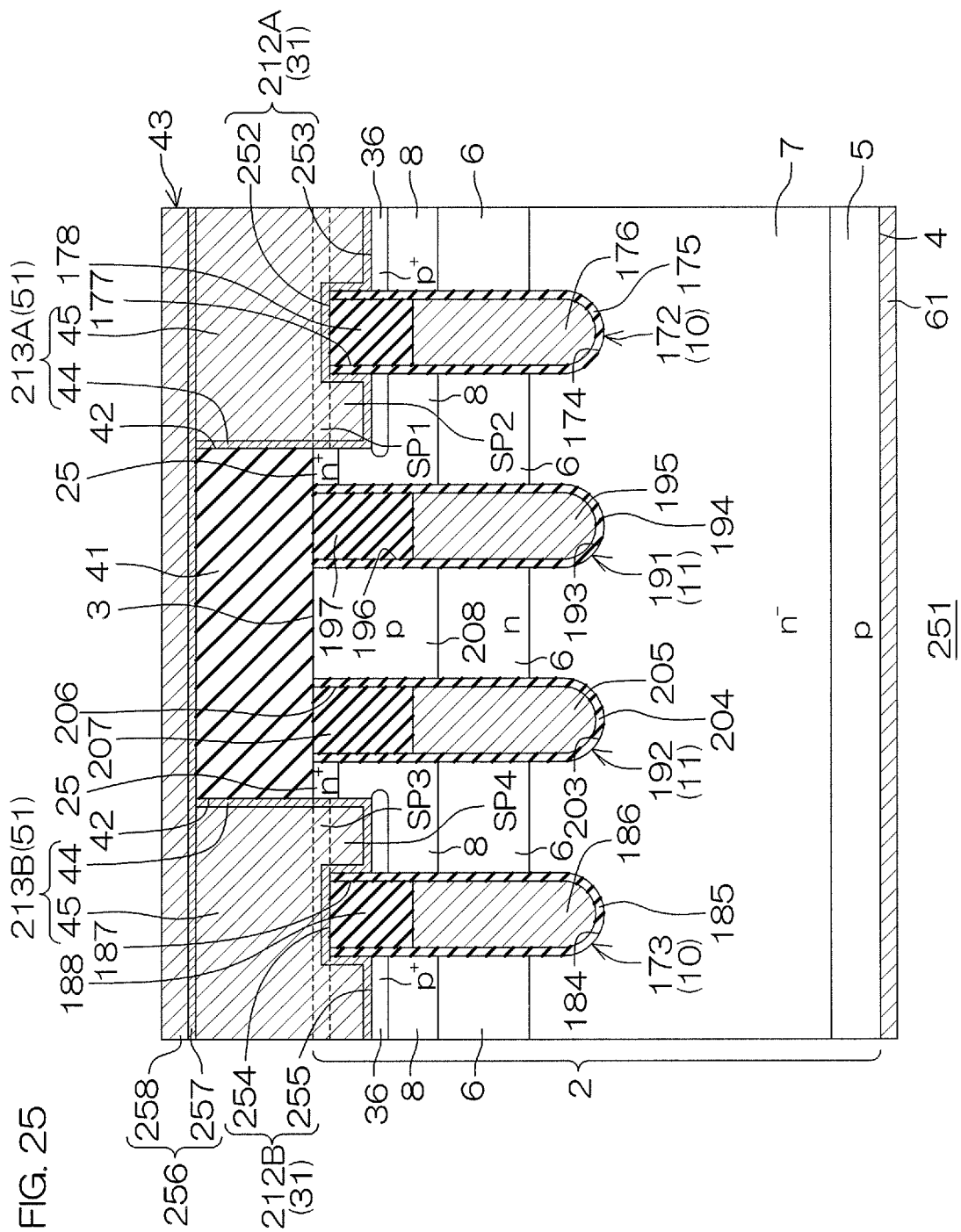
FIG. 25 is a cross-sectional view taken along line XXV-XXV in FIG. 24.

FIG. 22 is a cross-sectional perspective view showing a region of a part of a semiconductor device 251 according to a thirteenth preferred embodiment of the present invention. FIG. 23 is a cross-sectional perspective view showing the region of the part of the semiconductor device 251 of FIG. 22, in which a structure on the first main surface 3 has been removed. FIG. 24 is a plan view of FIG. 23. FIG. 25 is a cross-sectional view taken along line XXV-XXV in FIG. 24. Hereinafter, the same reference sign is given to a constituent equivalent to each constituent of the semiconductor device 211 mentioned above (see FIG. 19), and a description of this constituent is omitted.

Referring to FIG. 22 to FIG. 25, the first contact holes 31 include a plurality of first contact holes 212A and a plurality of first contact holes 212B in the same way as the semiconductor device 211. Referring to FIG. 25, the bottom wall of each of the first contact holes 212A is formed in an uneven shape that upheaves toward the first main surface 3 and that sinks toward the second main surface 4 in the present preferred embodiment. More specifically, each of the first contact holes 212A includes a first region 252 formed in the first gate trench 174 and a second region 253 formed in the semiconductor layer 2.

A sidewall and a bottom wall of the first region 252 are defined by the first gate insulating layer 175 and by the first gate embedded insulating layer 178. The bottom wall of the first region 252 is positioned on the second-principal-surface-4 side with respect to the first main surface 3 regarding the thickness direction of the semiconductor layer 2. More specifically, the bottom wall of the first region 252 is positioned in a region between the first main surface 3 and the bottom portion of the body region 8 regarding the thickness direction of the semiconductor layer 2. Of course, the bottom wall of the first region 252 may be positioned on the same plane as the first main surface 3. In other words, the first contact hole 212A that does not have the first region 252 may be formed.

A sidewall and a bottom wall of the second region 253 are defined by the semiconductor layer 2 and by the trench gate electrode structure 10 (the first trench gate electrode structure 172). The sidewall of the second region 253 may be defined by the first gate insulating layer 175 and/or by the first gate embedded insulating layer 178. The bottom wall of the second region 253 is positioned in a region between the bottom wall of the first region 252 and the bottom portion of the body region 8 regarding the thickness direction of the semiconductor layer 2. More specifically, the bottom wall of the second region 253 is positioned in a region between the bottom portion of the emitter region 25 and the bottom portion of the body region 8 regarding the thickness direction of the semiconductor layer 2.

Referring to FIG. 25, the bottom wall of each of the first contact holes 212B is formed in an uneven shape that upheaves toward the first main surface 3 and that sinks toward the second main surface 4 in the present preferred embodiment. More specifically, each of the first contact holes 212B includes a first region 254 formed in the second gate trench 184 and a second region 255 formed in the semiconductor layer 2.

A sidewall and a bottom wall of the first region 254 are defined by the second gate insulating layer 185 and by the second gate embedded insulating layer 188. The bottom wall of the first region 254 is positioned on the second-principal-surface-4 side with respect to the first main surface 3 regarding the thickness direction of the semiconductor layer 2. More specifically, the bottom wall of the first region 254 is positioned in the region between the first main surface 3 and the bottom portion of the body region 8 regarding the thickness direction of the semiconductor layer 2. Of course, the bottom wall of the first region 254 may be positioned on the same plane as the first main surface 3. In other words, the first contact hole 212B that does not have the first region 254 may be formed.

A sidewall and a bottom wall of the second region 255 are defined by the semiconductor layer 2 and by the trench gate electrode structure 10. The sidewall of the second region 255 may be defined by the second gate insulating layer 185 and/or by the second gate embedded insulating layer 188. The bottom wall of the second region 255 is positioned in a region between the bottom wall of the first region 254 and the bottom portion of the body region 8 regarding the thickness direction of the semiconductor layer 2. More specifically, the bottom wall of the second region 255 is positioned in the region between the bottom portion of the emitter region 25 and the bottom portion of the body region 8 regarding the thickness direction of the semiconductor layer 2.

The first contact holes 31 according to the present preferred embodiment can be manufactured only by changing the layout of each mask and changing etching conditions in the manufacturing method of the semiconductor device 1. In other words, the first contact holes 31 are formed by removing a needless part of the semiconductor layer 2 such that the bottom wall of the first contact hole 31 is positioned in a region on the second-principal-surface-4 side with respect to an upper surface of the first gate embedded insulating layer 178 (the second gate embedded insulating layer 188) when a step of removing the semiconductor layer 2 is performed (see FIG. 10M). At this time, part or all of the first gate insulating layer 175 that is to define the second region 253 may be eliminated by the etching method. Also, part or all of the second gate insulating layer 185 that is to define the second region 255 may be eliminated by an etching method.

The emitter principal-surface electrode layer 43 includes a plurality of emitter contact electrode layers 51 and a principal-surface electrode layer 256. The emitter contact electrode layers 51 include a plurality of emitter contact electrode layers 213A and a plurality of emitter contact electrode layers 213B.

The emitter contact electrode layers 213A are embedded in corresponding first contact holes 212A, respectively. Each of the emitter contact electrode layers 213A has an uneven portion that is engaged with the first region 252 and with the second region 253 in the corresponding first contact hole 212A.

Each of the emitter contact electrode layers 213A includes a first electrode layer 44 and a second electrode layer 45. The first electrode layer 44 defines a concave-shaped first space SP1 in the first region 252. The first electrode layer 44 further defines a concave-shaped second space SP2 in the second region 253. If the bottom wall of the first region 252 is positioned on the same plane as the first main surface 3, the first space SP1 is not formed, and only the second space SP2 is formed.

The second electrode layer 45 fills the first space SP1 and the second space SP2 in the first contact hole 212A. In this way, each of the emitter contact electrode layers 213A that has an uneven portion that is engaged with the first region 252 and with the second region 253 is formed.

The emitter contact electrode layers 213B are embedded in corresponding first contact holes 212B, respectively. Each of the emitter contact electrode layers 213B has an uneven portion that is engaged with the first region 254 and with the second region 255 in the corresponding first contact hole 212B.

Each of the emitter contact electrode layers 213B includes the first electrode layer 44 and the second electrode layer 45. The first electrode layer 44 defines a concave-shaped first space SP3 in the first region 254. The first electrode layer 44 further defines a concave-shaped second space SP4 in the second region 255. If the bottom wall of the first region 254 is positioned on the same plane as the first main surface 3, the first space SP3 is not formed, and only the second space SP4 is formed.

The second electrode layer 45 fills the first space SP3 and the second space SP4 in the first contact hole 212B. In this way, each of the emitter contact electrode layers 213B that has an uneven portion that is engaged with the first region 254 and with the second region 255 is formed.

The principal-surface electrode layer 256 covers the emitter contact electrode layers 51 on the interlayer insulating layer 41. The principal-surface electrode layer 256 has a layered structure including a first principal-surface electrode layer 257 and a second principal-surface electrode layer 258 that are stacked together in this order from the interlayer-insulating-layer-41 side.

The first principal-surface electrode layer 257 serves as a ground layer of the second principal-surface electrode layer 258. The first principal-surface electrode layer 257 is formed as a barrier electrode layer that suppresses the diffusion of the second principal-surface electrode layer 258. The first principal-surface electrode layer 257 is formed in a film shape along the main surface of the interlayer insulating layer 41, and collectively covers the emitter contact electrode layers 51. The first principal-surface electrode layer 257 is connected to the emitter contact electrode layers 51.

The first principal-surface electrode layer 257 may have a layered structure including a titanium layer and a titanium nitride layer that are stacked together in this order from the interlayer-insulating-layer-41 side. The first principal-surface electrode layer 257 may have a single-layer structure including a titanium layer or a titanium nitride layer.

The second principal-surface electrode layer 258 is formed in a film shape on the first principal-surface electrode layer 257. The second principal-surface electrode layer 258 is electrically connected to the emitter contact electrode layers 51 through the first electrode layer 44.

The second principal-surface electrode layer 258 may include at least one kind among aluminum, copper, an aluminum alloy, and a copper alloy. Preferably, the second principal-surface electrode layer 258 is made of a conductive material that includes aluminum as its main element. The second principal-surface electrode layer 258 may include at least one kind among an Al—Si—Cu (aluminum-silicon-copper) alloy, an Al—Si (aluminum-silicon) alloy, and an Al—Cu (aluminum-copper) alloy each of which is an example of the aluminum alloy.

The principal-surface electrode layer 256 is formed on the interlayer insulating layer 41 after the emitter contact electrode layers 51 are respectively embedded in corresponding contact holes 31. A step of forming the principal-surface electrode layer 256 includes a step of forming the first principal-surface electrode layer 257 and the second principal-surface electrode layer 258 in this order from the interlayer-insulating-layer-41 side. The first principal-surface electrode layer 257 may be formed by a sputtering method. The second principal-surface electrode layer 258 may be formed by a sputtering method, a vapor deposition method, a CVD method, or a plating method As described above, the semiconductor device 251 can also fulfill the same effect as the effect mentioned concerning the semiconductor device 1. Of course, the structure of the semiconductor device 251 is applicable also to preferred embodiments other than the thirteenth preferred embodiment.

Figure 26:
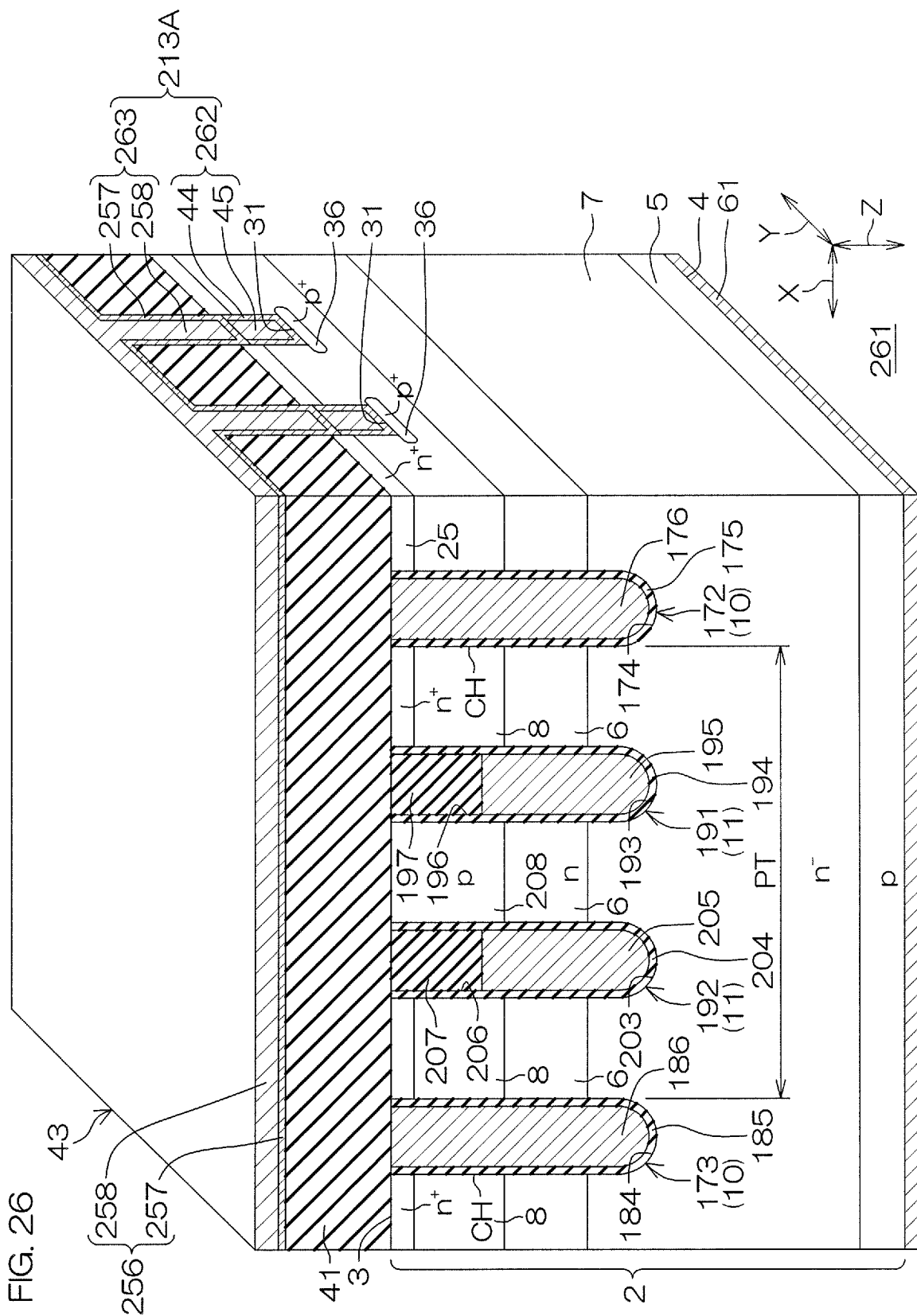
FIG. 26 is a cross-sectional perspective view of the region corresponding to FIG. 22, showing a region of a part of a semiconductor device according to a fourteenth preferred embodiment of the present invention.
Figure 27:
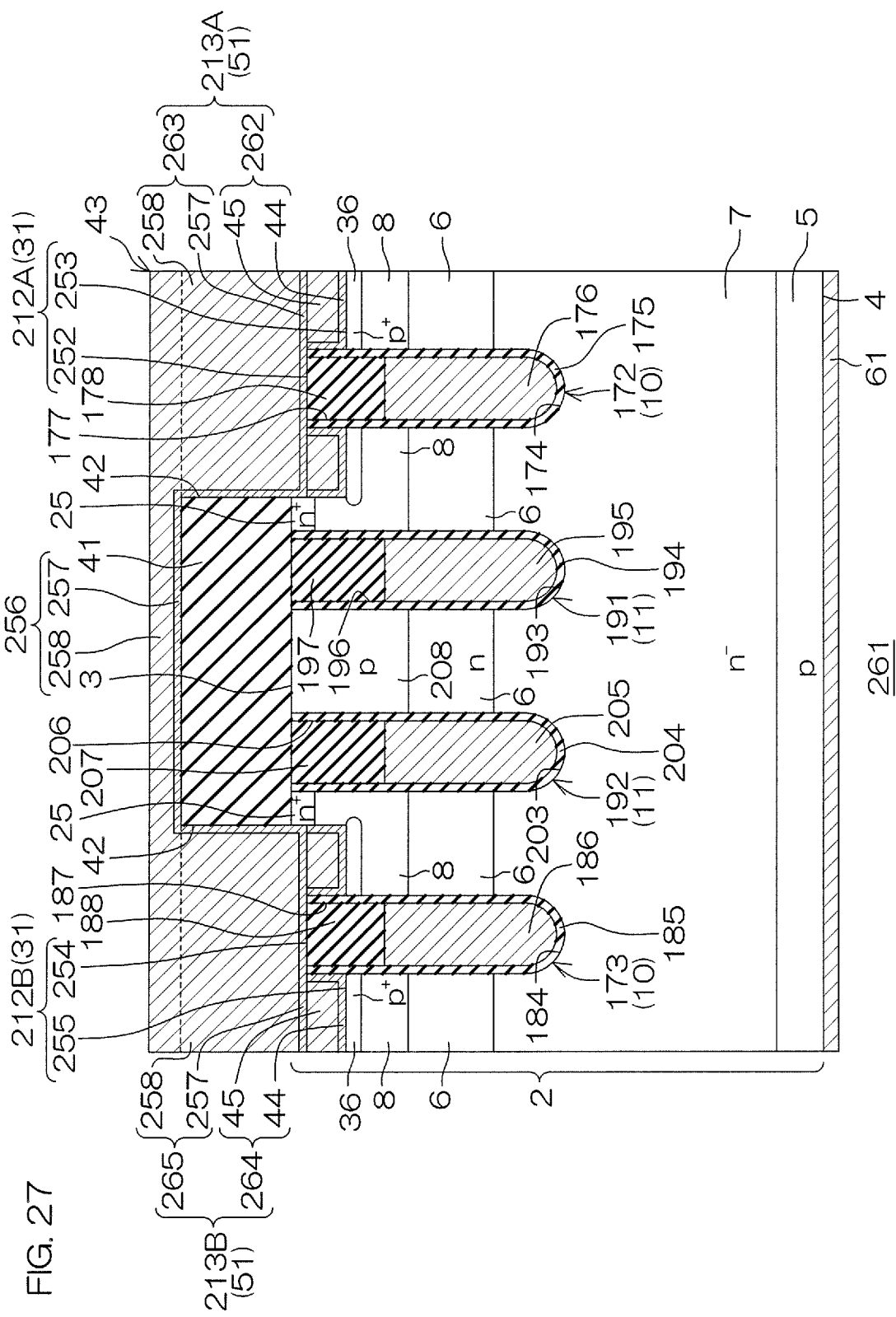
FIG. 27 is a cross-sectional view of the region corresponding to FIG. 25, showing a region of a part of the semiconductor device shown in FIG. 26.

FIG. 26 is a cross-sectional perspective view of the region corresponding to FIG. 22, showing a region of a part of a semiconductor device 261 according to a fourteenth preferred embodiment of the present invention. FIG. 27 is a cross-sectional view of the region corresponding to FIG. 25, showing a region of a part of the semiconductor device 261 shown in FIG. 26. Hereinafter, the same reference sign is given to a constituent equivalent to each constituent of the semiconductor device 251 mentioned above (see FIG. 22), and a description of this constituent is omitted.

Referring to FIG. 26 and FIG. 27, the emitter contact electrode layers 51 include a plurality of emitter contact electrode layers 213A and a plurality of emitter contact electrode layers 213B. In the present preferred embodiment, each of the emitter contact electrode layers 213A includes a first contact electrode layer 262 and a second contact electrode 263 both of which include mutually different conductive materials as their main elements.

The first contact electrode layer 262 includes tungsten as its main element, and is embedded in the first contact hole 212A. The second contact electrode 263 includes aluminum as its main element, and is embedded in the second contact hole 42 that is in communication with the first contact hole 212A.

More specifically, the first contact electrode layer 262 is embedded in the second region 253 of the first contact hole 212A. The first contact electrode layer 262 is connected to the body region 8, to the emitter region 25, and to the contact region 36 in the second region 253.

An upper end portion of the first contact electrode layer 262 may be positioned on the same plane as the bottom wall of the first region 252, or may be positioned on the bottom-portion side of the body region 8 with respect to the bottom wall of the first region 252.

The first contact electrode layer 262 includes a first electrode layer 44 and a second electrode layer 45. The first electrode layer 44 is formed in a film shape along an inner wall of the second region 253. The first electrode layer 44 defines a concave-shaped space in the second region 253. The first electrode layer 44 is connected to the body region 8, to the emitter region 25, and to the contact region 36.

The second electrode layer 45 is embedded in a concave-shaped space defined by the first electrode layer 44 in the second region 253. The second electrode layer 45 is electrically connected to the body region 8, to the emitter region 25, and to the contact region 36 through the first electrode layer 44.

The second contact electrode 263 is formed by using a part of the principal-surface electrode layer 256. In the present preferred embodiment, the principal-surface electrode layer 256 enters the second contact hole 42 from above the interlayer insulating layer 41. In the present preferred embodiment, the principal-surface electrode layer 256 also enters the first contact hole 31 (the first region 252) from the second contact hole 42. If the first region 252 is not formed in the first contact hole 212A, the principal-surface electrode layer 256 is structured to be embedded in only the second contact hole 42.

More specifically, the first principal-surface electrode layer 257 of the principal-surface electrode layer 256 is formed in a film shape along the main surface of the interlayer insulating layer 41 and the inner wall of the second contact hole 42. The first principal-surface electrode layer 257 defines a concave-shaped space in the second contact hole 42. The first principal-surface electrode layer 257 is connected to the first contact electrode layer 262 in the second contact hole 42. The first principal-surface electrode layer 257 may be connected to the emitter region 25 in accordance with the position of the upper end portion of the first contact electrode layer 262.

The second principal-surface electrode layer 258 of the principal-surface electrode layer 256 is formed on the first principal-surface electrode layer 257. The second principal-surface electrode layer 258 enters the second contact hole 42 from above the interlayer insulating layer 41. The second principal-surface electrode layer 258 fills a concave-shaped space defined by the first principal-surface electrode layer 257 in the second contact hole 42. The second principal-surface electrode layer 258 is electrically connected to the first contact electrode layer 262 through the first principal-surface electrode layer 257.

In this way, the second contact electrode 263 is formed by using a part of the principal-surface electrode layer 256. Of course, the second contact electrode 263 may be formed as a component structurally independent of the principal-surface electrode layer 256.

In the present preferred embodiment, each of the emitter contact electrode layers 213B includes a first contact electrode layer 264 and a second contact electrode 265 both of which include mutually different conductive materials as their main elements. The first contact electrode layer 264 and the second contact electrode layer 265 have a structure corresponding to the first contact electrode layer 262 and a structure corresponding to the second contact electrode 263, respectively. A detailed description of the first contact electrode layer 264 and the second contact electrode layer 265 is omitted.

As described above, the semiconductor device 261 can also fulfill the same effect as the effect mentioned concerning the semiconductor device 1. Of course, the structure of the semiconductor device 261 is applicable also to preferred embodiments other than the fourteenth preferred embodiment.

Figure 28:
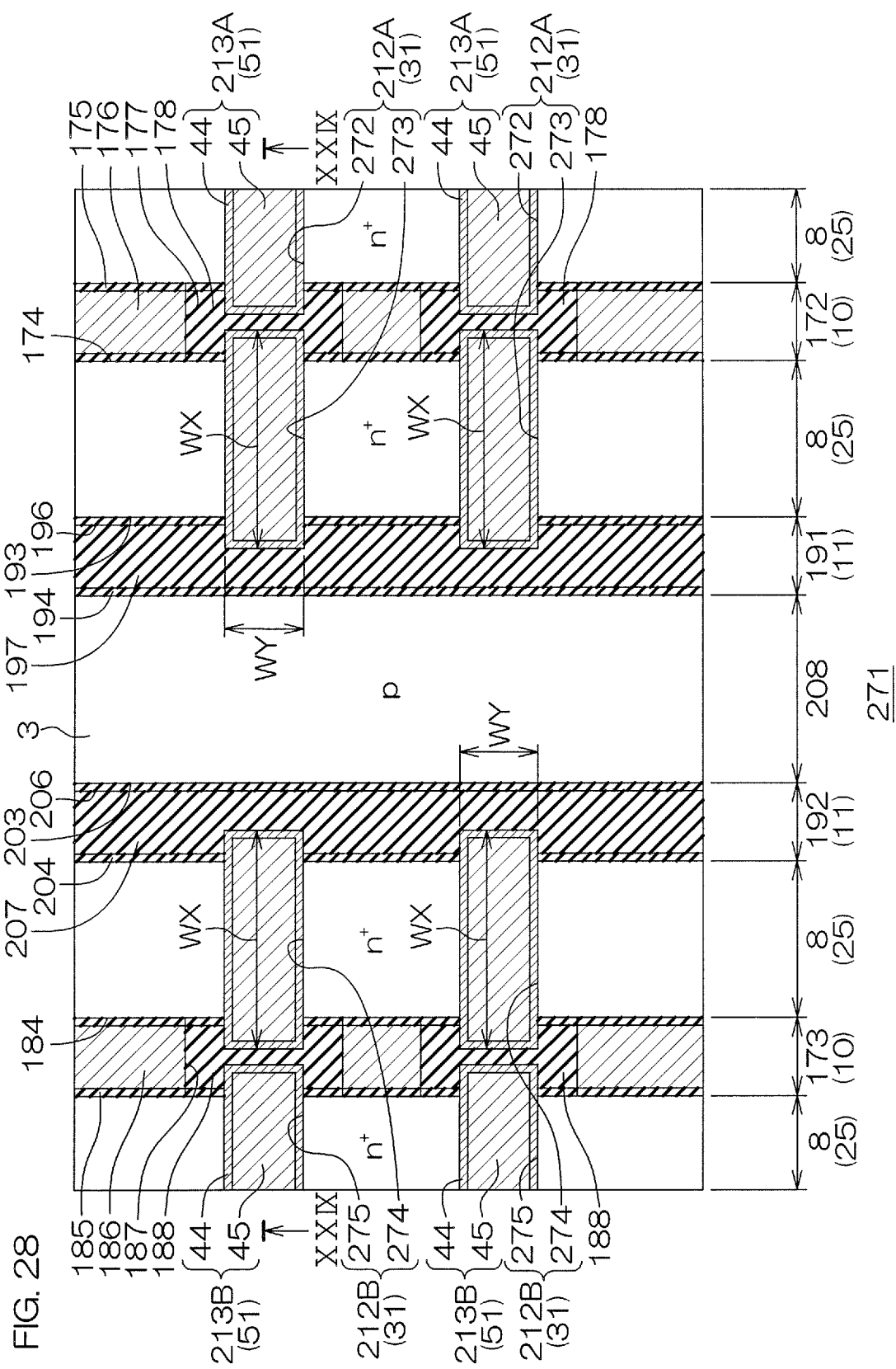
FIG. 28 is a plan view of the region corresponding to FIG. 24, showing a region of a part of a semiconductor device according to a fifteenth preferred embodiment of the present invention.
Figure 29:
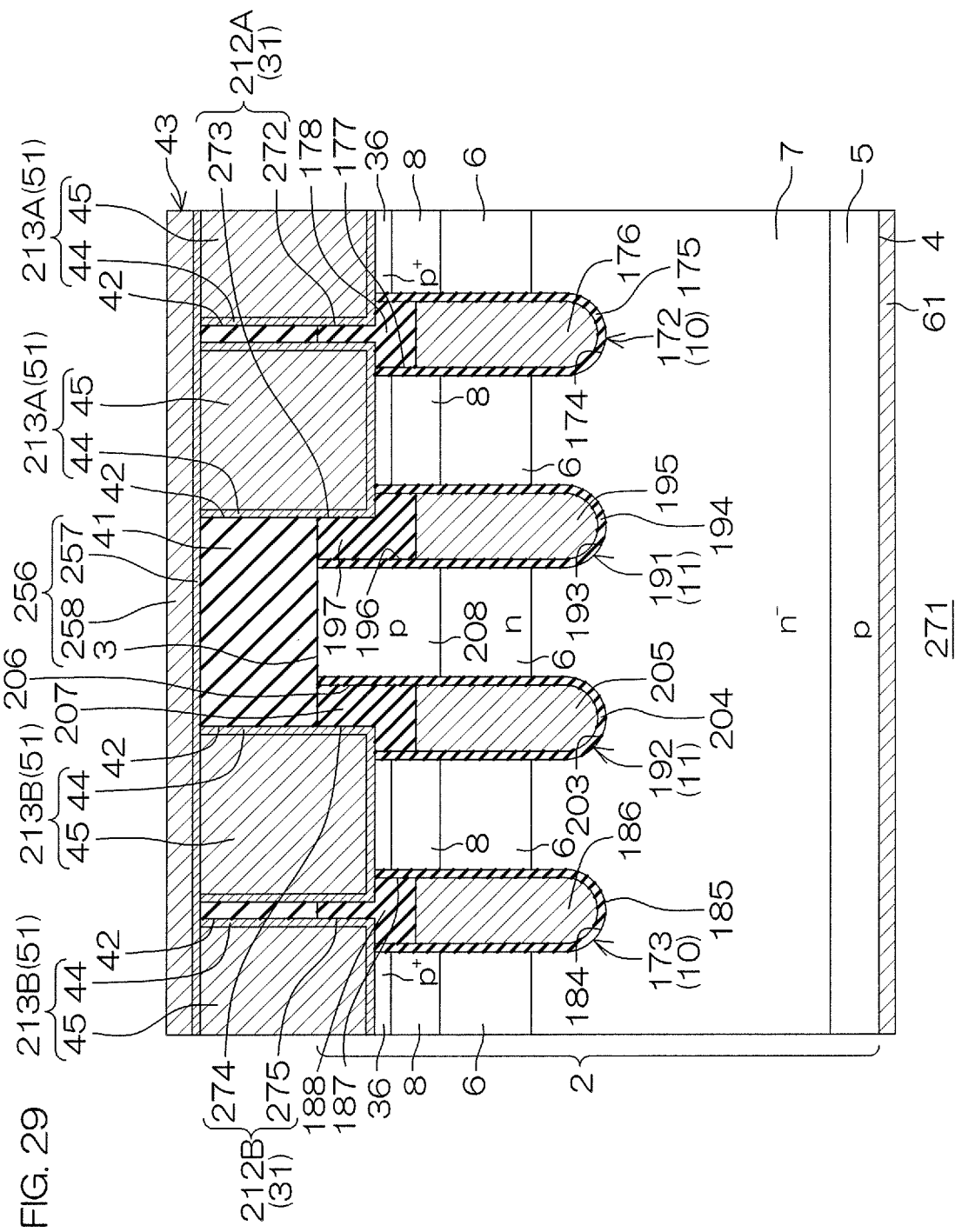
FIG. 29 is a cross-sectional view taken along line XXIX-XXIX in FIG. 28.

FIG. 28 is a plan view of the region corresponding to FIG. 24, showing a region of a part of a semiconductor device 271 according to a fifteenth preferred embodiment of the present invention. FIG. 29 is a cross-sectional view taken along line XXIX-XXIX in FIG. 28. Hereinafter, the same reference sign is given to a constituent equivalent to each constituent of the semiconductor device 251 mentioned above (see FIG. 22), and a description of this constituent is omitted.

Referring to FIG. 28 and FIG. 29, the first contact holes 212A include a first sidewall contact hole 272 and a second sidewall contact hole 273 in the present preferred embodiment. The first sidewall contact hole 272 is formed on the one-sidewall side of the first gate trench 174. The second sidewall contact hole 273 is formed on the other-sidewall side of the first gate trench 174.

The first sidewall contact holes 272 are formed with intervals between the first sidewall contact holes 272 along the second direction Y. Each of the first sidewall contact holes 272 passes through the one sidewall from the inward side of the first gate trench 174, and is drawn out to the surface layer portion of the first main surface 3 of the semiconductor layer 2.

In the present preferred embodiment, each of the first sidewall contact holes 272 passes through one sidewall of the emitter trench 17 (the second emitter trench 203) adjoining the one sidewall of the first gate trench 174, and is drawn out into the emitter trench 17 (not shown in detail). Each of the first sidewall contact holes 272 is not necessarily required to be drawn out into the emitter trench 17, and may be formed away from the emitter trench 17.

Each of the first sidewall contact holes 272 has one end portion positioned in the first gate trench 174 and one other end portion positioned in the emitter trench 17 regarding the first direction X. The end portion of each of the first sidewall contact holes 272 is formed away from the other sidewall of the first gate trench 174. The other end portion of each of the first sidewall contact holes 272 is formed away from the other sidewall of the emitter trench 17.

Each of the first sidewall contact holes 272 is formed in a quadrilateral shape in a plan view. In the present preferred embodiment, each of the first sidewall contact holes 272 is formed in a band shape (rectangular shape) that extends along the first direction X in a plan view. The width WX in the first direction X of each of the first sidewall contact holes 272 is more than 0 μm and not more than 1 μm. The width WY in the second direction Y of each of the first sidewall contact holes 272 is more than 0 μm and not more than 1 μm.

The second sidewall contact holes 273 are formed with intervals between the second sidewall contact holes 273 along the second direction Y. In the present preferred embodiment, each of the second sidewall contact holes 273 faces a corresponding first sidewall contact hole 272 along the first direction X.

Each of the second sidewall contact holes 273 passes through the other sidewall from the inward side of the first gate trench 174, and is drawn out to the surface layer portion of the first main surface 3 of the semiconductor layer 2. In the present preferred embodiment, each of the second sidewall contact holes 273 passes through the one sidewall of the first emitter trench 193, and is drawn out into the first emitter trench 193. Each of the second sidewall contact holes 273 is not necessarily drawn out into the first emitter trench 193, and may be formed away from the first emitter trench 193.

Each of the second sidewall contact holes 273 has one end portion positioned in the first gate trench 174 and one other end portion positioned in the first emitter trench 193 regarding the first direction X. The one end portion of each of the second sidewall contact holes 273 is formed away from the one sidewall of the first gate trench 174. More specifically, the one end portion of each of the second sidewall contact holes 273 is formed away from the first sidewall contact hole 272. The other end portion of each of the second sidewall contact holes 273 is formed away from the other sidewall of the first emitter trench 193.

Each of the second sidewall contact holes 273 is formed in a quadrilateral shape in a plan view. In the present preferred embodiment, each of the second sidewall contact holes 273 is formed in a band shape (rectangular shape) that extends along the first direction X in a plan view. The width WX in the first direction X of each of the second sidewall contact holes 273 is more than 0 μm and not more than 1 μm. The width WY in the second direction Y of each of the second sidewall contact holes 273 is more than 0 μm and not more than 1 μm.

The one end portion of each of the first sidewall contact holes 272 and the one end portion of each of the second sidewall contact holes 273 are defined by the first gate embedded insulating layer 178 in common in the first gate trench 174. A part of the first gate embedded insulating layer 178 is interposed in a region between the one end portion of each of the first sidewall contact holes 272 and the one end portion of each of the second sidewall contact holes 273.

In the present preferred embodiment, the first contact holes 212B include a first sidewall contact hole 274 and a second sidewall contact hole 275. The first sidewall contact hole 274 is formed on the one-sidewall side of the second gate trench 184. The second sidewall contact hole 275 is formed on the other-sidewall side of the second gate trench 184.

The first sidewall contact holes 274 are formed with intervals between the first sidewall contact holes 274 along the second direction Y. Each of the first sidewall contact holes 274 passes through the one sidewall from the inward side of the second gate trench 184, and is drawn out to the surface layer portion of the first main surface 3 of the semiconductor layer 2. In the present preferred embodiment, each of the first sidewall contact holes 274 passes through the one sidewall of the second emitter trench 203, and is drawn out into the second emitter trench 203. Each of the first sidewall contact holes 274 is not necessarily required to be drawn out into the second emitter trench 203, and may be formed away from the second emitter trench 203.

Each of the first sidewall contact holes 274 has one end portion positioned in the second gate trench 184 and one other end portion positioned in the second emitter trench 203 regarding the first direction X. The one end portion of each of the first sidewall contact holes 274 is formed away from the other sidewall of the second gate trench 184. The other end portion of each of the first sidewall contact holes 274 is formed away from the other sidewall of the second emitter trench 203.

Each of the first sidewall contact holes 274 is formed in a quadrilateral shape in a plan view. In the present preferred embodiment, each of the first sidewall contact holes 274 is formed in a band shape (rectangular shape) that extends along the first direction X in a plan view. The width WX in the first direction X of each of the first sidewall contact holes 274 is more than 0 μm and not more than 1 μm. The width WY in the second direction Y of each of the first sidewall contact holes 274 is more than 0 μm and not more than 1 μm.

The second sidewall contact holes 275 are formed with intervals between the second sidewall contact holes 275 along the second direction Y. In the present preferred embodiment, each of the second sidewall contact holes 275 faces a corresponding first sidewall contact hole 274 along the first direction X. The second sidewall contact holes 275 pass through the other sidewall from the inward side of the second gate trench 184, and are each drawn out to the surface layer portion of the first main surface 3 of the semiconductor layer 2.

In the present preferred embodiment, each of the second sidewall contact holes 275 passes through the one sidewall of the emitter trench 17 (the first emitter trench 193) adjoining the other sidewall of the second gate trench 184, and is drawn out into the emitter trench 17 (not shown in detail). Each of the second sidewall contact holes 275 is not necessarily required to be drawn out into the emitter trench 17, and may be formed away from the emitter trench 17.

Each of the second sidewall contact holes 275 has one end portion positioned in the second gate trench 184 and one other end portion positioned in the emitter trench 17 regarding the first direction X. The one end portion of each of the second sidewall contact holes 275 is formed away from the one sidewall of the second gate trench 184. More specifically, the one end portion of each of the second sidewall contact holes 275 is formed away from the first sidewall contact hole 274. The other end portion of each of the second sidewall contact holes 275 is formed away from the other sidewall of the emitter trench 17.

Each of the second sidewall contact holes 275 is formed in a quadrilateral shape in a plan view. In the present preferred embodiment, each of the second sidewall contact holes 275 is formed in a band shape (rectangular shape) that extends along the first direction X in a plan view. The width WX in the first direction X of each of the second sidewall contact holes 275 is more than 0 μm and not more than 1 μm. The width WY in the second direction Y of each of the second sidewall contact holes 275 is more than 0 μm and not more than 1 μm.

The one end portion of each of the first sidewall contact holes 274 and the one end portion of each of the second sidewall contact holes 275 are defined by the second gate embedded insulating layer 188 in common in the second gate trench 184. A part of the second gate embedded insulating layer 188 is interposed in a region between the one end portion of each of the first sidewall contact holes 274 and the one end portion of each of the second sidewall contact holes 275.

The second contact holes 42 are respectively in communication with a first sidewall contact hole 272, a second sidewall contact hole 273, a first sidewall contact hole 274, and a first sidewall contact hole 274 each of which corresponds to the second contact hole 42 in one-to-one correspondence. A part of the interlayer insulating layer 41 is interposed in a region between two mutually adjoining second contact holes 42 on the first gate embedded insulating layer 178. A part of the interlayer insulating layer 41 is interposed in a region between two mutually adjoining second contact holes 42 on the second gate embedded insulating layer 188.

The emitter contact electrode layers 51 include a plurality of emitter contact electrode layers 213A and a plurality of emitter contact electrode layers 213B in the same way as in the semiconductor device 251. The emitter contact electrode layers 213A are respectively embedded in the first sidewall contact holes 272 and the second sidewall contact holes 273 in the same mode as in the semiconductor device 251. The emitter contact electrode layers 213B are respectively embedded in the first sidewall contact holes 274 and the second sidewall contact holes 275 in the same mode as in the semiconductor device 251.

As described above, the semiconductor device 271 can also fulfill the same effect as the effect mentioned concerning the semiconductor device 1. Also, the first sidewall contact hole 272, the second sidewall contact hole 273, the first sidewall contact hole 274, and the second sidewall contact hole 275, in each of which the width WX is equal to or less than 1 µm, and the width WY is equal to or less than 1 µm, are formed according to the semiconductor device 271. Hence, the emitter contact electrode layer 51 (particularly, the second electrode layer 45 including tungsten) can be appropriately embedded in the first sidewall contact hole 272, in the second sidewall contact hole 273, in the first sidewall contact hole 274, and in the second sidewall contact hole 275. Of course, the structure of the semiconductor device 271 is applicable also to preferred embodiments other than the fifteenth preferred embodiment.

Figure 30:
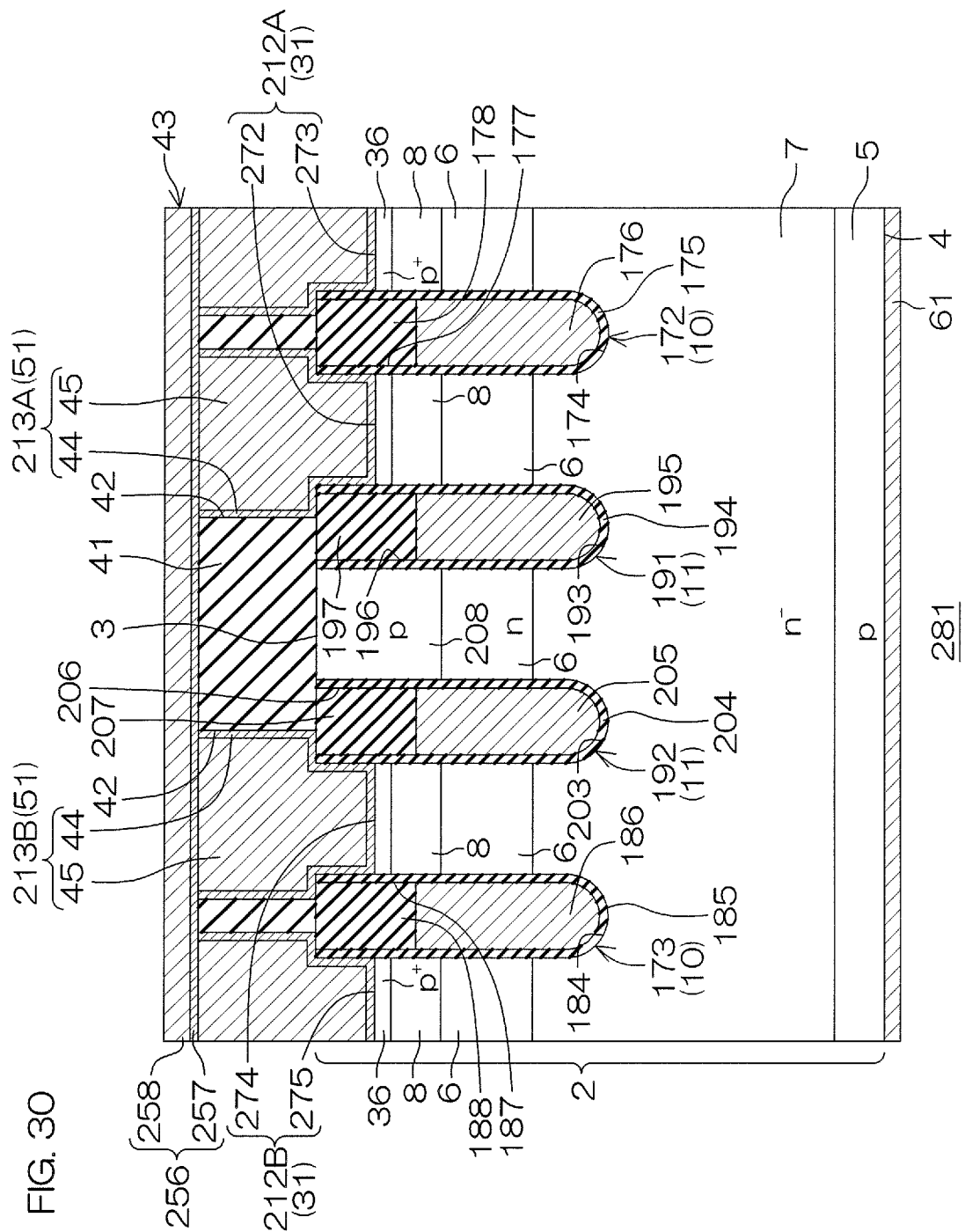
FIG. 30 is a cross-sectional view of the region corresponding to FIG. 29, showing a region of a part of a semiconductor device according to a sixteenth preferred embodiment of the present invention.

FIG. 30 is a cross-sectional view of the region corresponding to FIG. 29, showing a region of a part of a semiconductor device 281 according to a sixteenth preferred embodiment of the present invention. Hereinafter, the same reference sign is given to a constituent equivalent to each constituent of the semiconductor device 271 mentioned above (see FIG. 29), and a description of this constituent is omitted.

Referring to FIG. 30, the first sidewall contact hole 272 is formed in a region between the trench gate electrode structure 10 and the trench emitter electrode structure 11 both of which adjoin each other in the surface layer portion of the first main surface 3 of the semiconductor layer 2 in the present preferred embodiment. The first sidewall contact hole 272 is defined by the semiconductor layer 2, by the trench gate electrode structure 10, and by the trench emitter electrode structure 11.

One end portion of the first sidewall contact hole 272 may be defined by the first gate insulating layer 175 and/or by the first gate embedded insulating layer 178. The one end portion of the first sidewall contact hole 272 may be formed away from the trench gate electrode structure 10. In other words, the one end portion of the first sidewall contact hole 272 may face the trench gate electrode structure 10 with a part of the semiconductor layer 2 between the first sidewall contact hole 272 and the trench gate electrode structure 10.

The other end portion of the first sidewall contact hole 272 may be defined by the emitter insulating layer 18 and/or the emitter embedded insulating layer 21 (the second emitter insulating layer 204 and/or the second emitter embedded insulating layer 207), not shown in detail. The other end portion of the first sidewall contact hole 272 may be formed away from the trench emitter electrode structure 11. In other words, the other end portion of the first sidewall contact hole 272 may face the trench emitter electrode structure 11 with a part of the semiconductor layer 2 between the first sidewall contact hole 272 and the trench emitter electrode structure 11.

In the present preferred embodiment, the second sidewall contact hole 273 is formed in a region between the trench gate electrode structure 10 and the trench emitter electrode structure 11 both of which adjoin each other in the surface layer portion of the first main surface 3 of the semiconductor layer 2. The second sidewall contact hole 273 is defined by the semiconductor layer 2, by the trench gate electrode structure 10, and by the trench emitter electrode structure 11.

One end portion of the second sidewall contact hole 273 may be defined by the first gate insulating layer 175 and/or by the first gate embedded insulating layer 178. The one end portion of the second sidewall contact hole 273 may be formed away from the trench gate electrode structure 10. In other words, the one end portion of the first sidewall contact hole 273 may face the trench gate electrode structure 10 with a part of the semiconductor layer 2 between the first sidewall contact hole 272 and the trench gate electrode structure 10.

The other end portion of the second sidewall contact hole 273 may be defined by the first emitter insulating layer 194 and/or by the first emitter embedded insulating layer 197. The other end portion of the second sidewall contact hole 273 may be formed away from the trench emitter electrode structure 11. In other words, the other end portion of the first sidewall contact hole 272 may face the trench gate electrode structure 10 with a part of the semiconductor layer 2 between the first sidewall contact hole 272 and the trench emitter electrode structure 11.

The first sidewall contact hole 274 and the second sidewall contact hole 275 are formed in the same mode as the first sidewall contact hole 272 and the second sidewall contact hole 273, respectively. A detailed description of the first sidewall contact hole 274 and the second sidewall contact hole 275 is omitted.

The second contact holes 42 are respectively in communication with the first sidewall contact hole 272, the second sidewall contact hole 273, the first sidewall contact hole 274, and the first sidewall contact hole 274 each of which corresponds to the second contact hole 42 in one-to-one correspondence. The opening width of each of the second contact holes 42 exceeds the opening width of the first sidewall contact hole 272, the opening width of the second sidewall contact hole 273, the opening width of the first sidewall contact hole 274, and the opening width of the first sidewall contact hole 274 each of which corresponds to the second contact hole 42.

Each of the second contact holes 42 exposes a part of the trench gate electrode structure 10 corresponding to the second contact hole 42 and a part of the trench emitter electrode structure 11 corresponding to the second contact hole 42. The sidewall of each of the second contact holes 42 is positioned on the trench gate electrode structure 10 corresponding to the second contact hole 42 and on the trench emitter electrode structure 11 corresponding to the second contact hole 42.

As described above, the semiconductor device 281 can also fulfill the same effect as the effect mentioned concerning the semiconductor device 1. The semiconductor device 281 can be manufactured only by changing the layout of each mask or changing etching conditions in the manufacturing method of the semiconductor device 271. Of course, the structure of the semiconductor device 281 is applicable also to preferred embodiments other than the sixteenth preferred embodiment.

Figure 31:
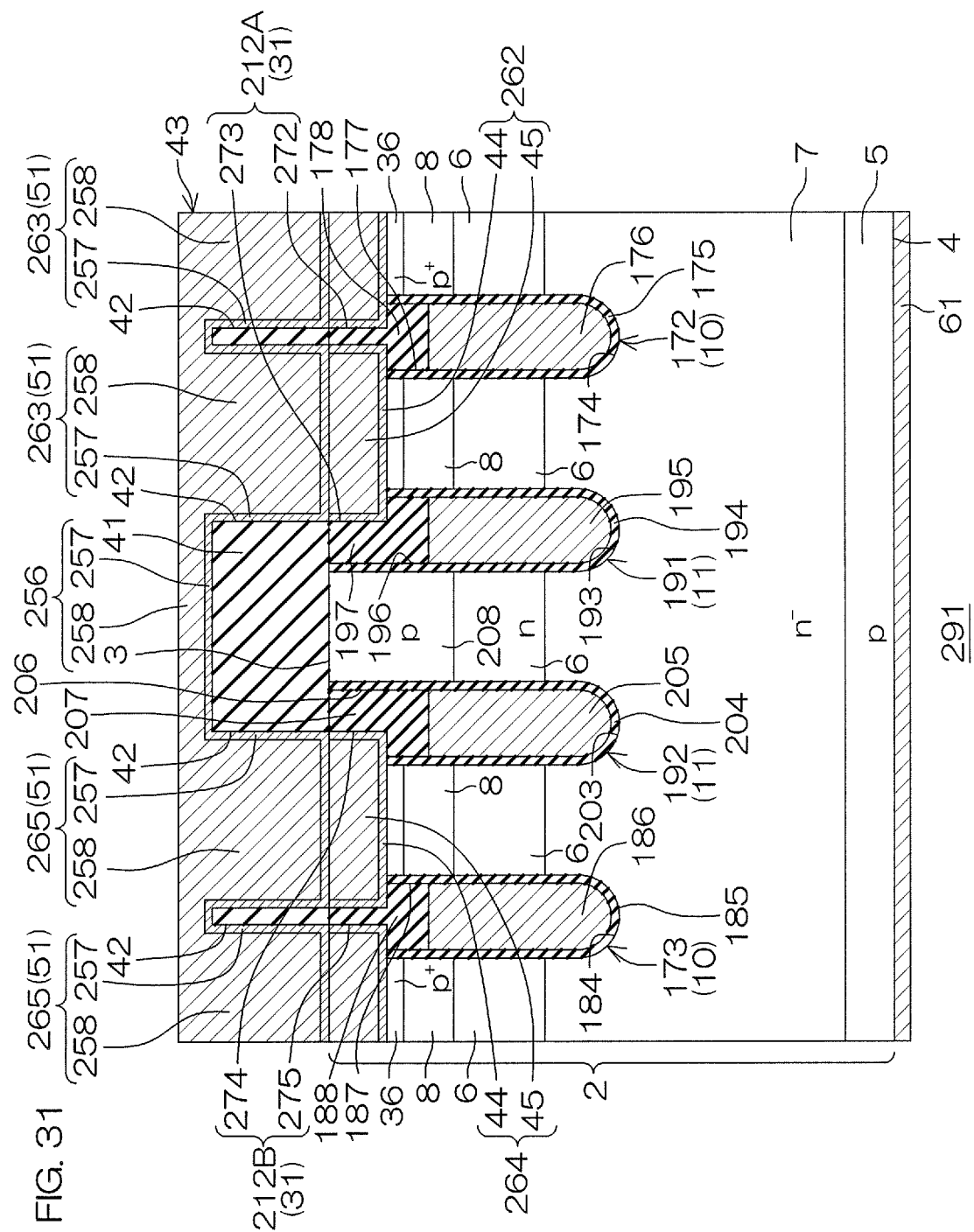
FIG. 31 is a cross-sectional view of the region corresponding to FIG. 29, showing a region of a part of a semiconductor device according to a seventeenth preferred embodiment of the present invention.

FIG. 31 is a cross-sectional view of the region corresponding to FIG. 29, showing a region of a part of a semiconductor device 291 according to a seventeenth preferred embodiment of the present invention. Referring to FIG. 31, the semiconductor device 291 has a structure in which the structure of the semiconductor device 261 (see FIG. 26) has been combined with the semiconductor device 271 (see FIG. 29).

In other words, each of the emitter contact electrode layers 213A includes the first contact electrode layer 262 and the second contact electrode 263 both of which include mutually different conductive materials as their main elements. The first contact electrode layer 262 includes tungsten as its main element, and is embedded in the first contact hole 212A. The second contact electrode 263 includes aluminum as its main element, and is embedded in the second contact hole 42 that is in communication with the first contact hole 212A.

Also, each of the emitter contact electrode layers 213B includes the first contact electrode layer 264 and the second contact electrode layer 265 both of which include mutually different conductive materials as their main elements in the present preferred embodiment. The first contact electrode layer 264 and the second contact electrode layer 265 have structures corresponding to the first contact electrode layer 262 and to the second contact electrode 263, respectively.

Besides, the same reference sign is given to a constituent equivalent to each constituent of the semiconductor device 261 mentioned above (see FIG. 26) and is given to a constituent equivalent to each constituent of the semiconductor device 271 mentioned above (see FIG. 29), and a description of these constituents is omitted.

As described above, the semiconductor device 291 can also fulfill the same effect as the effect mentioned concerning the semiconductor device 1. Of course, the structure of the semiconductor device 291 is applicable also to preferred embodiments other than the seventeenth preferred embodiment.

Figure 32:
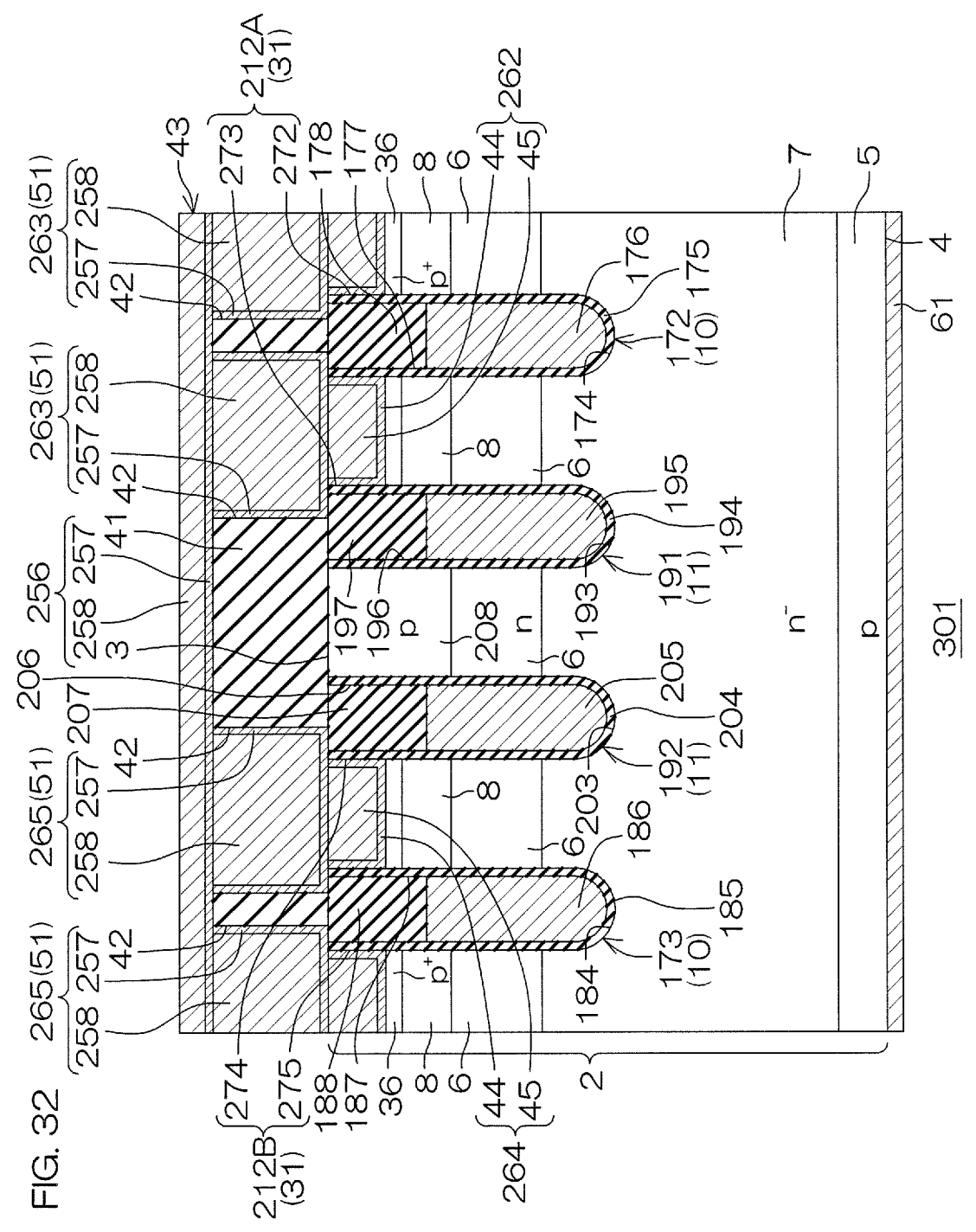

FIG. 32 is a cross-sectional view of the region corresponding to FIG. 29, showing a region of a part of a semiconductor device 301 according to an eighteenth preferred embodiment of the present invention. Referring to FIG. 32, the semiconductor device 301 has a structure in which the structure of the semiconductor device 261 (see FIG. 26) has been combined with the semiconductor device 281 (see FIG. 30).

In other words, each of the emitter contact electrode layers 213A includes the first contact electrode layer 262 and the second contact electrode 263 both of which include mutually different conductive materials as their main elements. The first contact electrode layer 262 includes tungsten as its main element, and is embedded in the first contact hole 212A. The second contact electrode 263 includes aluminum as its main element, and is embedded in the second contact hole 42 that is in communication with the first contact hole 212A.

Also, each of the emitter contact electrode layers 213B includes the first contact electrode layer 264 and the second contact electrode layer 265 both of which include mutually different conductive materials as their main elements in the present preferred embodiment. The first contact electrode layer 264 and the second contact electrode layer 265 have structures corresponding to the first contact electrode layer 262 and to the second contact electrode 263, respectively.

Besides, the same reference sign is given to a constituent equivalent to each constituent of the semiconductor device 261 mentioned above (see FIG. 26) and is given to a constituent equivalent to each constituent of the semiconductor device 281 mentioned above (see FIG. 30), and a description of these constituents is omitted.

As described above, the semiconductor device 301 can also fulfill the same effect as the effect mentioned concerning the semiconductor device 1. Of course, the structure of the semiconductor device 301 is applicable also to preferred embodiments other than the eighteenth preferred embodiment.

The present invention can be embodied in still other modes although the preferred embodiments of the present invention have been described as above.

Figure 33:
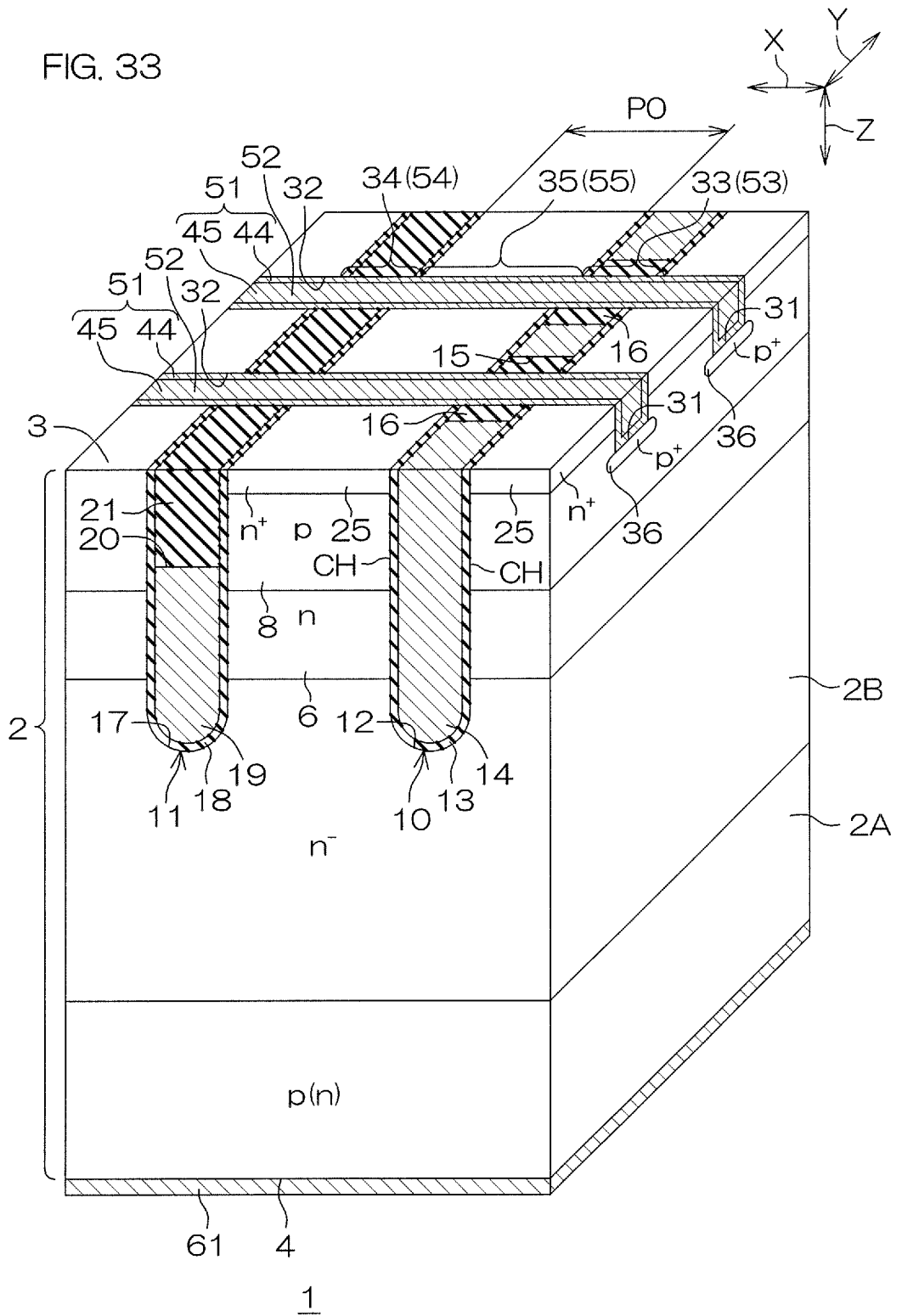
FIG. 33 is a plan view of the part corresponding to FIG. 2, showing a modification of the semiconductor layer.

The structure shown in FIG. 33 may be employed in each of the aforementioned preferred embodiments. FIG. 33 is a plan view of the part corresponding to FIG. 2, showing a modification of the semiconductor layer 2. Hereinafter, the same reference sign is given to a constituent equivalent to each constituent of the semiconductor device 1 mentioned above, and a description of this constituent is omitted. The structure described below is applicable also to the second to eighteenth preferred embodiments.

Referring to FIG. 33, the semiconductor layer 2 may have a layered structure that includes a silicon-made p-type semiconductor substrate 2A and a silicon-made n⁻-type epitaxial layer 2B formed on the semiconductor substrate 2A instead of the silicon single crystal substrate.

The second main surface 4 of the semiconductor layer 2 is formed by the p-type semiconductor substrate 2A. The first main surface 3 is formed of the n⁻-type epitaxial layer 2B. In this case, the p-type the semiconductor substrate 2A corresponds to the collector region 5. Also, the n⁻-type epitaxial layer 2B corresponds to the drift region 7.

Of course, the semiconductor layer 2 may have a layered structure that includes a silicon-made n-type semiconductor substrate 2A and a silicon-made n⁻-type epitaxial layer 2B formed on the semiconductor substrate 2A instead of the silicon single crystal substrate.

The second main surface 4 of the semiconductor layer 2 is formed by the n-type semiconductor substrate 2A. The first main surface 3 is formed of the n⁻-type epitaxial layer 2B. In this case, the n-type semiconductor substrate 2A corresponds to the drain region. Also, the n⁻-type epitaxial layer 2B corresponds to the drift region 7.

Figure 34:
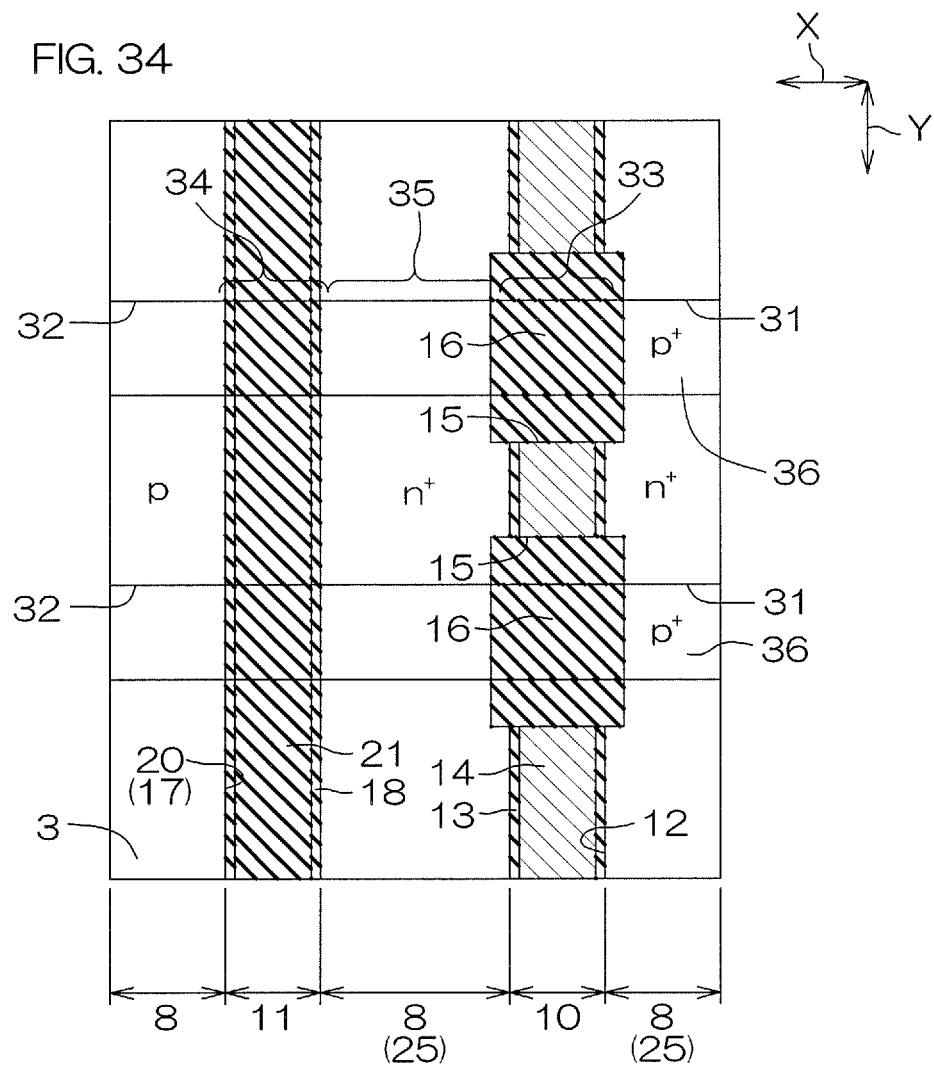
FIG. 34 is a plan view of the part corresponding to FIG. 4, showing a modification of a gate embedded insulating layer.

The structure shown in FIG. 34 may be employed in each of the aforementioned preferred embodiments. FIG. 34 is a plan view of the part corresponding to FIG. 4, showing a modification of the gate embedded insulating layer 16. Hereinafter, the same reference sign is given to a constituent equivalent to each constituent of the semiconductor device 1 mentioned above, and a description of this constituent is omitted. The structure described below is applicable also to the second to eighteenth preferred embodiments.

In this example, the gate embedding hole 15 has a first-direction width that is larger than the first-direction width of the gate trench 12. A one-side side surface and an other-side side surface of the gate embedding hole 15 are positioned in a region outside the gate trench 12 regarding the first direction X, and the semiconductor layer 2 is exposed.

The gate embedded insulating layer 16 is embedded in the gate embedding hole 15 having the thus formed structure. Therefore, the gate embedded insulating layer 16 has a first-direction width that is larger than the first-direction width of the gate trench 12.

A one-side side surface and an other-side side surface of the gate embedded insulating layer 16 are positioned in a region outside the gate trench 12 regarding the first direction X, and are contiguous to the semiconductor layer 2. The first contact hole 31 and the emitter contact electrode layer 51 intersect the gate embedded insulating layer 16 in a plan view.

Even if the gate embedded insulating layer 16 having the aforementioned structure is formed, it is possible to fulfill the same effect as the effect mentioned concerning the semiconductor device 1. The thus formed structure can be manufactured only by changing the layout of each mask in the manufacturing method of the semiconductor device 1.

Figure 35:
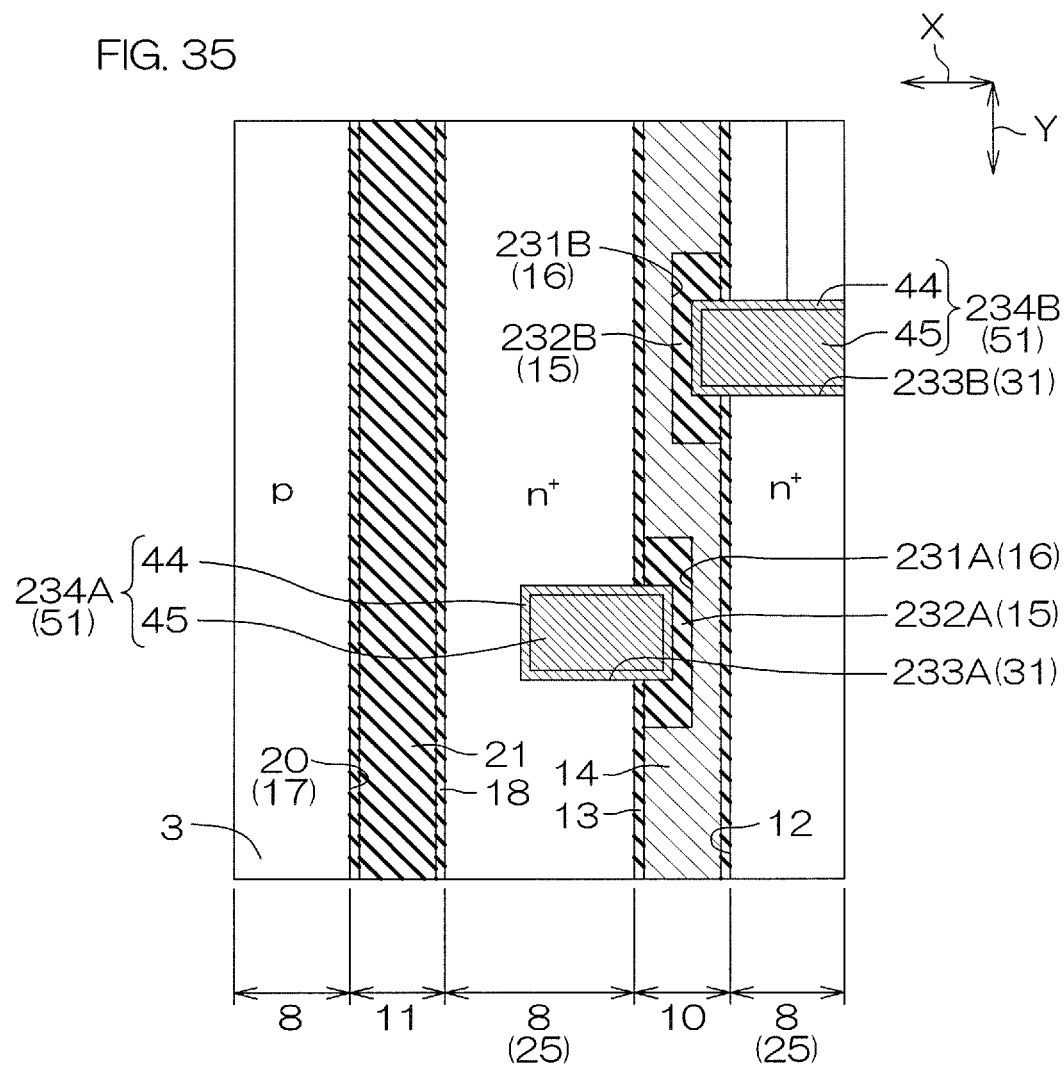
FIG. 35 is a plan view of the part corresponding to FIG. 4, showing a modification of an emitter contact electrode layer.

The emitter contact electrode layer 51 having the structure shown in FIG. 35 may be employed in each of the aforementioned preferred embodiments. FIG. 35 is a plan view of the part corresponding to FIG. 4, showing a modification of the emitter contact electrode layer 51. Hereinafter, the same reference sign is given to a constituent equivalent to each constituent of the semiconductor device 1 mentioned above, and a description of this constituent is omitted. A structure described below is applicable also to the second to eighteenth preferred embodiments.

Referring to FIG. 35, the gate embedding holes 15 include a gate embedding hole 231A and a gate embedding hole 231B in this example. The gate embedding hole 231A and the gate embedding hole 231B are formed with an interval therebetween along the gate trench 12 (second direction Y).

The gate embedding hole 231A is formed away from the other-side sidewall of the gate trench 12 regarding the first direction X, and is formed close to the one-side sidewall of the gate trench 12. A part of the gate electrode layer 14 is interposed in a region between the gate embedding hole 231A and the other-side sidewall of the gate trench 12. In this example, the sidewall of the gate embedding hole 231A is defined by the gate insulating layer 13 and by the gate electrode layer 14.

The gate embedding hole 231B is formed away from the one-side sidewall of the gate trench 12 regarding the first direction X, and is formed close to the other-side sidewall of the gate trench 12. A part of the gate electrode layer 14 is interposed in a region between the gate embedding hole 231B and the one-side sidewall of the gate trench 12. In this example, the sidewall of the gate embedding hole 231B is defined by the gate insulating layer 13 and by the gate electrode layer 14.

In this example, the gate embedded insulating layer 16 includes a gate embedded insulating layer 232A and a gate embedded insulating layer 232B. The gate embedded insulating layer 232A is embedded in the gate embedding hole 231A. The gate embedded insulating layer 232B is embedded in the gate embedding hole 231B.

In this example, the first contact holes 31 include a first contact hole 233A and a first contact hole 233B. The first contact hole 233A and the first contact hole 233B are formed with an interval therebetween along the gate trench 12 (second direction Y).

The first contact hole 233A passes through only the one-side sidewall of the gate trench 12 from an inward region of the gate embedded insulating layer 232A regarding the first direction X. The first contact hole 233A is formed away from the other-side sidewall of the gate trench 12.

The first contact hole 233B passes through only the other-side sidewall of the gate trench 12 from an inward region of the gate embedded insulating layer 232B regarding the first direction X. The first contact hole 233B is formed away from the one-side sidewall of the gate trench 12.

In this example, the emitter contact electrode layers 51 include an emitter contact electrode layer 234A and an emitter contact electrode layer 234B. The emitter contact electrode layer 234A is embedded in the first contact hole 233A. Therefore, the emitter contact electrode layer 234A passes through only the one-side sidewall of the gate trench 12 from the inward region of the gate embedded insulating layer 232A regarding the first direction X. The emitter contact electrode layer 234A is formed away from the other-side sidewall of the gate trench 12.

The emitter contact electrode layer 234B is embedded in the first contact hole 233B. Therefore, the emitter contact electrode layer 234B passes through only the one-side sidewall of the gate trench 12 from the inward region of the gate embedded insulating layer 232B regarding the first direction X. The emitter contact electrode layer 234B is formed away from the one-side sidewall of the gate trench 12.

Even if the structure shown in FIG. 35 is employed, it is possible to fulfill the same effect as the effect mentioned concerning the semiconductor device 1. The structure shown in FIG. 35 can be manufactured only by changing the layout of each mask in the manufacturing method of the semiconductor device 1.

In each of the aforementioned preferred embodiments, a structure in which the conductivity type of each semiconductor part has been reversed may be employed. In other words, the p-type part may be set as an n-type, and the n-type part may be set as a p-type.

The semiconductor layer 2 is made of a silicon single crystal as described in each of the aforementioned preferred embodiments. However, the semiconductor layer 2 may include SiC. Also, the semiconductor layer 2 may be made of a SiC single crystal.

In this description, no limitations are imposed on any combination form that has features shown in the first to eighteenth preferred embodiments. The first to eighteenth preferred embodiments can be combined together in arbitrary modes and in arbitrary forms among these preferred embodiments. In other words, it is permitted to employ a form in which features shown in the first to eighteenth preferred embodiments are combined together in arbitrary modes and in arbitrary forms.

This application corresponds to Japanese Patent Application No. 2017-226109 filed in the Japan Patent Office on Nov. 24, 2017, the entire disclosure of which is incorporated herein by reference.

Although the preferred embodiments of the present invention have been described in detail, these embodiments are merely concrete examples used to clarify the technical contents of the present invention, and the present invention should not be understood by being limited to these concrete examples, and the scope of the present invention is limited solely by the appended Claims.

REFERENCE SIGNS LIST

1: Semiconductor device
2: Semiconductor layer
3: First main surface
8: Body region
12: Gate trench
13: Gate insulating layer
14: Gate electrode layer
16: Gate embedded insulating layer
17: Emitter trench
19: Emitter electrode layer
21: Emitter embedded insulating layer
25: Emitter region
41: Interlayer insulating layer
51: Emitter contact electrode layer
81: Semiconductor device
91: Semiconductor device
93A: Emitter contact electrode layer
93B: Emitter contact electrode layer
101: Semiconductor device
103: Emitter trench
105: Emitter electrode layer
107: Emitter embedded insulating layer
121: Semiconductor device
131: Semiconductor device
133A: Emitter contact electrode layer
133B: Emitter contact electrode layer
141: Semiconductor device
143: Second gate trench
144: Second gate insulating layer
145: Second gate electrode layer
147: Second gate embedded insulating layer 161: Semiconductor device
163A: Emitter contact electrode layer
163B: Emitter contact electrode layer
171: Semiconductor device
174: First gate trench
175: First gate insulating layer
176: First gate electrode layer
178: First gate embedded insulating layer
184: Second gate trench
185: Second gate insulating layer
186: Second gate electrode layer
188: Second gate embedded insulating layer
193: First emitter trench
195: First emitter electrode layer
197: First emitter embedded insulating layer
203: Second emitter trench
205: Second emitter electrode layer
207: Second emitter embedded insulating layer
211: Semiconductor device
213A: Emitter contact electrode layer
213B: Emitter contact electrode layer
221: Semiconductor device
232A: Gate embedded insulating layer
232B: Gate embedded insulating layer
234A: Emitter contact electrode layer
234B: Emitter contact electrode layer
251: Semiconductor device
261: Semiconductor device
271: Semiconductor device
281: Semiconductor device
291: Semiconductor device
301: Semiconductor device
P0: Trench pitch
P1: First trench pitch
P2: Second trench pitch
P3: Third trench pitch
X: First direction
Y: Second direction

The invention claimed is:

1. A semiconductor device comprising:
a semiconductor layer having a first main surface on one side and a second main surface on the other side, the semiconductor layer being a layered structure including a first-conductivity-type collector region, a second-conductivity-type drift region, a first-conductivity-type charge storage region, and a first-conductivity-type body region which are formed in this order from the second main surface toward the first main surface;
a first trench being formed in the first main surface of the semiconductor layer that extends from the first main surface to the drift region;
a second-conductivity-type impurity region formed along a sidewall of the first trench in a surface layer portion of the body region;
a gate insulating layer formed on an inner wall of the first trench;
a gate electrode that is embedded in the first trench and that faces the body region and the impurity region with the gate insulating layer placed between the gate electrode and the body region and between the gate electrode and the impurity region;
a contact electrode that passes through the sidewall of the first trench from inside the first trench and is drawn out to the surface layer portion of the main surface of the semiconductor layer and is electrically connected to the body region and to the impurity region;
an embedded insulating layer that is interposed between the gate electrode and the contact electrode in the first trench and that insulates the gate electrode and the contact electrode; and
a second trench being formed in the first main surface of the semiconductor layer away from the first trench that extends from the first main surface to the drift region, wherein the contact electrode is drawn out such as to pass through a sidewall of the second trench from the surface layer portion of the semiconductor layer and reach inside the second trench,
an inner-wall insulating layer formed on an inner wall of the second trench;
an embedded electrode layer that is embedded to an intermediate portion in a depth direction of the second trench with the inner-wall insulating layer between the embedded electrode layer and the second trench; and
a second embedded insulating layer that is interposed between the embedded electrode layer and the contact electrode in the second trench and that insulates the embedded electrode layer and the contact electrode,
wherein the second embedded insulating layer is reached downwardly below at a middle portion of the body region in up and down direction in the second trench,
wherein a channel is formed in the body region between the first trench and the second trench, and a channel is not formed in the body region between the second trenches.

2. The semiconductor device according to claim 1, wherein the contact electrode faces the gate electrode in a normal direction to the main surface of the semiconductor layer and in a tangential direction to the main surface of the semiconductor layer in the first trench.

3. The semiconductor device according to claim 1, wherein the first trench extends along one direction, and
the contact electrode is drawn out along an intersecting direction that intersects the one direction.

4. The semiconductor device according to claim 3, wherein regarding the one direction, a width of the contact electrode is smaller than a width of the first trench.

5. The semiconductor device according to claim 1, wherein the contact electrode passes through a one-side sidewall and an other-side sidewall of the first trench from inside the first trench, and is drawn out to the surface layer portion of the semiconductor layer.

6. The semiconductor device according to claim 1, further comprising:
an insulating layer which covers the main surface of the semiconductor layer,
wherein the contact electrode passes through the insulating layer such as to reach inside the first trench and the surface layer portion of the semiconductor layer.

7. The semiconductor device according to claim 6, wherein the embedded insulating layer is exposed from an opening of the first trench, and
the insulating layer covers the embedded insulating layer.

8. The semiconductor device according to claim 1, wherein a voltage less than a gate voltage applied to the gate electrode is applied to the embedded electrode layer.

9. The semiconductor device according to claim 1, further comprising:
a second gate insulating layer formed on an inner wall of the second trench;
a second gate electrode embedded in the second trench with the second gate insulating layer between the second gate electrode and the second trench; and a second embedded insulating layer that is interposed between the second gate electrode and the contact electrode in the second trench and that insulates the second gate electrode and the contact electrode.

10. The semiconductor device according to claim 9, wherein the second gate electrode is equal in electric potential to the gate electrode.

11. The semiconductor device according to claim 1, wherein a pitch between the first trench and the second trench is not less than 0.1 μm and less than 0.6 μm.

12. The semiconductor device according to claim 1, wherein a pitch between the first trench and the second trench is not less than 0.2 μm and not more than 0.4 μm.

13. The semiconductor device according to claim 1, wherein the impurity region is an emitter region, and the contact electrode is an emitter contact electrode.

14. The semiconductor device according to claim 1, wherein the impurity region is a source region, and the contact electrode is a source contact electrode.

* * * * *